United States Patent [19]
Sunami et al.

[11] Patent Number: 5,237,528
[45] Date of Patent: Aug. 17, 1993

[54] SEMICONDUCTOR MEMORY

[75] Inventors: Hideo Sunami, Tokyo; Tokuo Kure, Kokubunji; Masanobu Miyao, Tokorozawa; Yoshifumi Kawamoto, Kanagawa; Katsuhiro Shimohigashi, Musashimurayama; Yoshio Sakai, Kanagawa; Osamu Minato; Toshiaki Masuhara, both of Tokyo, all of Japan; Mitsumasa Koyanagi, Cupertino, Calif.; Shinji Shimizu, Tokyo, Japan

[73] Assignee: Hitachi, Ltd., Tokyo, Japan

[21] Appl. No.: 822,325

[22] Filed: Jan. 17, 1992

Related U.S. Application Data

[60] Division of Ser. No. 452,683, Dec. 19, 1989, abandoned, which is a division of Ser. No. 934,556, Nov. 24, 1986, Pat. No. 4,901,128, which is a continuation-in-part of Ser. No. 548,844, Nov. 4, 1983, abandoned, which is a continuation-in-part of Ser. No. 820,839, Jan. 22, 1986, abandoned, which is a continuation-in-part of Ser. No. 780,601, Sep. 26, 1985, abandoned, which is a continuation-in-part of Ser. No. 640,515, Aug. 13, 1984, abandoned, which is a continuation-in-part of Ser. No. 686,599, Dec. 26, 1984, abandoned.

[30] Foreign Application Priority Data

| Nov. 4, 1982 | [JP] | Japan | 57-192478 |
| Nov. 11, 1983 | [JP] | Japan | 58-210825 |
| Nov. 18, 1983 | [JP] | Japan | 58-216143 |
| Dec. 26, 1983 | [JP] | Japan | 58-243997 |
| Oct. 1, 1984 | [JP] | Japan | 59-204001 |

[51] Int. Cl.$^5$ .......................................... G11C 11/24
[52] U.S. Cl. .................................. 365/149; 257/304
[58] Field of Search .................. 345/149; 357/23.6; 257/304

[56] References Cited

U.S. PATENT DOCUMENTS

| 3,962,713 | 6/1976 | Kendall et al. | 357/55 |
| 4,327,476 | 5/1982 | Iwai et al. | 357/23 |
| 4,432,006 | 2/1984 | Takei | 357/23 |
| 4,688,063 | 8/1987 | Lu et al. | 357/23.6 |

FOREIGN PATENT DOCUMENTS

| 108390 | 5/1984 | European Pat. Off. | 357/23.6 |
| 149799 | 7/1985 | European Pat. Off. | 357/23.6 |
| 154871 | 9/1985 | European Pat. Off. | 357/23.6 |
| 59-191374 | 10/1984 | Japan | 357/23.6 |
| 60-140860 | 7/1985 | Japan | 357/23.6 |
| 60-239053 | 11/1985 | Japan | 357/23.6 |
| 60-245273 | 12/1985 | Japan | 357/23.6 |

*Primary Examiner*—Joseph E. Clawson, Jr.
*Attorney, Agent, or Firm*—Antonelli, Terry, Stout & Kraus

[57] ABSTRACT

A semiconductor memory comprises a capacitor with a data storage portion, and an insulated-gate field-effect transistor. The capacitor is formed by a plate which is made up of the side walls and base of a groove formed in a semiconductor substrate, and by a capacitor electrode formed on the side walls and the base, over an insulation film, and which is connected electrically to the source or drain of the insulated-gate field-effect transistor. Various embodiments are provided for reducing size and preventing leakage between other memory cells, including forming stacked capacitors, forming the transistor over the capacitor, using a silicon-over-insulator arrangement for the transistor, forming a common capacitor plate and providing high impurity layers within the substrate.

9 Claims, 58 Drawing Sheets

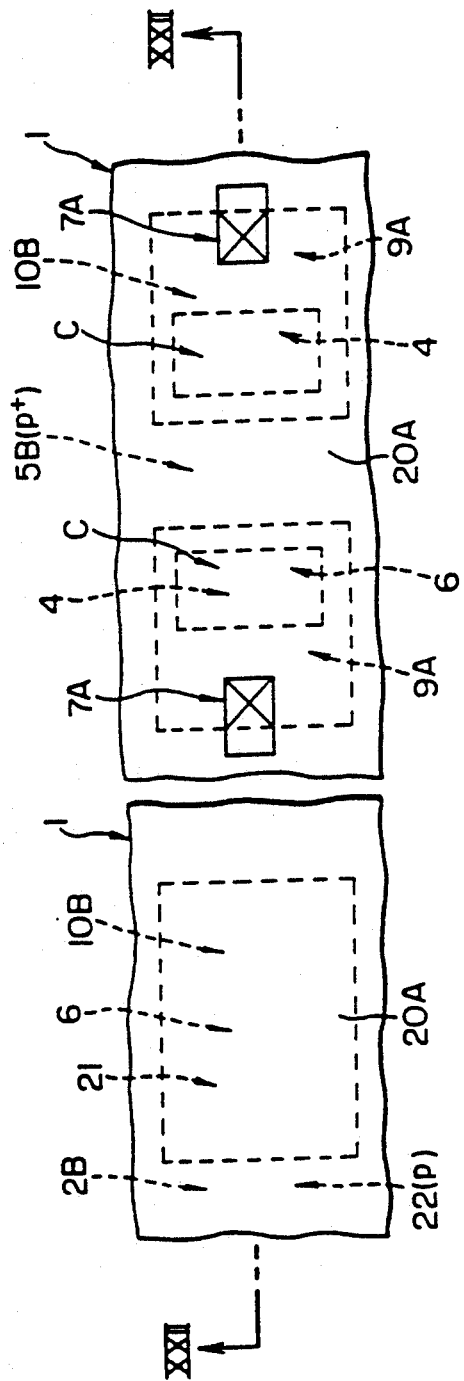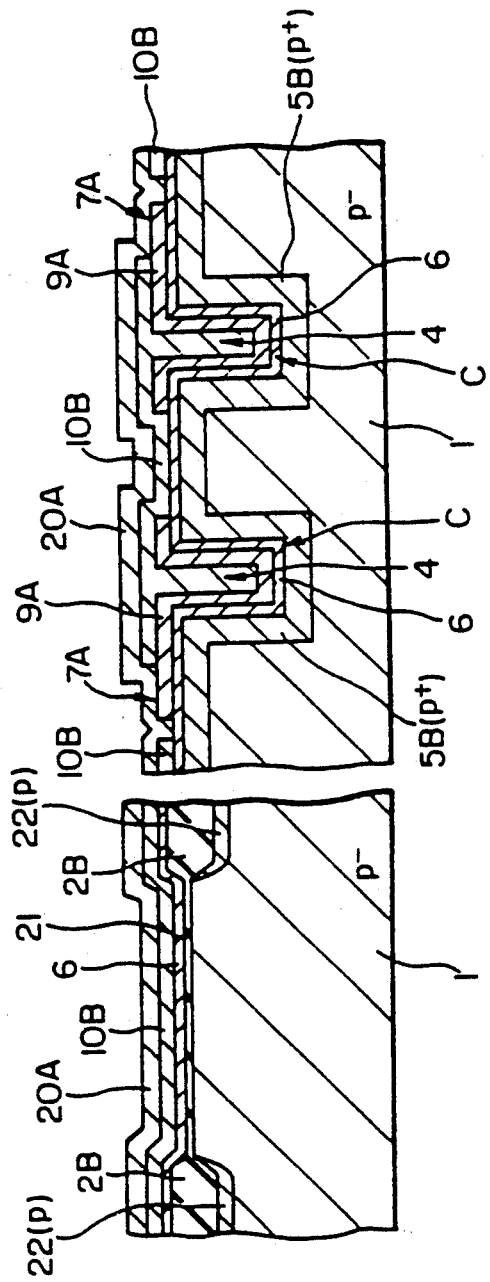

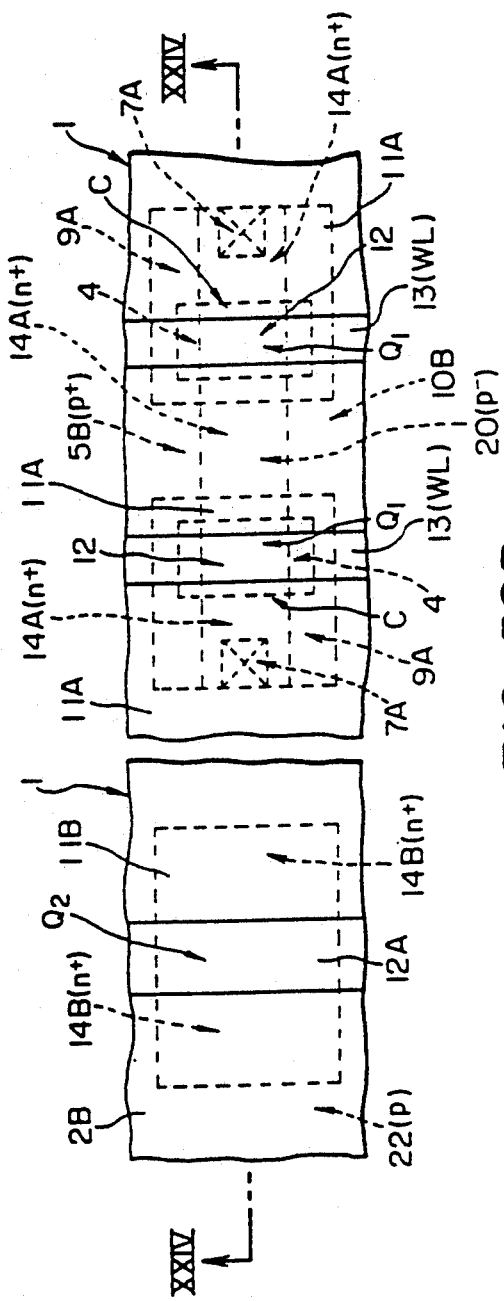
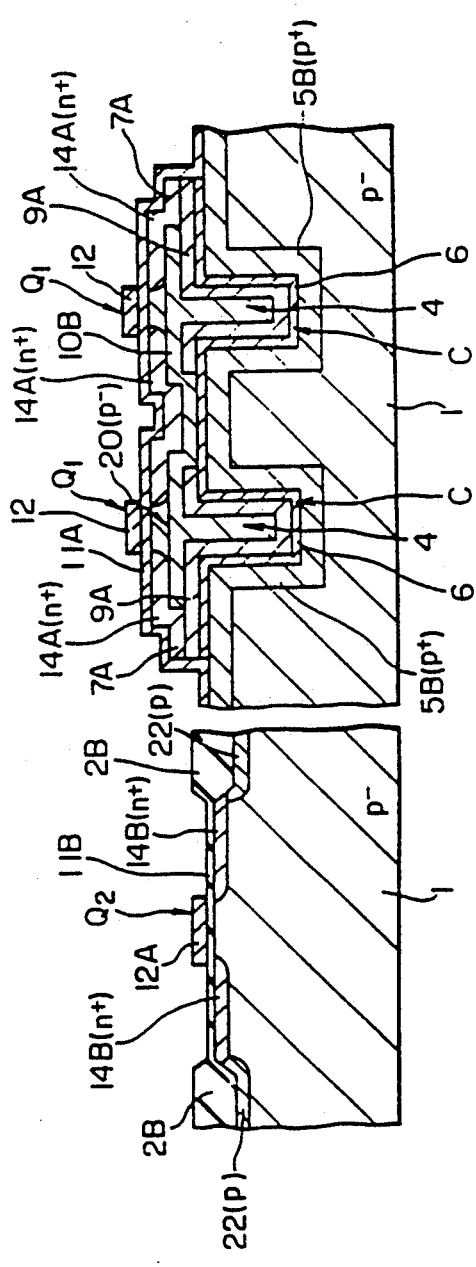
FIG. 59A
FIG. 59B

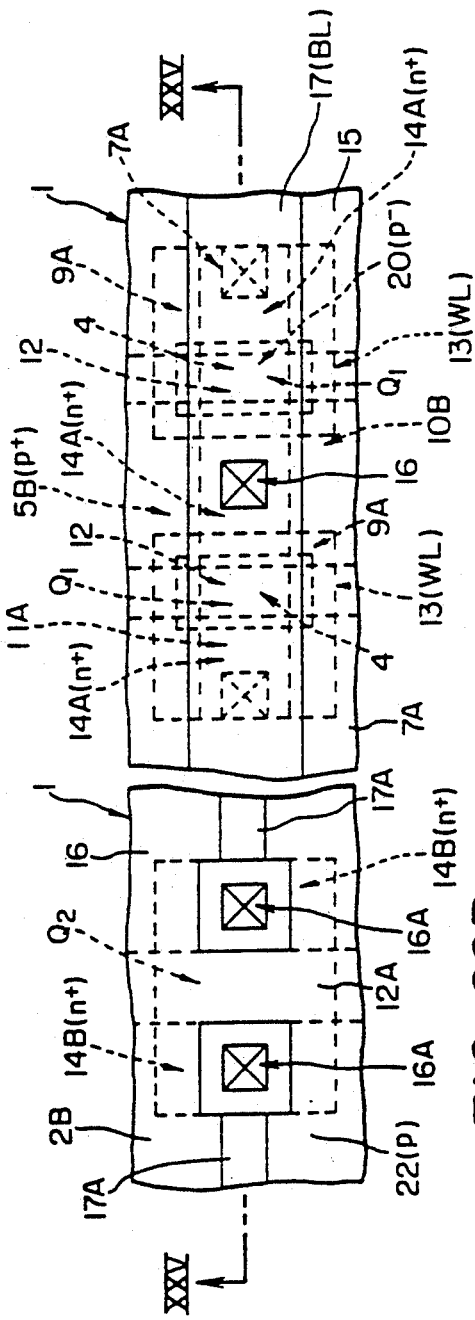
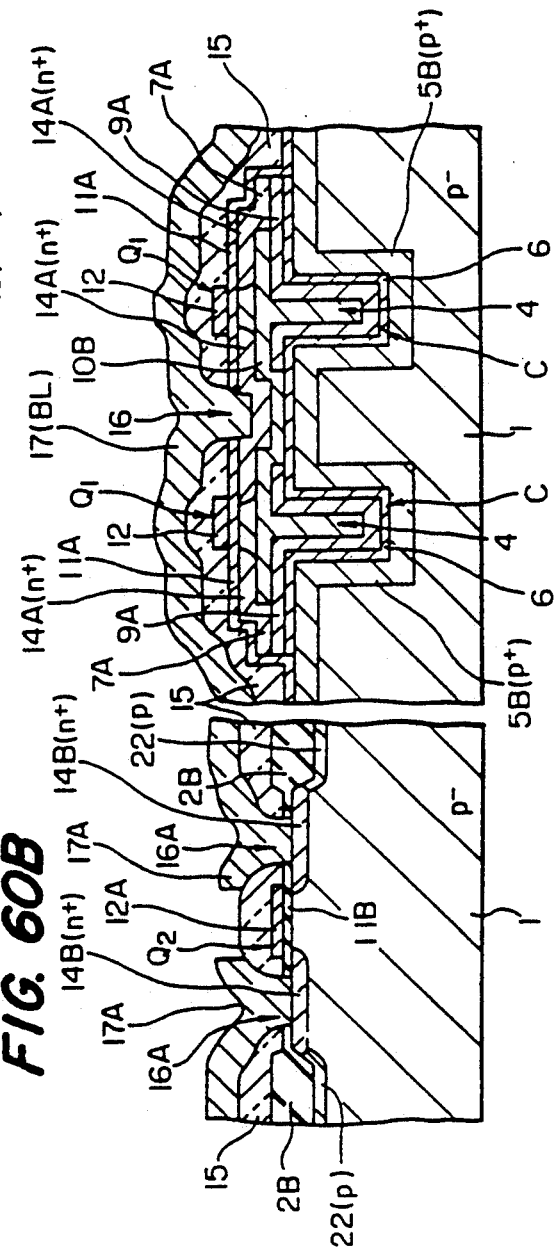
FIG. 60A
FIG. 60B

SEMICONDUCTOR MEMORY

This is a divisional of application Ser. No. 452,683 filed Dec. 19, 1989 abandoned, which is a divisional of application Ser. No. 934,556 filed Nov. 24, 1986, now U.S. Pat. No. 4,901,128, which is a continuation-in-part application of application Ser. No. 548,844 filed Nov. 4, 1983 now abandoned, Ser. No. 820,839 filed Jan. 22, 1986 abandoned, Ser. No. 780,601 filed Sep. 26, 1985 abandoned, Ser. No. 640,515 filed Aug. 13, 1984 abandoned and Ser. No. 686,599 filed Dec. 26, 1984 abandoned.

BACKGROUND OF THE INVENTION

The present invention relates to a semiconductor memory, and in particular to a one-transistor dynamic MOS memory which enables an increase in memory capacity without increasing the space required, and which is suitable for increasing memory size.

Each memory cell of a DRAM consists of a storage capacitor and a switching MISFET. The storage capacitor is constructed of a capacitor of the MIS type. Concretely, it is constructed of a semiconductor substrate, an insulator film which is formed on the semiconductor substrate, and a capacitor electrode which is formed on the insulator film and to which a predetermined voltage is applied. Charges in a quantity corresponding to the information of "1" or "0" are stored in an inversion layer which is formed within the semiconductor substrate under the capacitor electrode having the predetermined voltage applied thereto.

The memory size of MOS dynamic memories quadrupled in the approximately three years after a 1K-bit dynamic random access memory (hereinafter referred to as a DRAM) was first developed early in the 1970's. 16-pin DIPs (dual-in-line packages) are namely used for accommodating memory chips, but this imposed a limitation on the size of the cavity for inserting the chips. Therefore, the size of the memory chip has increased by approximately 1.4 times, despite the fact that the degree of integration has quadrupled. (Since large quantities of DRAMs are used, it is necessary to curb any increase in the size of chips, if only from the standpoint of cost.) Therefore, the area of memory cell per bit of one storage unit is greatly reduced, i.e., is reduced to about one-third, owing to the quadrupled degree of integration. The capacity C of a semiconductor memory is expressed by $C=\epsilon A/T_i$ (where $\epsilon$ is the permeability of the insulator, A the capacitor area, and $T_i$ the insulator thickness). Therefore, if the area A is reduced to one-third, the capacity C decreases to one-third so long as $\epsilon$ and $T_i$ remain the same. The signal quantity S of a memory capacitor changes in proportion with the charge quantity Qs stored, and the charge quantity Qs is a product of the capacity C and a memory voltage Vs. Therefore, the charge quantity Qs decreases with a decrease in the capacitor area A, and the signal quantity S decreases correspondingly.

If noise voltage is denoted by N, the signal-to-noise ratio (S/N ratio) decreases with a decrease in the signal quantity S, raising a problem with regard to the operation of the circuit. Usually, therefore, a decrease in the capacitor area A is compensated for by decreasing the insulator thickness $T_i$. Therefore, as the degree of integration of DRAMs increases from 4K bits, to 16K bits, to 64K bits, the typical thickness $T_i$ of the SiO$_2$ film used as the insulator gradually decreases from 100 nm, to 75 nm and then to 50 nm, respectively.

Recently it has been confirmed that the amount of noise generated in a silicon substrate by alpha-particles radiated from radioactive heavy metals (such as U, Th, etc.) within the package becomes unacceptable if the electric charge is less than 200 fC (femtocoulombs). In order to maintain reliability in operation, therefore, it is not possible to reduce the signal quantity, i.e., the electric charge, below about 200 fC.

Because of these reasons, therefore, attempts have been made to reduce the thickness of the insulator further, raising a problem with regard to the dielectric breakdown of the insulator. The SiO$_2$ film which is usually used as the insulator of the capacitor has a dielectric withstand electric field of a maximum of $10^7$ V/cm. Therefore, a 10 nm thick SiO$_2$ film will break down permanently, or be degraded, when a voltage of 10 volts is applied. Using such a device close to its maximum dielectric withstand electric field invites a serious problem with regard to its long-term reliability, even if it does not break down permanently in short-term usage.

FIG. 1 is a diagram of the construction of a one-transistor DRAM memory cell which consists of a capacitor 1 for storing electric charge, and a switching MOS transistor 2. The drain of the switching MOS transistor is connected to a bit line 3, and its gate is connected to a word line 4.

This memory cell is operated by reading out the signal charge stored in the capacitor 1 by the switching MOS transistor 2. In practice, the construction of a large-scale integrated memory is formed of a memory area by methods which can be roughly divided into the two described below.

FIG. 2 shows the so-called "open-bit line" construction in which bit lines 3-1 and 3-2 are arrayed on either side of a sense amplifier 5 which amplifies signals in a differential manner. In this construction, only one bit line, 3-1, electrically crosses one word line 4-1, and the difference in signals between the bit line 3-1 and the bit line 3-2 is detected by the sense amplifier 5.

FIG. 3 illustrates the so-called "folded-bit line" construction in which two bit lines 3-1 and 3-2 connected to the sense amplifier 5 are arrayed in parallel, so that one word line 4-1 intersects both bit lines 3-1 and 3-2.

Various embodiments of the present invention described below pertain chiefly to the folded-bit line construction. The invention described regarding these embodiments, however, can also be adapted to the open-bit line construction.

As shown in FIGS. 2 and 3, if the stray capacitance of a stray capacitor 6 of the bit line 3-2 is denoted by $C_D$ and the capacity of capacitor 1-2 of the memory cell by $C_S$, one of the main figures of merit of the memory array is expressed by $C_S/C_D$. The S/N ratio of the memory array corresponds exactly to $C_S/C_D$. To improve the S/N ratio, furthermore, it is important to increase the capacity of the capacitor of the memory cell, and reduce the stray capacitance $C_D$ of the bit line 3.

FIG. 4 is a plan view of the construction of a memory cell of the folded-bit line type, and FIG. 5 is a section thereof taken along the line A—A' of FIG. 4. As can be seen from FIGS. 4 and 5, a capacitor is formed in a portion of an active region which is surrounded by a field oxidation film 11 of a thickness of usually more than 100 nm. The active region 7 is covered by a plate 8, but the plate 8 is selectively removed from the portion where a switching transistor will be formed and from the portion of contact hole 9 through which the bit line 3 will be connected to a drain 15 on the silicon substrate (region 80 in FIG. 4). Word lines 4-1 and 4-2 are attached in this portion to form, the gates of the switching transistors 2, as shown in FIG. 5.

One method of forming a semiconductor memory of this type is described below. For ease of comprehension, the transistor described here is of the n-channel type. To form a p-channel transistor, the conductivity types of the silicon substrate and of the diffusion layer should be opposite to those of the n-channel transistor.

FIG. 5 is a section taken along the line A—A' of FIG. 4.

In the conventional memory cell shown in FIG. 5, a field SiO₂ film 11 is formed selectively to a thickness of usually 100 to 1000 nm on a p-type silicon substrate 10 having a resistivity of about 10 ohm -cm, by the so-called LOCOS method using a thermal oxidation mask composed of Si₃N₄. The plate 8 is deposited selectively thereon, the plate 8 being composed of polycrystalline silicon doped with phosphorus or arsenic ions. The surface of the polycrystalline silicon plate 8 is then oxidized to form a first intermediate oxide film 13. The word line 4-1 is deposited, the word line 4-1 being composed of polycrystalline silicon, molybdenum silicide, or a refractory metal (molybdenum or tungsten), followed by the implantation of phosphorus or arsenic ions. Thus, N⁺-type diffusion layers 15 are formed in the active regions where no plate 8 or word line 4-1 is deposited, to form the source and drain of the switching MOS transistor 2. Thereafter, PSG (phospho-silicate glass) containing phosphorus is deposited to a thickness of 200 to 1000 nm by the so-called CVD method to form a second intermediate insulator 14, a contact hole 9 is formed in the place where the bit line 3-2 indicated by an aluminum electrode is to be connected to the diffusion layer 15, and the bit line 3-2 is selectively deposited.

In the thus-formed memory cell, the area occupied by the region 16 of the capacitor 1 acting as the memory capacitor inevitably decreases with a decrease in the size of the memory cell. Unless the thickness of the gate oxide film 12 is reduced, therefore, the capacity $C_S$ decreases to raise a serious problem concerning memory operation.

In the above description, the same SiO₂ insulation film 12 lies beneath the plate 8 and the word line 4-1 (i.e., the gate of the switching MOS transistor 2). When it is desired to increase the capacity $C_S$ of the memory cell, however, the insulation film beneath the plate 8 can be formed to have a one- to three-layer construction using either SiO₂ or Si₃N₄, or both.

The solve the above problems, a memory has been proposed by one of the inventors of the present application, in which a narrow groove is formed in the silicon substrate, and a capacitor that acts as the memory capacitor is formed on the surfaces of the groove (Japanese Patent Application No. 50-53883 filed May 7, 1975 and laid open as Japanese Kokai No. 51-130178 on Nov. 12, 1976).

In this previously proposed memory, the side and bottom surfaces of the groove are utilized as the electrode surfaces of the capacitor, providing the advantage that the electrode area is considerably increased without increasing the space required, compared with the memory of the construction shown in FIGS. 4 and 5.

More specifically, this storage capacitor element is of MIS (i.e., metal insulator semiconductor) type and is composed of moats (which are also called "U-shaped grooves") formed to extend inward from one main surface of the semiconductor substrate, an insulating film formed to extend along those moats, and a capacitor electrode formed to cover said insulating film. On the other hand, the switching transistor is constructed of an insulated gate type field effect transistor (which will be abbreviated as "MISFET"), which is specifically composed of a source region and a drain region formed in the semiconductor substrate at a spacing from each other, and a gate electrode formed through the insulating film over the semiconductor substrate between said source region and said drain region. However, it should be noted that in this arrangement, the charges are stored in a depletion layer and an inversion layer within the semiconductor substrate, and this can cause problems with regard to high-density integration. Specifically, the memory cell of this type cannot exclude the influence of minority carriers appearing due to alpha-particles or minority carriers injected from a peripheral circuit portion, etc. Insofar as the charges are stored in the depletion layer and the inversion layer, the quantity of charges fluctuates due to the minority carriers. Accordingly, the occupying area of a storage capacitor cannot be made smaller than a certain value. Since the influence of the minority carriers increases more in a place deeper from the surface of a semiconductor substrate, deepeninq a trench is not very effective. The unnecessary minority carriers drop the voltage, which is held in the depletion layer of the storage capacitor, to invert the "0" information to the "1" information thereby to cause the erroneous operations (or the software errors) of the information reading operations. In order to obtain a predetermined charge storage for coping with the unnecessary minority carriers caused by the alpha-rays, moreover, the depth of the pores is limited so that the integration of the DRAM cannot be significantly improved.

Moreover, with the memory cells of the specified type, it is impossible to make small an isolation region for electrically isolating the adjacent memory cells. The reason is that, since the depletion layers and inversion layers of the capacitors of the adjacent memory cells need to be prevented from coupling, the distance between the memory cells cannot be made smaller than a certain value. In case of employing a field oxide film as the isolation region, the problem of bird's beak is also involved. Meanwhile, the depletion layer couples to the depletion layer of the adjacent trench more easily in the deep part of the trench than in the shallow part thereof. For this reason, the distance between the trenches cannot be made smaller than a certain value.

Some of the inventors of the present invention have also proposed another memory (U.S. application Ser. No. 465,341). This earlier U.S. application discloses a semiconductor memory which is provided with a capacitor formed by utilizing a groove formed in the semiconductor substrate, and an insulated-gate field-effect transistor, and which prevents the depletion layer extending from the groove, as well as a process of manufacturing the memory. In that device, a layer 24 is diffused into the substrate walls of the groove to be used as a capacitor electrode for contacting the source or drain of the FET (see FIG. 24). Another electrode 8 formed in the groove is coupled to ground. The device and method proposed in this related U. S. patent application make it possible to increase the degree of integration of a semiconductor integrated circuit. To further increase the degree of integration of a semiconductor integrated circuit, however, it is necessary to provide a semiconductor device which is capable of producing a desired storage capacity even if the space required by the memory cell is further decreased. Also, it is desired to limit noise to a greater extent than is done in this earlier U.S. application since such noise becomes more of a problem as the device size is decreased.

SUMMARY OF THE INVENTION

The object of the present invention is to provide a semiconductor memory which has a capacitor with good characteristics, and which requires only a small space.

Another object of the present invention is to provide a method which enables the area of a capacitor to be maintained or increased without reducing the thickness of the insulation film, even when the memory cell is small, yet overcoming the serious problems such as the alpha-particles induced disturbances that arise with a decrease in size of a memory cell, while maintaining a high S/N ratio and breakdown voltage.

Another object of the present invention is to prevent the leakage of charges between the storage capacitors of the adjacent memory cells of a DRAM.

Yet another object of the present invention is to lengthen the data retention time of the storage capacitors of a DRAM, thereby making it possible to enhance the operating speed of the DRAM.

Yet a further object of the present invention is to form a highly integrated plurality of dynamic memory cells using pores for forming the capacitors wherein possible contact between the lower plate of the capacitor and the source or drain regions of the switching MISFET is avoided.

In order to achieve these objects, the feature of the present invention lies in the following. According to the present invention, the side walls of a groove formed in a grounded silicon substrate are used as a plate, and an electrode laid in the groove over an insulation film is used as a main part of the capacitor electrode to contact the source or drain of the FET; i.e., the electrode area is increased without increasing the space required. Thus, the thickness of the insulation film is reduced to obtain a desired capacity without causing any breakdown or degradation of the insulation film. Also, the structure has reduced noise because, unlike the aforementioned U.S. application Ser. No. 465,341, the capacitor electrode coupled to the FET is isolated from the substrate.

In accordance with another aspect of the invention, a first electrode, which is formed on a semiconductor substrate and which constitutes a storage capacitor, is electrically connected with one semiconductor region of a MISFET, and a semiconductor region which is identical in the conductivity type to the semiconductor substrate and higher in the impurity concentration than the same is employed as a second electrode which constitutes the storage capacitor. The storage capacitor stores charges serving as information, principally in an accumulation layer. A depletion layer is narrowed or removed, and an inversion layer is prevented from developing. The degree of influence of unnecessary minority carriers attributed to alpha-particles or injection from a peripheral circuit portion is reduced, and adjacent memory cells are electrically isolated by the semiconductor region.

In accordance with another aspect of the present invention, the switching MISFET of the memory cell is arranged over the capacitor element. By electrically connecting a first conductive plate forming the storage capacitor element with one semiconductor region of the MISFET, by constructing a second conductive plate forming a part of the storage capacitor element by the use of a layer formed in a semiconductor substrate, and by arranging the MISFET over said storage capacitor element, this storage capacitor element is stored with charges for the information. Due to the fact that it is not necessary to have either a wide depletion layer or a wide inversion region, moreover, it is possible to prevent the leakage phenomena between the storage capacitor elements, to reduce the influences of the alpha-rays and the unnecessary minority carriers generated by the injection from the peripheral circuits, and to reduce the area necessary for the MISFET thereby to effect the desired high integration. Also, since the MISFET is arranged over the capacitor rather than aside of it, there is no danger of the lower capacitor plate contacting the source or drain of the MISFET.

The present invention will be described on its structure in detail in connection with the embodiments thereof.

BRIEF DESCRIPTION OF THE DRAWINGS

FIGS. 56A, 57A, 58A, 59A and 60A are top plan views showing the essential portions of the DRAM at the respective fabrication steps for explaining the fabrication method of the seventheenth embodiment of the present invention;

FIGS. 56B, 57B, 58B, 59B and 60B are sectional views taken along the cut lines of (A) of the corresponding figures;

DETAILED DESCRIPTION OF THE INVENTION

According to the present invention, as described above, a memory is provided which has a capacitor constructed within a groove formed in the substrate in a memory capacitor portion thereof which capacitor has an increased capacity without requiring an increased space, and which is hardly affected at all by external noise.

Figure 4:
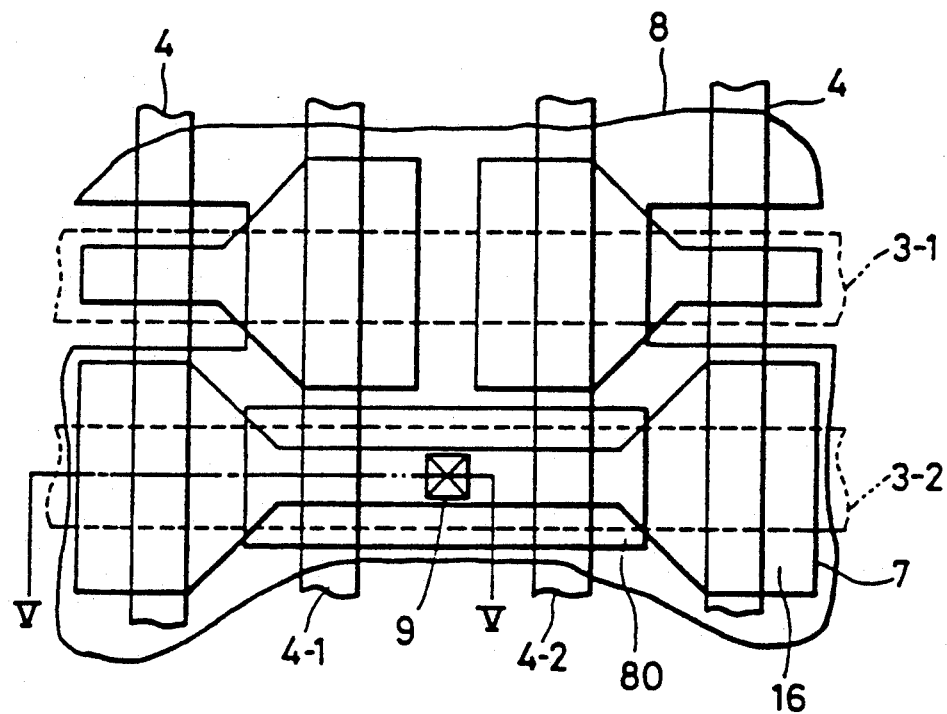
FIG. 4 is a plan view of the conventional memory cell.
Figure 5:
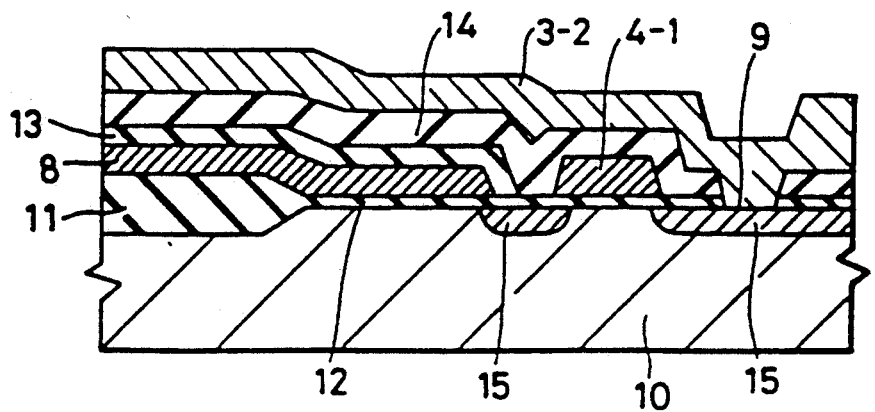
FIG. 5 is a section through the conventional memory cell.
Figure 6:
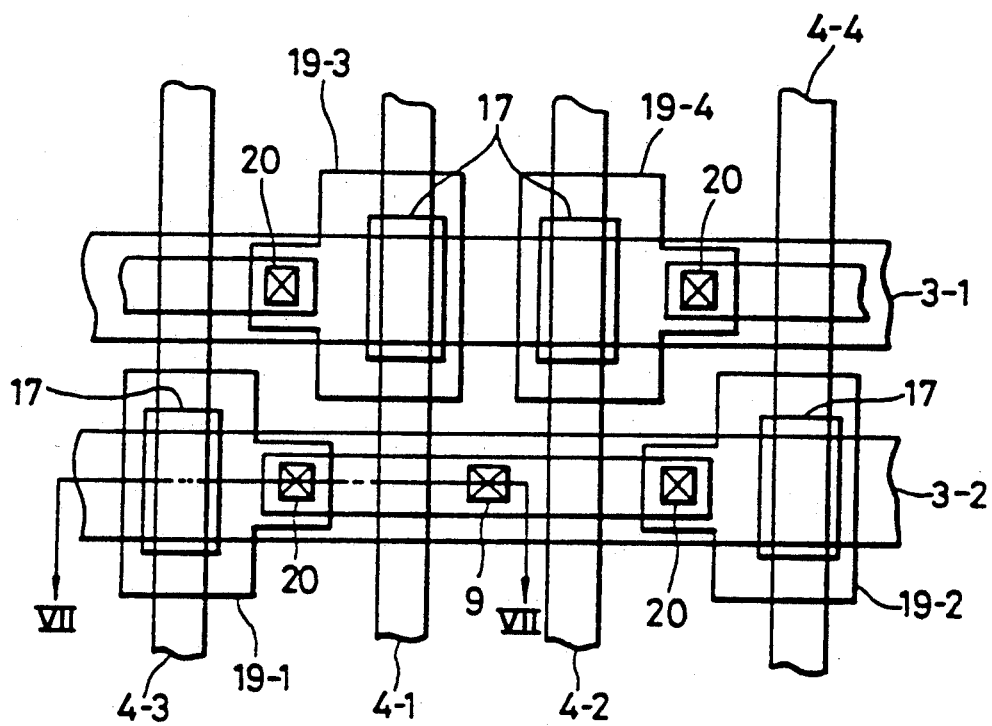
FIG. 6 is a plan view of an embodiment of the present invention.

FIG. 6 is a plan view of an embodiment according to the present invention. The difference between this embodiment and the conventional memory cell of FIG. 4 is in the particular manner in which the capacitor is formed. Specifically, a resistance layer with a small resistivity which has the same conductivity type as that of the silicon substrate is formed in the side wall of a groove 17 engraved in the silicon substrate 10 to be used as a plate 8. Also, an electrode laid in this groove is used as a capacitor electrode 19.

Figure 7:
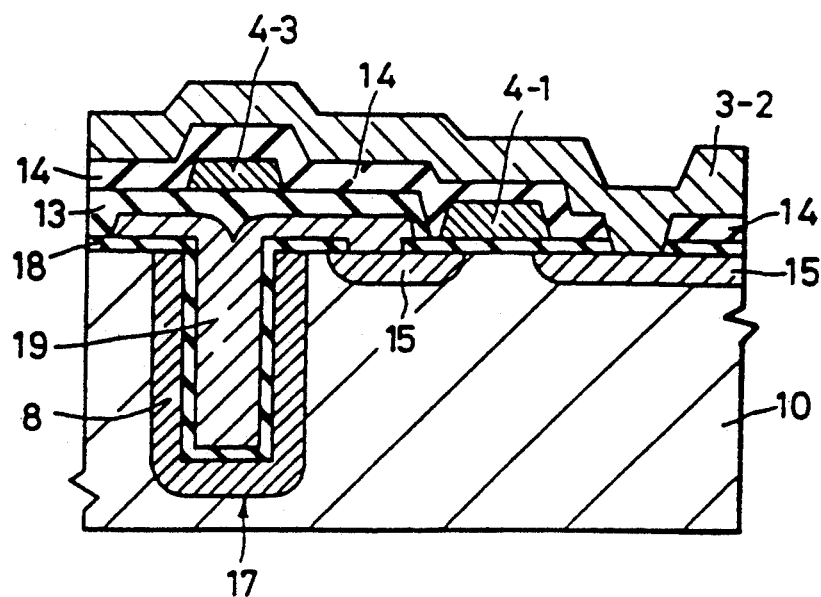
FIG. 7 is a section through the embodiment of the present invention.

FIG. 7 is a section taken along the line A—A' of FIG. 6. In FIGS. 6 and 7, reference numeral 3-2 denotes a bit line, 4-1 and 4-3 word lines, 8 a plate, 10 a p-type silicon substrate, 13 a first intermediate insulation film, 14 a second intermediate insulation film, 15 an n-type diffusion layer, 17 a groove, 18 a capacitor insulation film, and 19 a capacitor electrode. The substrate 10, and thus the plate 8, are coupled to ground while the capacitor electrode 19 is coupled to the source or drain 15 of the FET.

With this construction, the side and bottom surfaces of the groove 17 can be utilized as the capacitor. Therefore, the capacity is increased without increasing the space required. Also, because the capacitor electrode 19 coupled to the FET is isolated from the substrate, noise introduced into the substrate will not adversely affect stored information.

Figure 8:
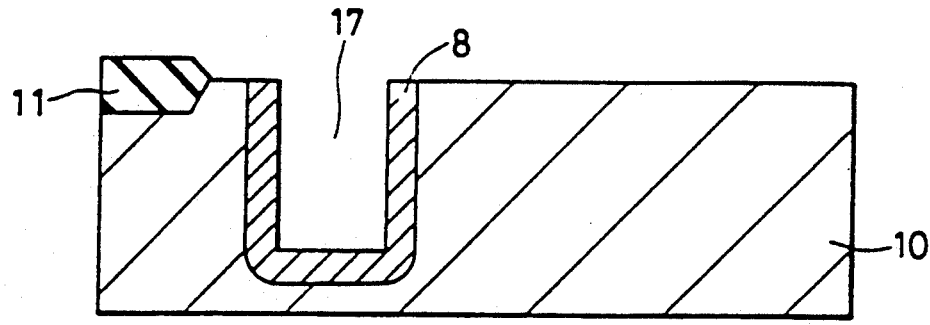
FIGS. 8 to 10 are sections illustrating the manufacture steps according to the embodiment of the present invention.
Figure 9:
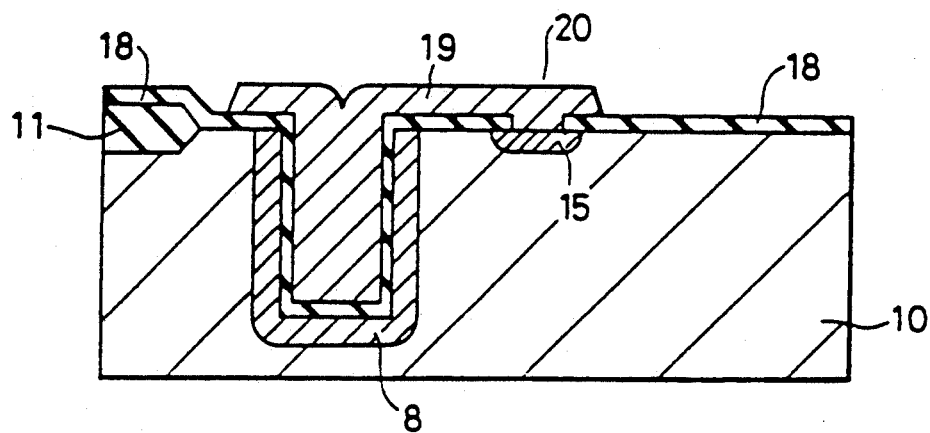

The steps of manufacturing the semiconductor memory of the invention are described below in detail. First, as illustrated in FIG. 8, a field oxide film 11 is formed by the LOCOS method over the p-type, silicon substrate 10 which has a resistivity of 1 to 20 ohms-cm, and a groove 17 of the desired size is formed by parallel-plate plasma etching using a gas containing fluorine or chlorine, such as $SF_6$ or $CCl_4$. The groove is usually etched to a depth of 1 to 5 μm. For this purpose, the pattern of the groove is first transferred onto a CVD $SiO_2$ film using an ordinary photoresist, and the groove 17 is formed using the CVD $SiO_2$ film as a mask. Thereafter, the p+-type layer 8 of the same conductivity type as that of the silicon substrate, and which has a conductivity of less than one ohm-cm, is formed over the side walls and base of the groove by the well-known diffusion method, or the like, to form the plate 8. As shown in FIG. 9, a capacitor insulation film 18 such as a single layer of $SiO_2$ or $Si_3N_4$, or a composite layer thereof, or one of $Ta_2O_5$, is deposited. A capacitor electrode connection hole 20 is formed at a predetermined place in the capacitor insulation film 18 so as to extend to the silicon substrate 10, and a capacitor electrode 19 of polycrystalline silicon is deposited over the predetermined place so that it is connected to the silicon substrate 10 through the connection hole 20. The groove 17 can be filled with polycrystalline silicon 19, as shown in FIG. 9, provided that the polycrystalline silicon 19 has a thickness which is more than one-half the distance between the inner walls of the groove 17. To impart an electrical conductivity, phosphorus or arsenic ions are added to the polycrystalline silicon 19, so that an n+-type diffusion layer 15 is formed within the silicon substrate 10.

Figure 10:
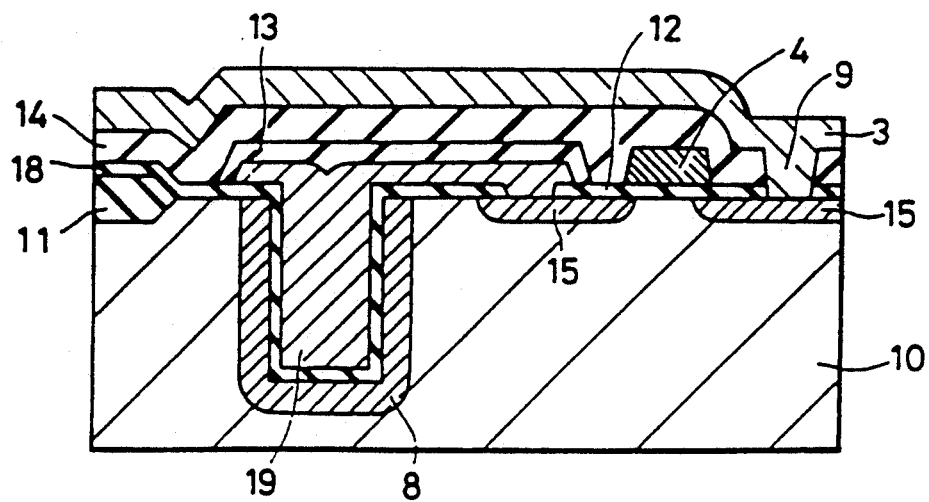

Then, as shown in FIG. 10, the polycrystalline silicon 19 is oxidized by dry or wet oxidation at between 800° to 1100° C. to form the first intermediate insulation film 13 which is between 100 to 200 nm thick. The gate oxide film 12 is formed to a thickness of between 10 to 50 nm in the area where the switching MOS transistor 2 will be formed, and a gate (word line 4) of polycrystalline silicon, molybdenum silicide, molybdenum, or tungsten, is deposited thereon. Arsenic ions are then implanted to form the n+-type diffusion layer 15.

Thereafter, the second intermediate insulation film 14 of, for example, CVDPSG is deposited, a contact hole 9 is formed so as to come into contact with the n+-type diffusion layer 15, and the bit line 3 of, for example, aluminum is deposited.

Figure 11:
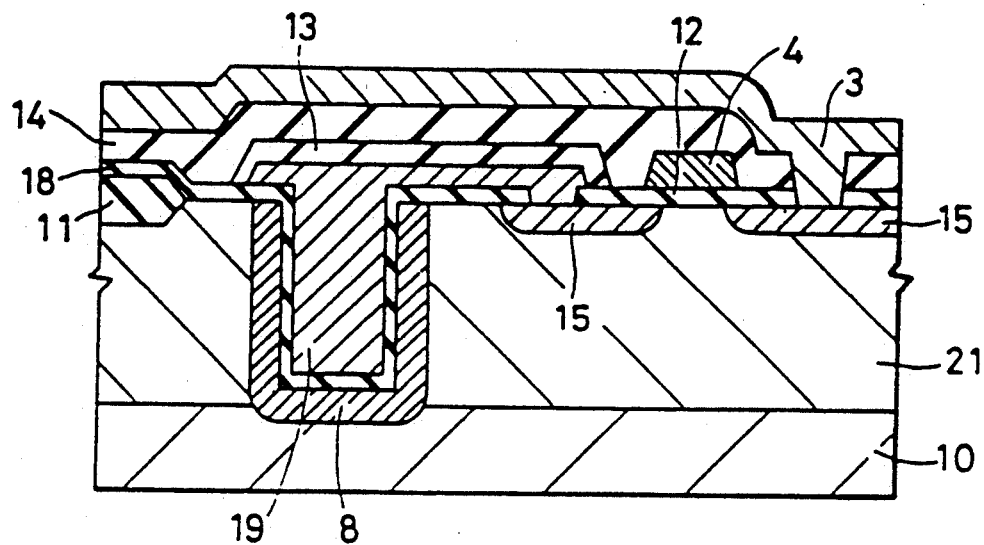
FIG. 11 is a section through another embodiment of the present invention.

Accordingly, the capacitor 1 is made up of the capacitor insulation film 18 and two electrodes, i.e., the capacitor electrode 19 and the plate 8 on either side of the capacitor insulation film 18. When the plate 8 is p-type, the same as that of the silicon substrate 10, the capacitor electrode 19 has a positive potential. Therefore, the concentration of the p-type impurities must be sufficiently high that the surface of the plate 8 is not depleted at the maximum potential to thus avoid formation of an inversion layer. In another embodiment of the present invention in which the plate 8 is n-type, the surface of the plate 8 accumulates even when the capacitor electrode 19 has a positive potential so that there is no problem. When the plate 8 is n-type, n+-type layers are formed in a separate manner in the vicinities of grooves 17 shown in FIG. 6; i.e., the n+-type layers must be connected. In such a case, therefore, use is made of an n-type silicon substrate 10, as shown in FIG. 11, and a p-type epitaxial layer 21 is formed over the surface thereof, so that the separately-formed plates 8 are all connected to the n-type silicon substrate 10. The silicon substrate is at ground potential and is hardly affected at all by noise voltages. To manufacture the device, the silicon substrate 10 with the deposited epitaxial layer 21 should be used instead of the silicon substrate of the embodiment of FIGS. 8 to 10.

Figure 12:
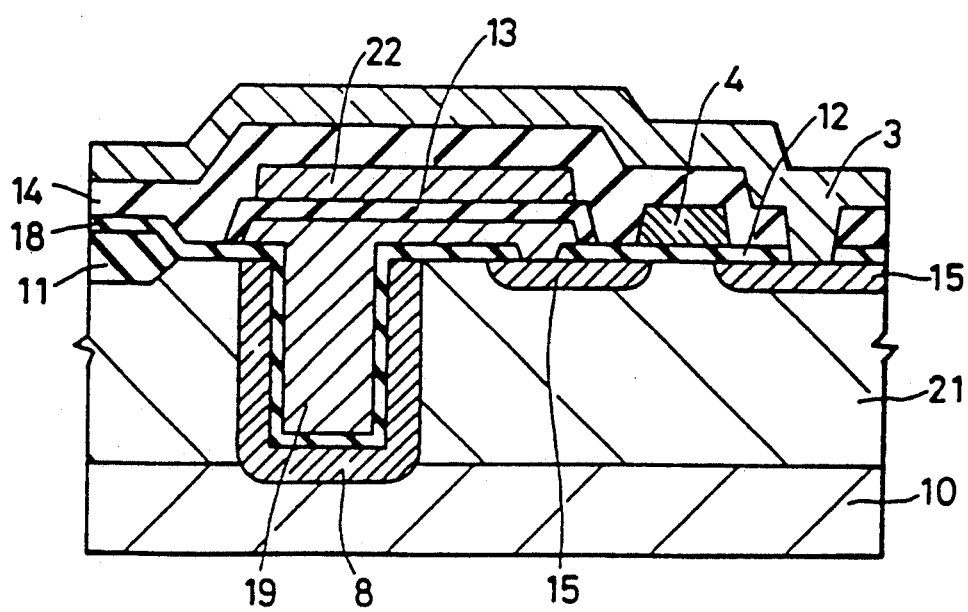
FIG. 12 is a section through a third embodiment of the present invention.

FIG. 12 shows a further embodiment of the present invention. In the previous embodiments, the capacitor 1 is formed between the capacitor electrode 19 and the plate 8. According to this embodiment, however, the capacitor is further formed by depositing a second plate 22 over the first intermediate insulation film 13. In this case, a capacitor is added to the capacitor formed by the plate 8, thus providing a capacitor with a larger capacity. The second plate 22, which is at ground potential, acts as a shield for the capacitor electrode 19, to make a device which is less susceptible to noise.

Figure 13:
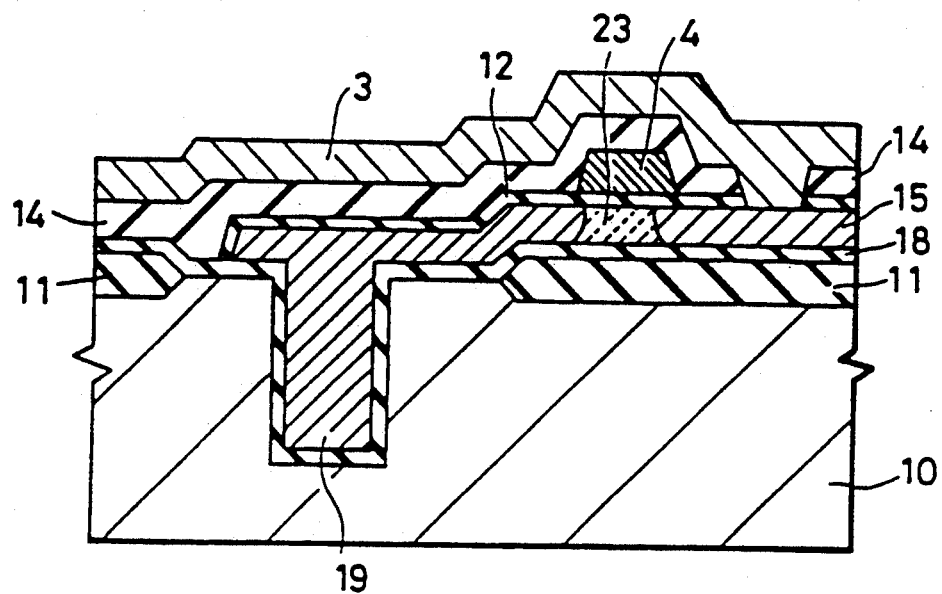
FIG. 13 is a section view through a fourth embodiment of the present invention.

In the above embodiments, the switching MOS transistor 2 is formed on the surface of the silicon substrate 10 or the epitaxial layer 21. FIG. 13 illustrates a fourth embodiment of the present invention where this is not the case.

As described already for the previous embodiments, the capacitor insulation film 18 is deposited and then a single crystalline silicon film is formed, thereby forming an SOI (silicon-on-insulator) construction which includes places that will become the capacitor electrode 19 and the diffusion layer 15 in subsequent steps. Namely, a polycrystalline or amorphous silicon film is deposited over the whole surface, or over part of the surface, and the whole or part of the surface is heated by a laser beam or by a heater, so that a monocrystalline layer 23 grows on the insulation film after the silicon film melts, or with the silicon film maintained in the solid phase. Although not shown in FIG. 13, the monocrystallization takes place easily if a piece of silicon film or SOI construction is brought into contact with the silicon substrate 10.

Thereafter, a gate oxide film 12 and a gate 4 deposited on the SOI layer 23, followed by the formation of an n+-type layer, so that one side acts as the capacitor electrode 19 and the other side as the diffusion layer 15 connected to the bit line 3. The subsequent steps are the same as those of the previous embodiments. In this embodiment, no switching transistor 2 is formed on the silicon substrate 10; i.e., the substrate 10 may be of any conductivity type. That is, if the substrate 10 is n-type, the silicon substrate 10 itself acts as a plate, and so there is particular need to provide the plate 8.

A dynamic memory, in general, has peripheral circuits with various functions formed around the memory cell, and it is difficult to make the whole of the silicon substrate 10 n-type. In this case, however, the plate 8 can be provided so that only the portion of the memory cell need be n-type.

Although the embodiment of FIG. 13 does not employ a second plate, it is possible to provide the second plate 22 used in the embodiment of FIG. 12.

Figure 14A:
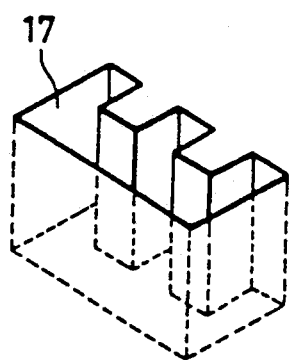
FIG. 14 illustrates capacitor electrodes of various shapes.
Figure 14B:
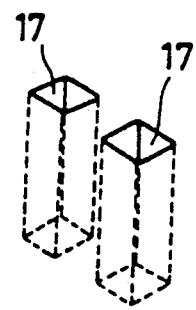
Figure 14C:
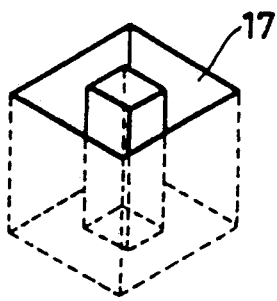

In these embodiments of the present invention, the groove 17 has a simple rectangular shape, as shown in FIG. 6. Capacity increases with an increase in the surface area of the capacitor electrode 19 facing the plate 8. As shown in FIGS. 14A, 14B, and 14C, therefore, the capacitor can be increased to more than that of a simple rectangular shape, while maintaining the same space. That is, the capacity can be increased by forming the groove 17 in a comb shape, as shown in FIG. 14A; or by forming two or more small grooves, as shown in FIG. 14B; or by forming an annular groove 17, as shown in FIG. 14C.

The above embodiments are selected from many processes that enable a wide variety of selections. Therefore, individual steps can be replaced by others in a variety of ways. In all the embodiments, however, the common point remains that the side walls of the groove formed in the substrate are utilized as a capacitor part.

In the above embodiments, the word line 4 has the form of a continuous gate within a memory cell array. It is, however, also possible to form polycrystalline silicon transfer gates of switching transistors that are not continuous, but are separate between memory cells, and connect the gates by the word line 4 using new contact holes. This makes it possible to achieve a high switching speed by using polycrystalline silicon gates which have heretofore been evaluated for their reliability, and by utilizing the advantage of the low resistance of aluminum for the word line 4.

As described earlier, the gist of the present invention resides in that the side walls of a groove engraved in a substrate are utilized as a capacitor part. Therefore, the gist of the present invention is not impaired even when a laminated capacitor such as the second plate 22 composed of a polycrystalline - silicon layer, $Si_3N_4$ film, and polycrystalline silicon layer, which has heretofore been known, is formed over the surface of the substrate except for the groove, and even when the thus-formed capacitor is connected in parallel to the capacitor formed by the side walls to increase the capacity Cs.

Figure 15:
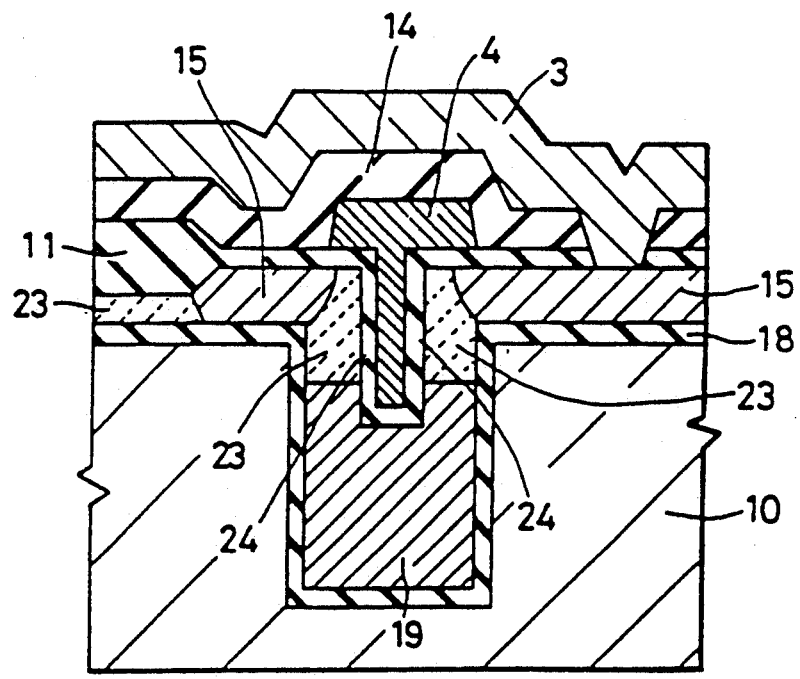
FIG. 15 is a section through a fifth embodiment of the present invention.
Figure 16:
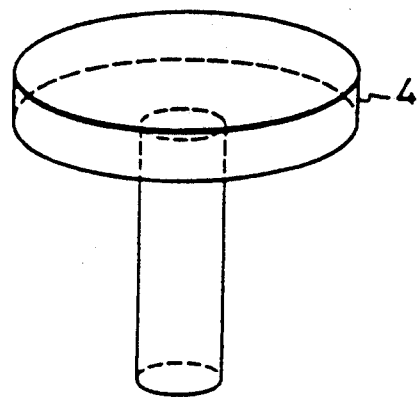
FIGS. 16 and 17 show gate configurations for FIG. 15.
Figure 17:
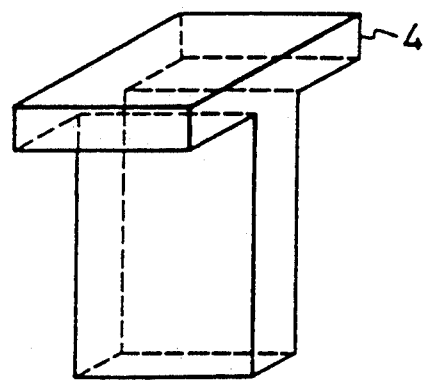

Moreover, the switching transistor can be formed in an SOI layer parallel to the silicon substrate, as shown in FIG. 13. On the other hand, as shown in FIG. 15, it is possible to form a transistor channel 24 in the vertical direction within the SOI layer 23. Specifically, in FIG. 15, the regions 15 are actually coupled together (although this is not shown in this sectional view) to form either the source or drain of the FET. The capacitor electrode 19 serves as the other source of drain region, with a vertical channel being formed between regions 15 and 19 through the SOI layer 23. The gate electrode 4 could be, for example, a bolt type, as shown in FIG. 16, a T-plate type, as shown in FIG. 17, or another suitable shape for forming the vertical transistor. The vertical junction transistor can be adapted to every kind of memory cell which employs SOI.

As described in the beginning, the invention deals with the use of an n-channel MOS transistor. To form a p-channel transistor, impurities of the opposite conductivity type should be used. Namely, the phosphorus or arsenic ions should be replaced with boron or aluminum ions, and the boron ions should be replaced by phosphorus, arsenic, or antimony ions.

The invention is described above in detail by way of embodiments. That is, when a switching transistor is formed on the surface of a substrate, the capacity Cs can be increased two to three fold while maintaining the same required space, compared with that of a conventional memory cell. When the switching transistor is formed in an SOI layer, the capacity Cs can be increased to several times that of a conventional memory cell. In practice, the groove does not have a perfectly rectangular cross-section, but is rounded to some extent. Further, an intended squared shape may often become circular due to a decrease in the resolution of lithography in fine portions. Even in this case, however, the capacity CS decreases by only 10 to 20%.

The probability of the erroneous operation of a dynamic memory due to alpha particles is reduced by more than 10 times by an increase in capacity Cs of 10%. Therefore, an increase in the capacity Cs by more than twofold helps, not only to improve the reliability of a memory of the same scale, but also to realize a large-scale memory.

In the semiconductor memory of the present invention, furthermore, pairs of electrons and positive holes generated in large amounts by alpha particles within the silicon substrate seldom flow into the capacitor electrode 19 owing to its construction. With a semiconductor memory employing SOI, in particular, pairs of electrons and positive holes are not able to enter the capacitor electrode 19. Accordingly, the semiconductor memory according to the present invention is very stable against alpha particles.

Next, the present invention will be described in the following in connection with its further embodiment with reference to FIG. 18. This embodiment is directed to a one-transistor dynamic MOS memory cell, which is featured by the fact that the charge storage node 19 is enabled to have the capacitance of three kinds of electrodes so that it can have a storage capacitance twice as large as that of the prior art. The following description relates to an N-channel memory cell for purposes of explanation. Conversely for a P-channel type, the following conductivity type may be reversed from N to P. The charge storage node 19 is made of polycrystalline silicon, for example, and is connected, while being formed in the groove, to one N+-type diffusion layer 15 of the cell switching MOS transistor 4. The one storage capacitance $C_{S1}$ is the depletion capacitance between the charge storage node 19 and the P-type epitaxial layer 21. This capacitance is smaller than the remaining capacitances $C_{S2}$ and $C_{S3}$ because it is usually appropriate to set the concentration of the epitaxial layer 21 at a value substantially equal to the substrate concentration of $10^{14}$ to $10^{16}$ cm$^{-3}$ of the ordinary N-channel MOSLSI. Next, the capacitance $C_{S2}$ is that between the charge storage node 19 and the highly doped P+- or N+-type substrate and can be deemed as a capacitance equivalent to that between the metal layers through the thin insulation film 18 (which may have a single- or multi-layer construction). Moreover, the capacitance $C_{S3}$ is that between the charge storage node 19 and the polycrystalline electrode 22, for example, through another insulation film 13 which may also have single- or multi-layer construction, and which is equivalent to that between the metal layers like the capacitance $C_{S2}$. If the structure and the capacitances of the substrate itself are thus made, as shown in FIG. 18, the capacitance per unit required space can be increased to a value twice as large as that of the aforementioned structure of the prior art.

Figure 18:
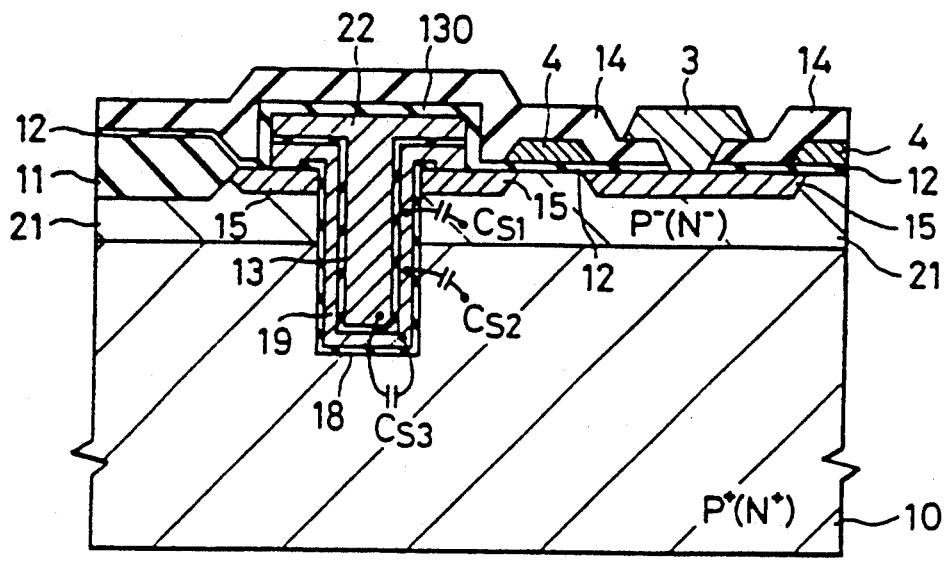
FIG. 18 is a section through a sixth embodiment of the present invention.

In FIG. 18, the memory operates in the following way. To write data ; a voltage at a high or low level is applied to the selected one of the aluminum data lines 3 which intersect the word lines, or gate electrodes 4, at right angles. Then, the selected word line or gate electrode 4 is goes high to turn the switching MOS transistor ON, said switching transistor being composed of the N+-type diffusion layer 15, the gate insulator 12 and the gate electrodes 4. The data of the data line 3 flow from an N+-type diffusion layer or drain 23 through the channel to the N+-type diffusion layer or source 15. The data further flow from the N+-type diffusion layer 15 into the charge storage node 19. After this, the switching transistor goes OFF so that the data stored in the charge storage node 19 are held.

The data reading operation is conducted, in contrast to the above, by detecting the minute voltage change of the data line, when the switching transistor is ON, by means of a high performance amplifier. The element separating film 11 and the intermediate insulation film 14 are made of a silicon oxide film by the conventional LOCOS method or a silicon oxide film which may contain phosphor (P) by the CVD method.

Figure 19:
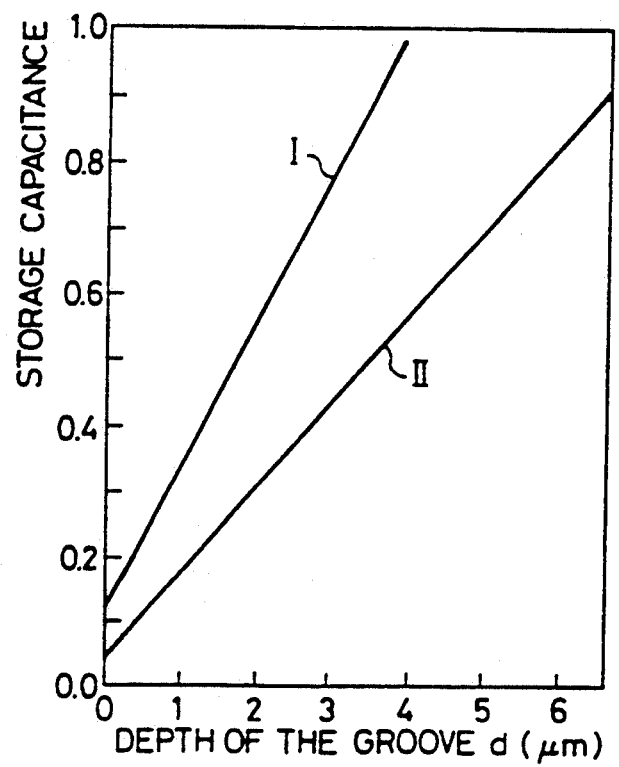
FIG. 19 is a graph comparing the storage capacitances of the sixth embodiment of the present invention and the example of the prior art.

The detail comparison in the storage capacitance between structures of the present embodiment and the prior art is shown in FIG. 19. In FIG. 19, the storage capacitances against the groove depth d are a comparison between the present structure (as indicated by a curve I) and the conventional structure (as indicated by a curve II). In the structure I according to the present structure, a larger storage capacitance can be obtaiend than with the conventional structure for the large groove depth d. The substrate structure of FIG. 18 can be realized by making use of a PonP+-type epitaxial substrate, for example. It is evident that simply using the above-specified epitaxial substrate from the conventional structure accomplishes nothing. This is because the inversion layer is not formed in the P+-type layer so that storage capacitance cannot be established.

The insulation films 18 and 13 forming the capacitances can be made of a thin $SiO_2$, $Si_3N_4$ or $Ta_2O_5$ film or their composed film. More specifically, the insulation films are made of $SiO_2/Si_3N_4$ or $SiO_2/Ta_2O_5$ in the case of the two-layer structure and $SiO_2/Si_3N_4/SiO_2$ or $SiO_2/Ta_2O_5/SiO_2$. From the intermediate characteristics, it is desired that the layer or $SiO_2$ be formed at the side of the single crystalline substrate (i.e., at the lower side of the insulation film 18). Moreover, a better result is obtained if the $Si_3N_4$ and $Ta_2O_5$ of the CVD method are used as the insulation films, that is, as the upper side of the insulation film 18 and the two sides of the insulation film 13, lying over the polycrystalline silicon.

Figure 1:
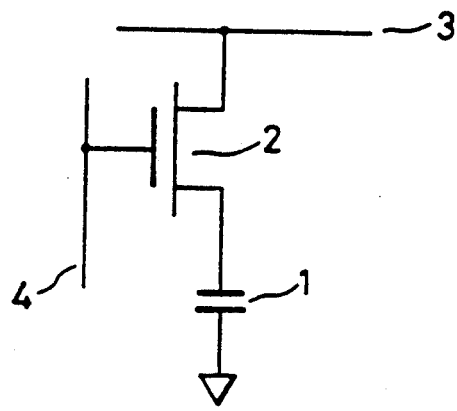
FIG. 1 is a circuit diagram of a conventional memory cell.
Figure 2:
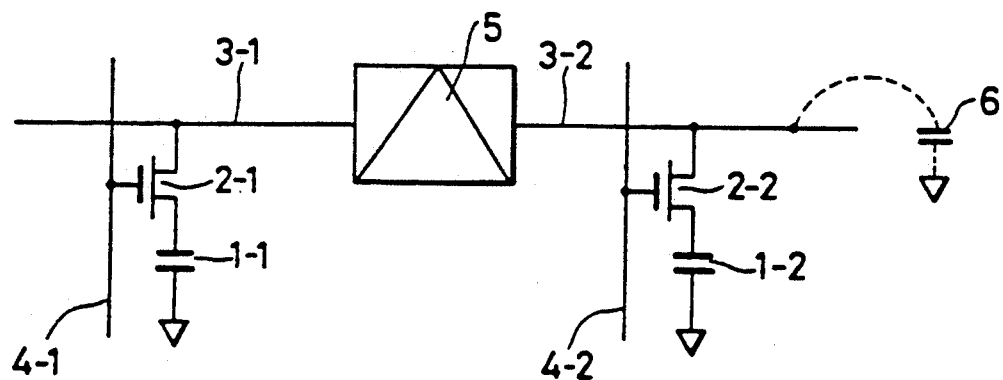
FIG. 2 is a circuit diagram of a method of using the conventional memory device.
Figure 3:
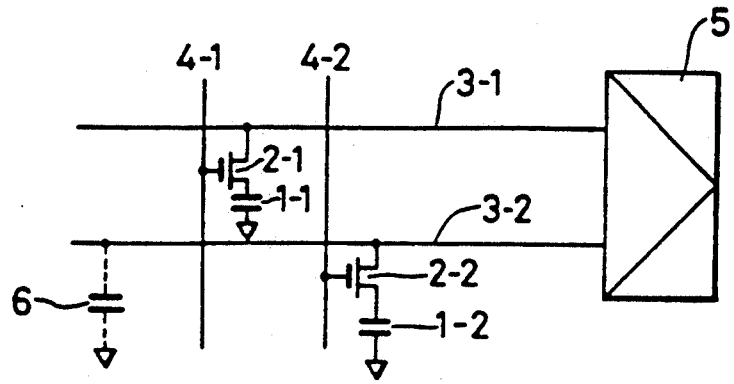
FIG. 3 is a circuit diagram of another method of using the conventional memory device.
Figure 20:
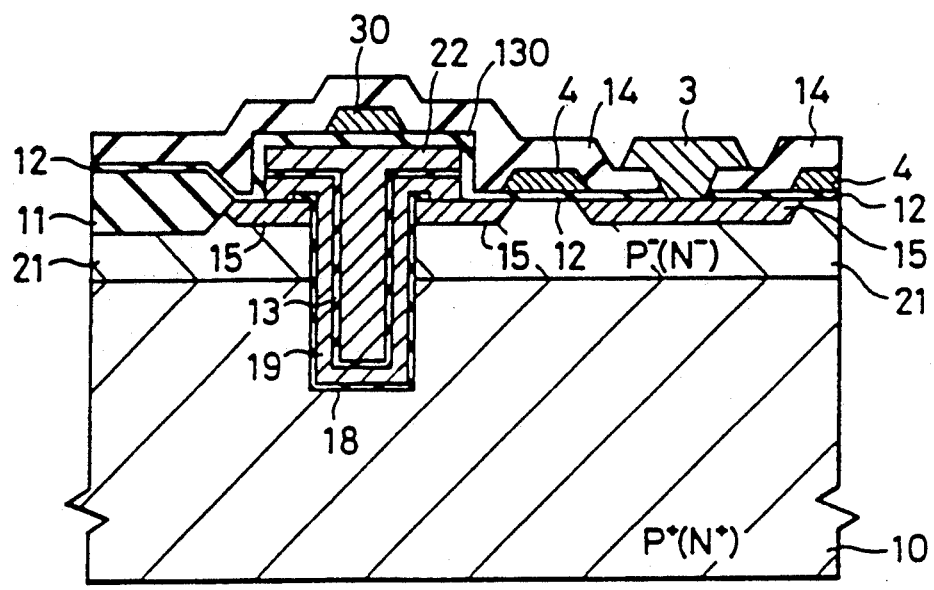
FIG. 20 is a section through a seventh embodiment of the present invention.

FIG. 20 shows a further embodiment of the present invention. This embodiment is not essentially different from that of FIG. 18 but exemplifies the fact that the gate line 30 of the switching transistor can be arranged over the capacitor portion. This structure is essential for the foregoing folded-bit line structure shown in FIG. 3. In this case, an intermediate insulation film 130 is indispensable. This intermediate insulation film 130 may be the thermally oxidized film of the second plate electrode 22. The same reference numerals as those in FIG. 18 indicate the same or equivalent portions.

Figure 21:
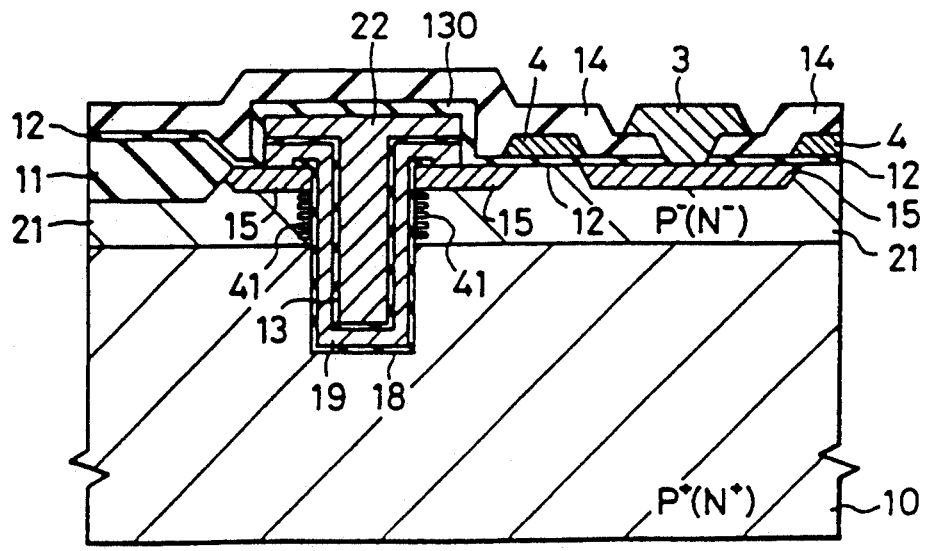
FIG. 21 is a section through an eighth embodiment of the present invention.

A further embodiment of the present invention is shown in FIG. 21. This embodiment is characterized in that the surface of the P−-type substrate region 21 contacting the groove is formed with an impurity-doped region 41 of the same conductivity type having a slightly higher concentration that the P−-type region 21 (i.e., of the order of about $10^{17}$ cm$^{-3}$) so as to increase the capacitance $C_{S1}$. Since the depletion layer thickness inversely proportional to the depletion capacitance is inversely proportional to the root of the impurity concentration of the region 41, the capacitance $C_{S1}$ can be tripled if the impurity concentration of the P−-type region 21 is set to $10^{16}$ cm$^{-3}$ whereas the concentration of the region 41 is set at $10^{17}$ cm$^{-3}$, so that the overall charge storage capacitance can be further increased. The region 41 can be formed by implanting a P-type of impurity such as boron (B) to diffuse into the groove after the groove has been etched. The same reference numerals appearing in FIG. 21 as those of FIG. 18 indicate the same or equivalent portions.

Figure 22:
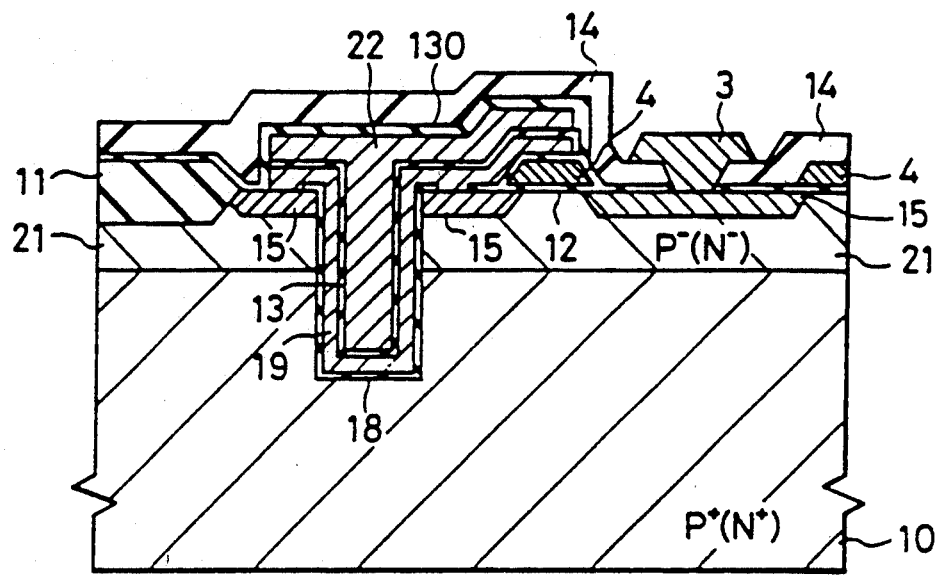
FIG. 22 is a section through a ninth embodiment of the present invention.

A further embodiment of the present invention is shown in FIG. 22. In this embodiment, the electrode 19 to be stored with the charges is superposed on the gate electrode 4 of the cell switching MOS transistor (hereafter called the switching transistor) so that the storage capacitance to be formed between the electrodes 19 and 22 is further increased. In FIG. 22, the same reference numerals as those in FIG. 18 indicate the same or equivalent portions.

Figure 23:
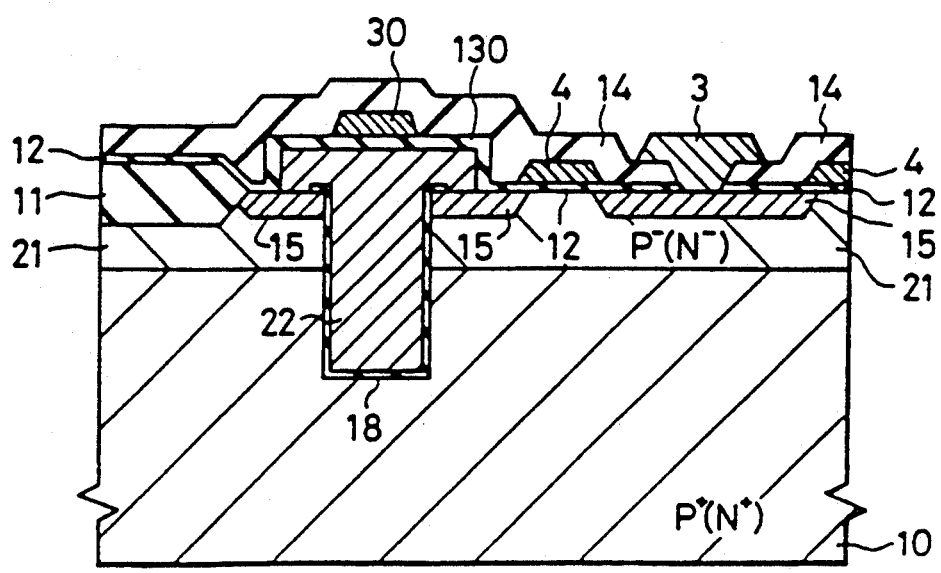
FIG. 23 is a section through a tenth embodiment of the present invention.

A further embodiment of the present invention is shown in FIG. 23. This embodiment provides a structure from which the capacitance $C_{S3}$ of FIG. 18 is eliminated to simplify the process. The charge storage capacitance is reduced to an extent corresponding to the elimination of the capacitance $C_{S3}$. Despite this defect, however, the present structure is more resistant to noise than the prior art is, and displays superior characteristics with the same capacitance, although this applies not only to the present embodiment but also the remaining embodiments of the present invention. More specifically, the present embodiment has the following advantages over the conventional structure:

1) The present structure is free of noise due to ripple and other undesirable characteristics in the supply voltage. That is to say, the electrodes 1, 2 and 7 need not be supplied with the supply voltage so that they can be set at ground potential because there is no necessity for forming any inversion layer.
2) No leakage current flows because there exists no inversion layers in the memory cell.
3) The present structure is resistant to alpha-particle-induced soft errors. Because the maior charge storage portion is not on the silicon, but is in the low-resistance polysilicon electrode 19 in the groove.

Figure 24A:
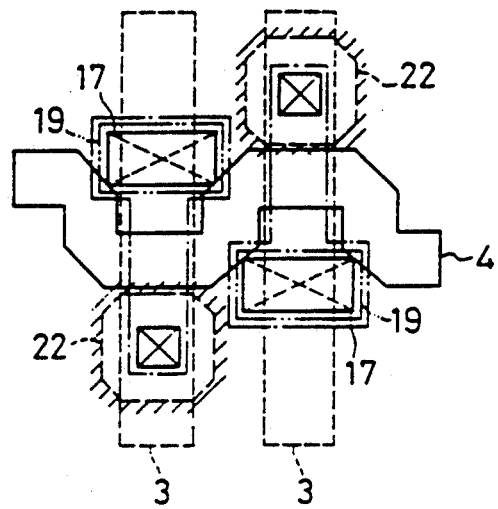
FIG. 24A is a plan view of a sixth embodiment of the present invention.
Figure 24B:
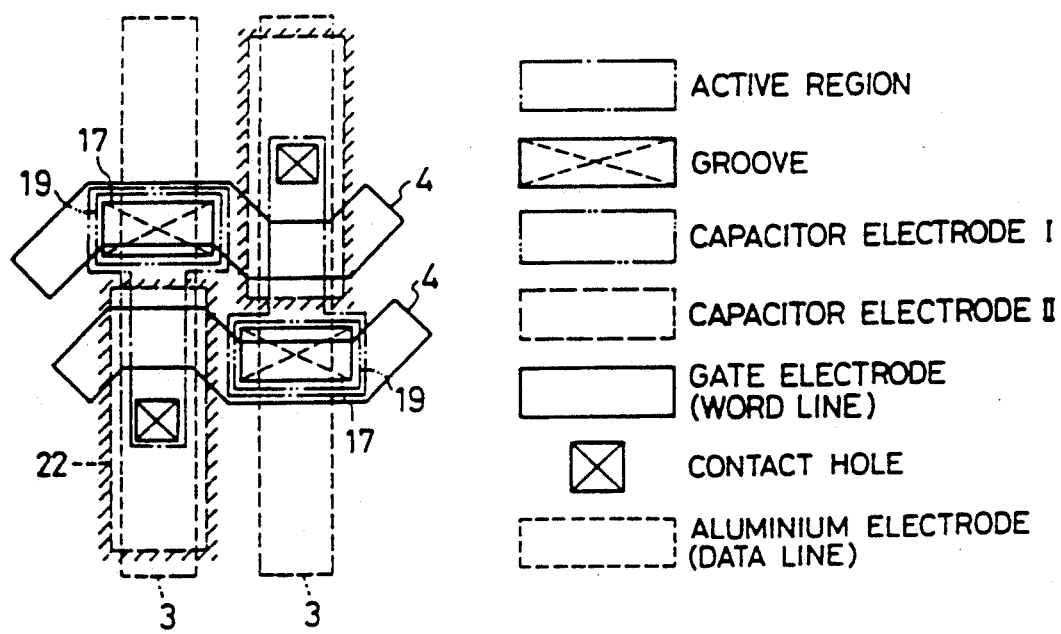
FIG. 24B is a plan view of a seventh embodiment of the present invention.
Figure 25A:
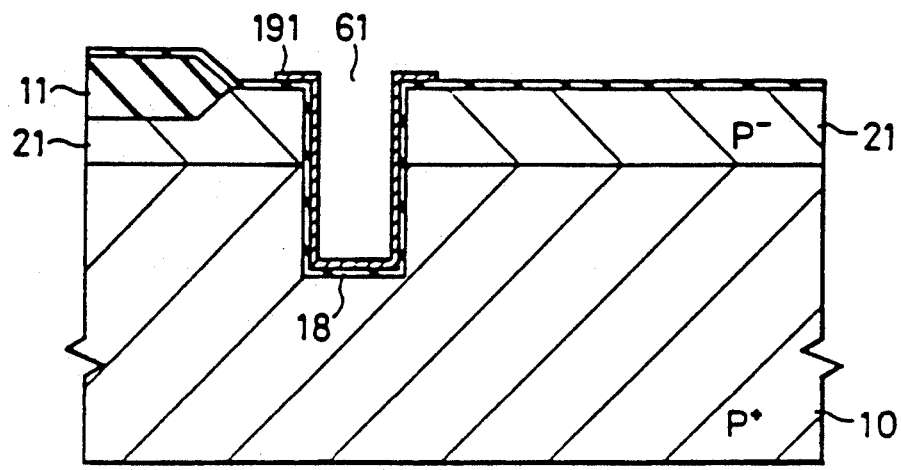
FIGS. 25A to 25E are sections illustrating the manufacture steps according to the sixth embodiment.
Figure 25B:
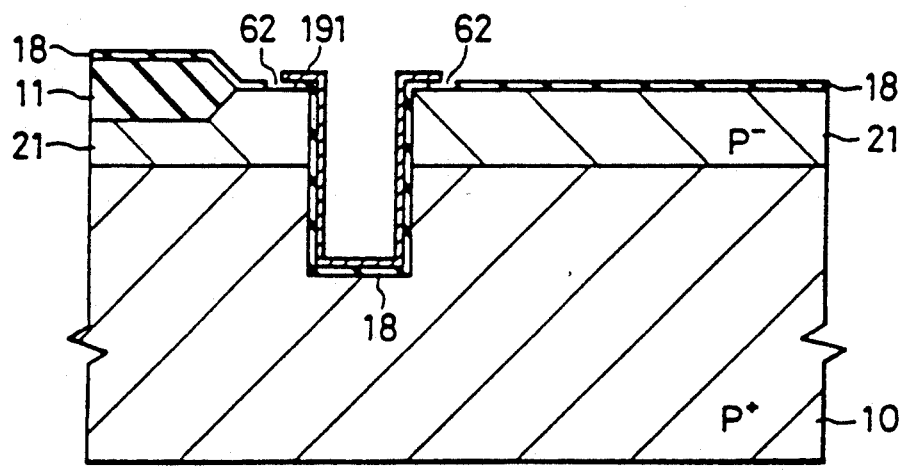
Figure 25C:
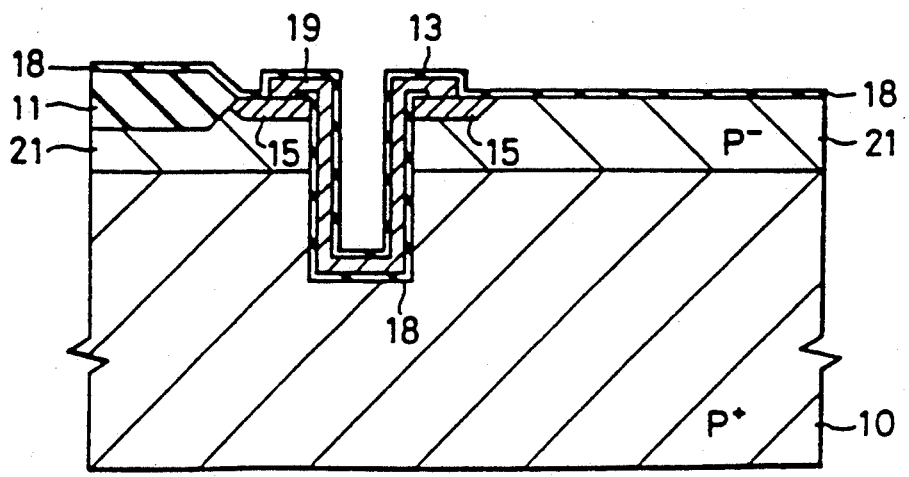
Figure 25D:
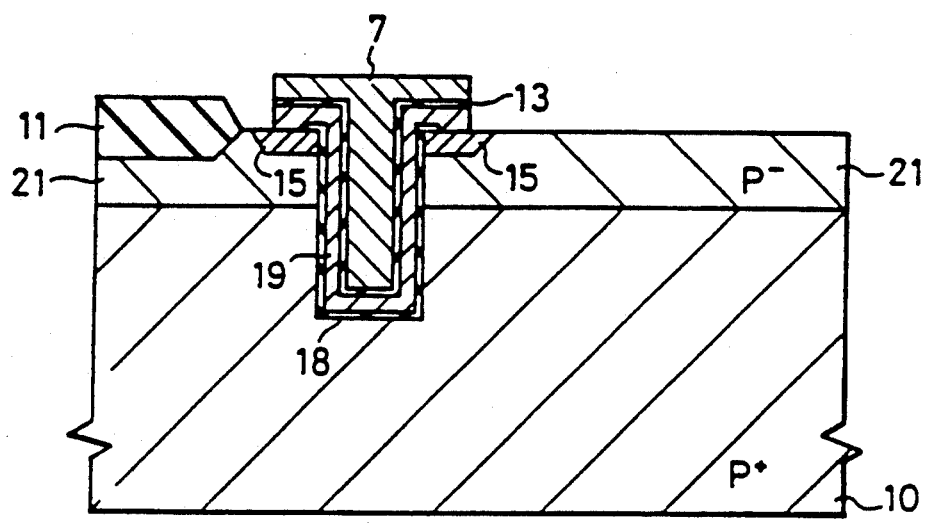
Figure 25E:
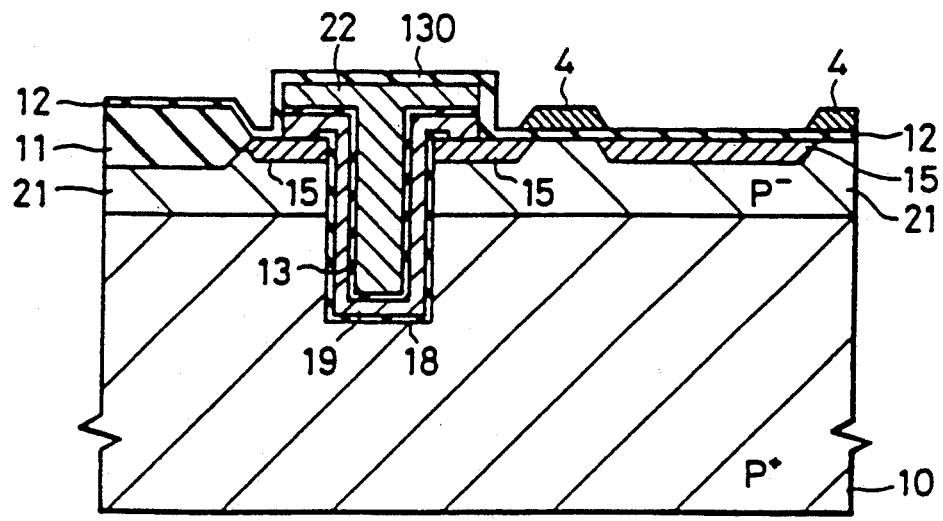

A plain view of the memory cells of the present invention are shown in FIGS. 24A and 24B. FIG. 24A is a plan view corresponding to the structure shown in FIG. 18, whereas FIG. 24B is a plan view corresponding to the structure of FIG. 20. As is apparent from these diagrams, both memory cells are formed with large storage capacitances in small areas of the deep groove regions 17.

FIGS. 24A and 24B show two adjacent memory cells. The data lines 3, aluminum electrodes, are parallel to the long axis in the drawing. FIG. 24A is an example of open-bit line structure, FIG. 24B is an example of folded-bit line structure. The difference between these two structures depends upon whether there are two gate electrodes (or word lines) 4 or only one, or whether the paired data lines are juxtaposed side-by-side or at opposite sides across the sense amplifier.

As has been described hereinbefore, it is apparent that the memory cell structure according to the present invention is suitable for a very highly integrated memory LSI.

The following detailed description is directed mainly to one example of the manufacturing method of the embodiment of FIG. 18. The manufacturing method is as follows:

(a) The substrate having the P$^-$-type region 21 formed thereover is oxidized at selected regions to create the groove of the charge storage portion. A detailed description is omitted because it can be effected by the well known dry etching technique. The surface is formed with a thin insulation film 18, and polycrystalline silicon 191 forming part of the charge storage node 19 is deposited to a thickness of one half of the final finish thickness. Other regions are removed by etching.

(b) By using a mask, the insulation film is removed from the contacting portion 62 between the polycrystalline silicon 191 and the substrate. At this time, the insulating film is overetched. The result is that the mask at the contacting is small so that the cell itself is smaller.

(c) After deposition, the polycrystalline silicon 19 is doped with an n-type impurity such as arsenic (As) or phosphor (P) by diffusion or ion implantation and is subjected to heat treatment. Then, an n-type impurity is diffused from the polycrystalline silicon 19 into the silicon substrate to form an n-type diffusion layer 15. After this, the polycrystalline silicon 19 is etched away to form the insulation film 13.

(d) The polycrystalline silicon 22 for providing the electrode of the capacitance $C_{S3}$ is deposited, and the other regions are removed along with insulation film 13.

(e) Through surface oxidation, gate oxide film 12, gate electrode 4, and source and drain regions 15 are formed as in the prior art.

If metallization is then conducted, the structure of FIG. 18 is obtained. It is apparent that the manufacturing method of FIG. 20 may be exemplified by adding a P-type impurity diffusion step to the present method.

As has been described hereinbefore, according to the present invention, the charge storage capacitance for the same required space can be made twice as high as that of the memory cell having the groove of the prior art so that the present invention is suitable for dense integration. According to the present invention, moreover, it is possible to provide a memory cell having the following characteristics:

1) Ripple noise in the supply voltage can be eliminated;
2) There is no interference between the memory cells; and
3) The structure is highly resistant to alpha-particles.

The characteristics show that the memory cell of the present invention is suitable for very dense integration.

Figure 26:
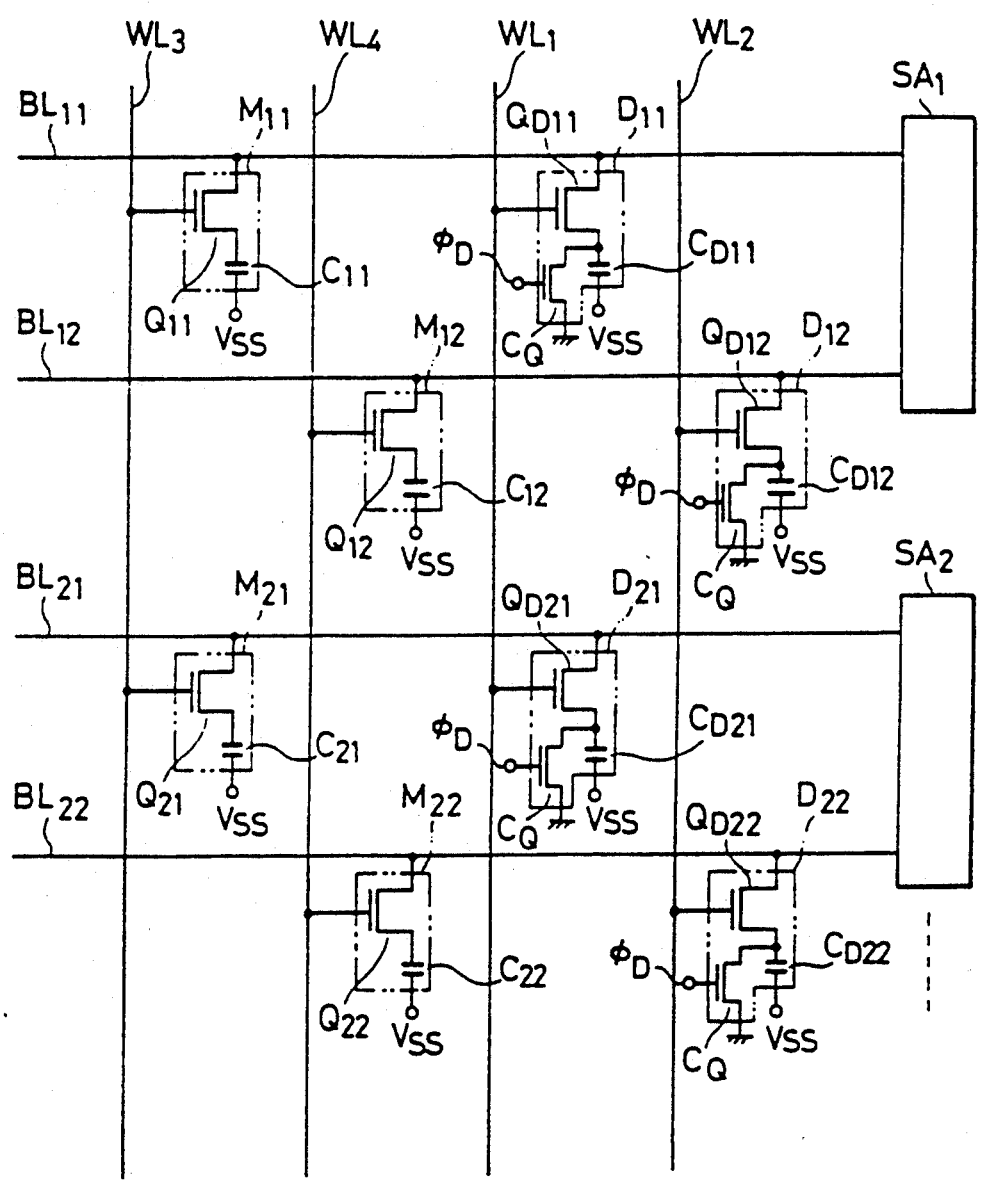
FIG. 26 is an equivalent circuit diagram illustrative of the essential portions of the memory cell array of a DRAM for explaining further embodiments of the present invention.

FIG. 26 is an equivalent circuit diagram illustrative of the essential portions of the memory cell array of a DRAM for explaining further embodiments of the present invention.

Referring to FIG. 26, symbols $SA_1$, $SA_2$, ... denote sense amplifiers, each of which serves to amplify the minute potential difference between a predetermined memory cell and a predetermined dummy cell to be described later. Symbols $BL_{11}$ and $BL_{12}$ denote bit lines which extend in the row direction from one side end of the sense amplifier $SA_1$. Symbols $BL_{21}$ and $BL_{22}$ denote bit lines which extend in the row direction from one side end of the sense amplifier $SA_2$. These bit lines BL serve to transmit charges as information. Symbols $WL_1$ and $WL_2$ denote word lines which extend in the column direction. They are connected to predetermined gate electrodes which constitute the switching MISFETs of the dummy cells to be described later, and they serve to turn "on" and "off" these MISFETs. Symbols $WL_3$ and $WL_4$ denote word lines which extend in the column direction. They are connected to predetermined gate electrodes which constitute the switching MISFETs of the memory cells to be described later, and they serve to turn "on" and "off" these MISFETs. Symbols $M_{11}$, $M_{12}$, $M_{21}$, $M_{22}$, ... denote the memory cells, which hold the charges serving as the information. The memory cell $M_{11}$, $M_{12}$, $M_{21}$, $M_{22}$, ... is constructed of the MISFET $Q_{11}$, $Q_{12}$, $Q_{21}$, $Q_{22}$, ... one end of which is connected to the predetermined bit line BL and the gate electrode of which is connected to the predetermined word line WL, and a capacitor portion $C_{11}$, $C_{12}$, $C_{21}$, $C_{22}$, ... one end of which is connected to the other end of the MISFET $Q_{11}$, $Q_{12}$, $Q_{21}$, $Q_{22}$, ... and the other end of which is connected to a fixed potential $V_{SS}$ such as the ground potential (0 V) or a substrate back bias potential ($-2.5 - -3.0$ V). Symbols $D_{11}$, $D_{12}$, $D_{21}$, $D_{22}$, ... denote the dummy cells, which hold charges permitting the judgment of "1" and "0" that are the information of the memory cells M. The dummy cell $D_{11}$, $D_{12}$, $D_{21}$, $D_{22}$, ... is constructed of the MISFET $Q_{D11}$, $Q_{D12}$, $Q_{D21}$, $Q_{D22}$, ... one end of which is connected to the predetermined bit line BL and the gate electrode of which is connected to the predetermined word line WL, a capacitor portion $C_{D11}$, $C_{D12}$, $C_{D21}$, $C_{D22}$, ... one end of which is connected to the other end of the MISFET $Q_{D11}$, $Q_{D12}$, $Q_{D21}$, $Q_{D22}$, ... and the other end of which is connected to the terminal of the fixed potential $V_{SS}$, and a clearing MISFET CQ which serves to clear the charges stored in the capacitor portion $C_{D11}$, $C_{D12}$, $C_{D21}$, $C_{D22}$, .... Symbol $\phi_D$ denotes a terminal which is connected with the gate electrode of the clearing MISFET CQ.

Next, the practicable structure of an eleventh embodiment of the present invention will be described.

Figure 27A:
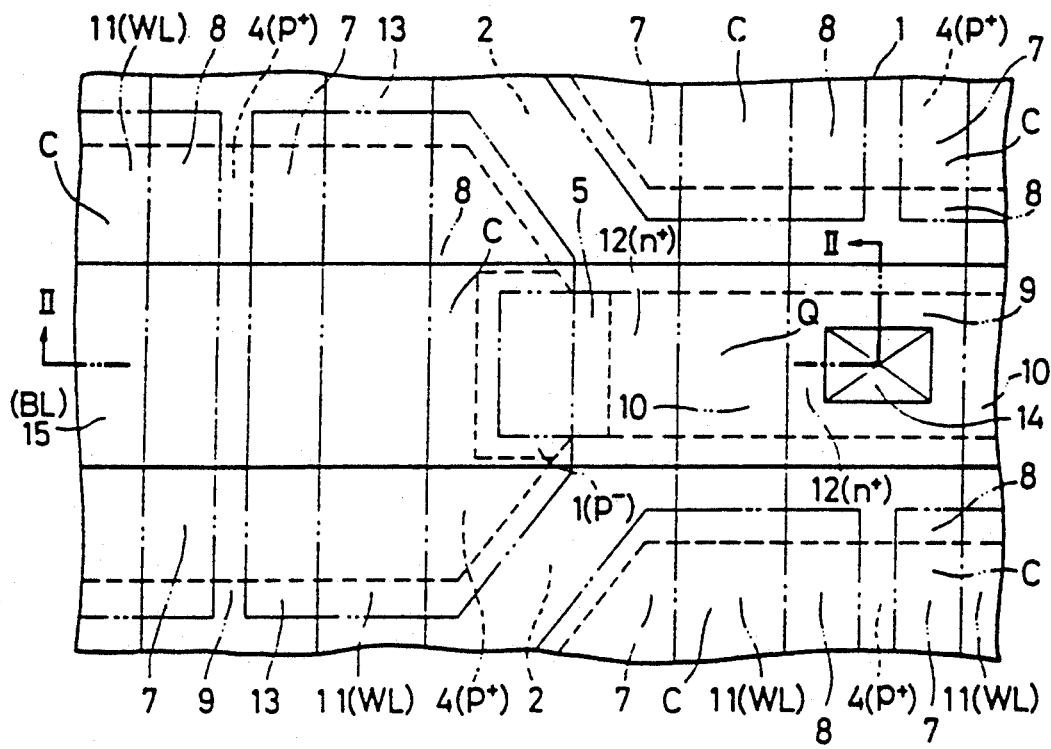
FIG. 27A is a plan view of the essential portions of a DRAM memory cell in an eleventh embodiment of the present invention.
Figure 27B:
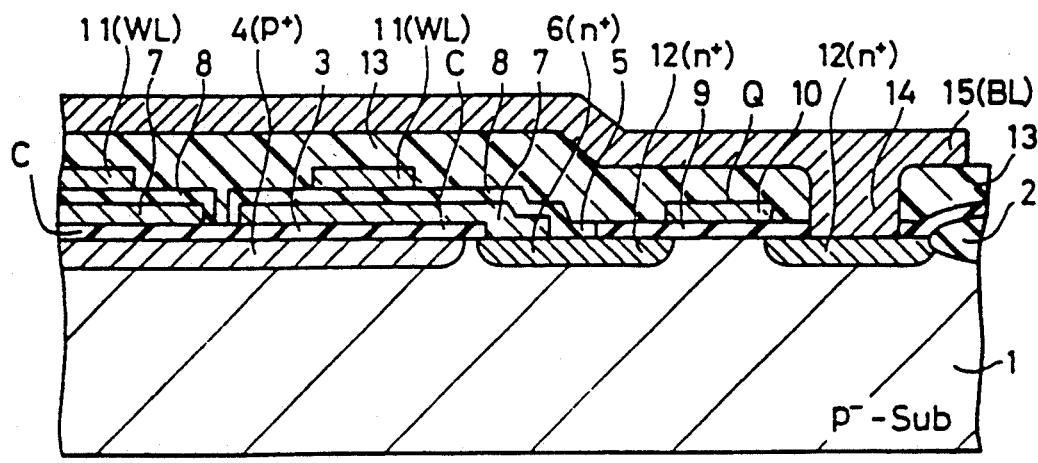
FIG. 27B is a sectional view taken along line II—II in FIG. 27A.

FIG. 27A is a plan view of the essential portions of a DRAM memory cell for explaining the structure of the present embodiment, while FIG. 27B is a sectional view taken along line II—II in FIG. 27A. In all the drawings of the present embodiment, parts having the same functions are assigned identical symbols, and they shall not be repeatedly explained.

In FIGS. 27A and 27B, numeral 1 designates a p$^-$-type semiconductor substrate, which serves to construct a DRAM.

Numeral 2 designates a field oxide film which is formed on the main surface portion of the semiconductor substrate 1 so as to be located among predetermined memory cells and among semiconductor elements constituting peripheral circuits (not shown), for example, an address selecting circuit, a reading circuit and a writing circuit, and which serves to electrically isolate them. The memory cells are surrounded with and defined by the field oxide films 2 so that the pattern of one pair of memory cells may be repeated in the direction in which a bit line 15 to be described later extends (hereinbelow, called "row direction"). The insulator films 2 are indicated by dotted lines No insulator film 2 exists between the memory cells which adjoin each other in the row direction.

Numeral 3 designates an insulator film which is provided on the main surface portion of the semiconductor substrate 1 in at least an area for forming a storage capacitor, and which serves to constitute the dielectric of the storage capacitor. Charges, for example, holes are stored by the first electrode of the capacitor (hereinbelow, termed "first conductive plate") and the second electrode of the capacitor (hereinbelow, termed "second conductive plate") to be described later, with the insulator film 3 interposed therebetween.

Numeral 4 indicates a $p^+$-type semiconductor region serving as the second conductive plate, which is provided in the surface of the semiconductor substrate 1 in the area for forming the storage capacitor and which is provided integrally with the storage capacitors adjacent in the row direction. It serves to constitute the storage capacitor C and simultaneously to electrically isolate the storage capacitors adjacent in the row direction. The $p^+$-type semiconductor region 4 is disposed in order that the charges of holes or the charges of a depletion layer to be stored in the capacitor with the insulator film 3 interposed between this region 4 and the first conductive plate may be obtained as much as possible, or that a threshold voltage higher than a voltage which is applied to the first conductive plate to be described later may be provided in the vicinity of the surface of the semiconductor substrate 1. The semiconductor region 4 serves also to suppress the stretch of the depletion layer which is formed, upon the application of the voltage to the first conductive plate, so as to extend from the underlying surface portion of the semiconductor substrate 1 inwardly of this semiconductor substrate. The semiconductor region 4 may have an impurity concentration higher than that of the semiconductor substrate 1. The $p^+$-type semiconductor region 4 should desirably be disposed apart from an $n^+$-type semiconductor region to be described later. This is intended to avoid lowering in the breakdown voltage of a junction.

Shown at numeral 5 is a contact hole, which serves for electrically connecting the first conductive plate 7 to be described later and one semiconductor region 6 or 12 of a MISFET Q. The $n^+$-type semiconductor region 6 is formed in the surface of the semiconductor substrate 1 corresponding to the contact hole 5, and serves to electrically connect the first conductive plate to be described later and one semiconductor region of the MISFET Q.

The first conductive plate 7 is disposed on the insulator film 3 in the storage capacitor forming area independently for each memory cell, in such a manner that one end part thereof is electrically connected through the contact hole 5 and the semiconductor region 6 with one semiconductor region of the MISFET Q to be described later. The first conductive plate 7 serves to construct the storage capacitor C. It is indicated by a two-dot chain line. The storage capacitor C of the memory cell is principally composed of the first conductive plate 7, the semiconductor region 4 being the second conductive plate, and the insulator film 3.

Shown at numeral 8 is an insulator film which is formed so as to cover the first conductive plate 7, and which serves for electrically isolating the first conductive plate 7 and a word line 11 to be described later.

Numeral 9 indicates an insulator film which is disposed on the main surface portion of the semiconductor substrate 1 in the MISFET forming area, and which serves principally to construct a gate insulator film.

Shown at numeral 10 is a gate electrode which is formed on the predetermined insulator film 3, and which serves to construct the MISFET Q.

The word line (WL) 11 is disposed so as to be electrically connected with the gate electrodes 10 of the memory cells adjacent in the column direction and to extend in the column direction integrally with the gate electrodes 10. It serves for turning "on" and "off" (switching operation) MISFETs to be described later (hereinbelow, the direction in which the word line 11 extends shall be called the column direction).

Numerals 12 indicate the $n^+$-type semiconductor regions which are formed in the surface of the semiconductor substrate 1 on both the sides of the gate electrode 10, and which serve as a source region and a drain region to construct the MISFET Q. The switching transistor (MISFET) Q is composed of the gate electrode 10, the semiconductor region 12 and the insulator film 9. One of the semiconductor regions 12 is electrically connected with the semiconductor region 6, and is electrically connected with the first conductive plate 7 as stated before.

Shown at numeral 13 is an insulator film which is formed so as to cover the whole surface, and which serves for electrically isolating the gate electrode 10 as well as the word line (WL) 11 and a bit line 15 to be described later.

Numeral 14 denotes a contact hole which is provided by locally removing the insulator films 9 and 13 on the other semiconductor region 12, and which serves for electrically connecting the semiconductor region 12 and the bit line to be described below.

The bit line (BL) 15 is disposed in a manner to be electrically connected with the semiconductor region 12 through the contact hole 14 and to extend in the row direction. It serves to transmit a voltage serving as information.

Next, the principle of the DRAM according to the present invention having the above construction will be described.

Figure 28A:
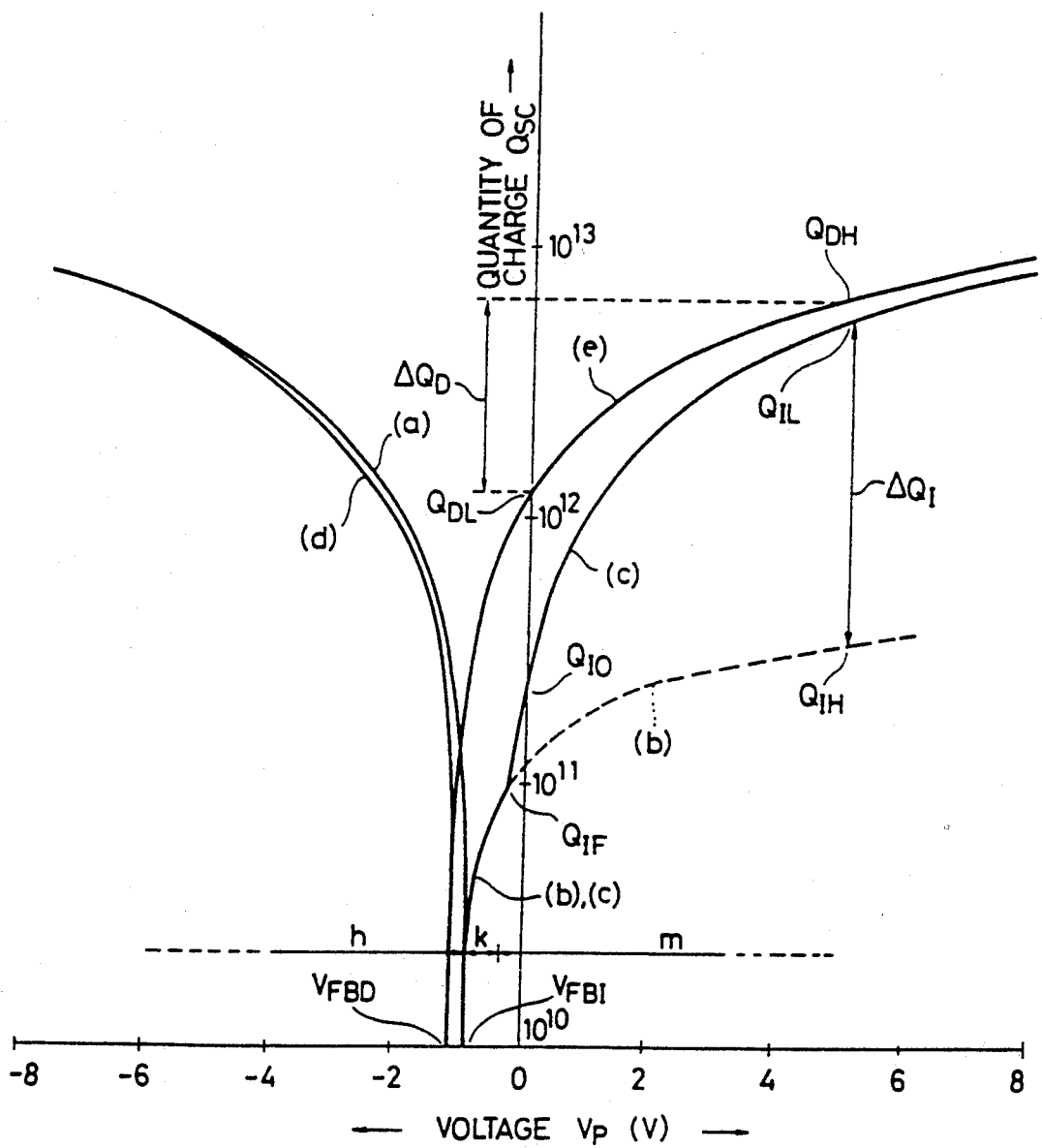
FIGS. 28A and 28B are graphs for elucidating the principle of the present invention.
Figure 28B:
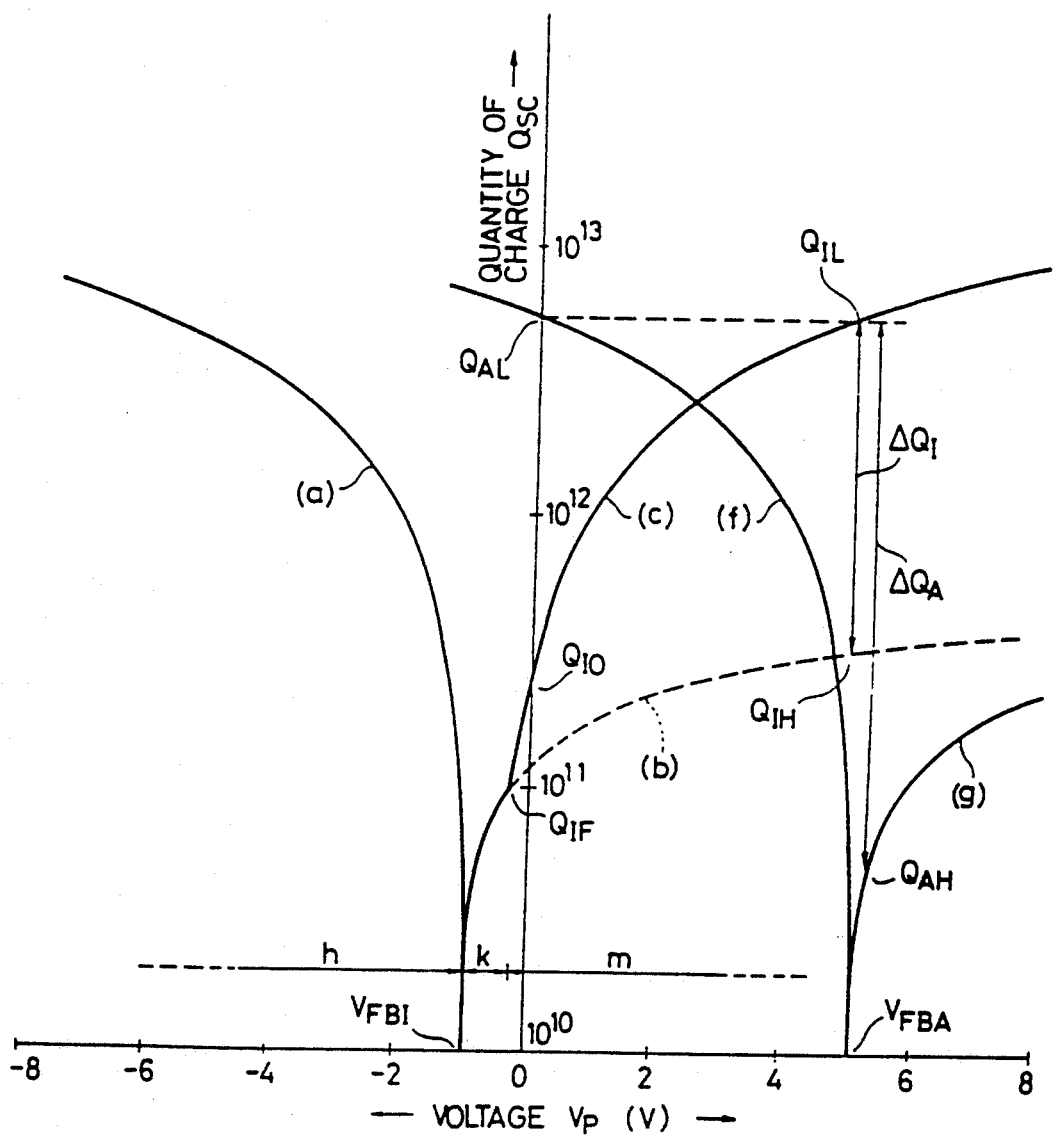

FIGS. 28A and 28B are graphs for elucidating the principle of the present invention. In these figures, the axis of abscissas represents the voltage value $V_p$ [V] which is applied across the two capacitor electrodes of the MIS type storage capacitor. The axis of ordinates represents the concentration of charges $Q_{SC}$ [/cm$^2$] per unit area, the charges being held in the surface of the lower p-type semiconductor region by the voltage applied across the capacitor electrodes. The axis of ordinates is taken by a logarithmic scale. Since, in FIGS. 3A and 3B, the p-type silicon semiconductor substrate is exemplified the charges to be induced in the surface are minus charges for the voltage across the capacitor electrodes, $V_p > V_{FB}$ and plus charges for $V_p < V_{FB}$. Here, $V_{FB}$ denotes a flatband voltage. The minus charges are electrons or acceptor impurities, while the plus charges are holes.

FIG. 28 illustrates a case where the holes which are space charges in the depletion layer are principally utilized as the charges which are stored as information. This corresponds to the case where the p+-type semiconductor region 4 shown in FIGS. 27A and 27B is included.

The principle of the prior-art DRAM will be first explained with reference to FIG. 28A.

Curves (a), (b) and (c) illustrate the relationships between the voltage $V_p$ and the charge concentration $Q_{SC}$ in the vicinity of the surface, in the prior-art DRAM. In the figure, h indicates an accumulation region in which an accumulation layer is formed, k a depletion region in which a depletion layer is formed, and m an inversion region in which an inversion layer is formed. In the figure, the curves (a), (b) and (c) indicate the numbers of electrons and acceptor impurities (the numbers of minus charges) n and the number of holes p in the case where the threshold voltage $(V_{th})$ of the vicinity of the semiconductor substrate surface in the storage capacitor is rendered about $-0.2$ V. The curve (a) indicates the number of holes p in the accumulation region h, which is expressed by $p \approx |C_{ox}/q\, (V_p - V_{FB})|$ ... (1). The curve (c) indicates the number of electrons and acceptor impurities n in the inversion region m, which is expressed by $n \approx C_{ox}/q\, (V_p - V_{th})$ ... (2). Here, $C_{ox}$ denotes the thickness of the insulator film which is the dielectric of the capacitor. The curve (b) indicates the number of acceptor impurities appearing in the state (deep depletion state) in which no inversion layer is formed despite the inversion region, the number being approximately expressed by $$Q_{SC} \propto \sqrt{V_p - V_{FB}}\ .$$

When, from the above, the surface charge concentration $Q_{SC}$ in the essential parts of the curves (a), (b) and (c) are evaluated, the surface minus charge concentration at the voltage $V_p = V_{th}$ becomes $Q_{IF} = 1 \times 10^{11}$ [/cm²], and the surface minus charge concentration at the voltage $V_p = 0$ becomes $Q_{I0} = 2.2 \times 10^{11}$ [/cm²].

In the storage capacitor of the prior-art DRAM memory cell, charges to serve as information have been the electrons in the inversion region m. Specifically, a fixed voltage, for example, a voltage of about 5 [V] is applied across the capacitor electrodes so as to bring the operating region into the inversion region m. Thereunder, the quantity of charges $Q_{IL}$ in the case of forming the inversion layer by externally supplying charges (the state of the curve (c)) and the quantity of charges $Q_{IH}$ in the case of the deep depletion state without externally supplying charges (the state of the curve (b)) are established in correspondence with information. By way of example, the quantity of charges $Q_{IL}$ corresponds to a signal "0" (namely, "L"), and the quantity of charges $Q_{IH}$ a signal "1" (namely, "H"). The signals are read out by utilizing the difference of the quantities of charges in he two statuses, $\Delta Q_I = Q_{IL} - Q_{IH} = 5.3 \times 10^{12}$ [/cm²].

In contrast, in the storage capacitor of the DRAM memory cell of the present invention, the charges to serve as information are space charges in, at least, a depletion region. That is, the DRAM of the present invention is characterized in that a inversion layer is not utilized.

Curves (d) and (e) illustrate the relationships between the voltage of the capacitor electrode (the voltage of the first conductive plate) $V_p$ and the charge concentration $Q_{SC}$ in the vicinity of the surface of the semiconductor region 4, in the DRAM of the present invention. The curve (d) approximates a curve which is obtained by moving the curve (a) in the minus direction of the voltage $V_p$ (leftward in the figure). The curve (e) indicates the quantity of space charges which appear in the depletion layer, not in the inversion state. The flatband voltage is set at $V_{FBD} = -1.2$ [V] from $V_{FBI} = -0.9$ [V] in the prior art. In order to increase the quantity of space charges in the depletion state by scarcely changing the flatband voltage, the p+-type semiconductor region 4 is formed. Concretely, the impurity concentration is raised to $1.5 \times 10^{19}$ [/cm³] from the impurity concentration of the p⁻-type substrate 1, which is $1.5 \times 10^{15}$ [/cm³]. Thus, the quantity of charges to be fetched is increased. The ranges of voltages to establish the accumulation region h, the depletion region k and the inversion region m change similarly.

As thus far described, the space charges of the depletion region are permitted to be effectively utilized by changing the relationship between $V_p$ and $Q_{SC}$. More specifically, when the first conductive plate 7 being the capacitor electrode has $V_p = 0$ [V] or 5 [V] applied thereto in correspondence with information, the quantity of charges as the information to be stored changes in accordance with the curve (e). That is, the inversion layer is not formed, and the deep depletion state is established. Thus, the quantity of charges $Q_{DL}$ at $V_p = 0$ [V] or the quantity of charges $Q_{DH}$ at $V_p = 5$ [V] is stored. By way of example, the quantity of charges $Q_{DL}$ corresponds to a signal "0", and the quantity of charges $Q_{DH}$ a signal "1". When the difference between the two quantities of charges, $\Delta Q_D = Q_{DH} - Q_{DL} = 5.6 \times 10^{12}$ [/cm²] is utilized, the information of 1 bit can be stored in the memory cell. This quantity of charges is equal or above that of the memory cell of the prior-art DRAM described before. In this manner, the sufficient quantity of charges is obtained without utilizing the inversion layer.

FIG. 28B illustrates a case where holes in the accumulation region are principally utilized as charges which are stored as information. This corresponds to a case of forming a very shallow p+-type ion implantation region, not to the case of forming the deep p+-type semiconductor region as in FIGS. 27A and 27B. That is, it exemplifies a case where boron ions are ion-implanted shallowly so as to function as surface charges apparently. The same parts as in FIG. 28A are indicated by identical symbols, and shall be omitted from the description.

Curves (f) and (g) are approximate to curves which are respectively obtained by shifting the curves (a) and (b) in the plus direction of the voltage $V_p$ (rightward in the figure) by fixed values. Concretely, the flatband voltage is raised to $V_{FBA} = +5.2$ [V] from $V_{FBI} = -0.9$ [V] in the prior art. To this end, surface charges are increased by implanting boron ions to be very shallow. The ranges of the voltages $V_p$ to establish the accumulation region h, the depletion region k and the inversion region m change similarly by the variation of the flatband voltage.

As thus far described, the holes in the accumulated state are permitted to be effectively utilized by changing the relationship between $V_p$ and $Q_{SC}$. More specifically, when the first conductive plate 7 being the capacitor electrode has $V_p = 0$ V or 5.2 [V] applied thereto in correspondence with information, the quantity of charges as the information to be stored changes in accordance with the curves (f) and (g). That is, the inversion layer is not utilized. The quantity of charges $Q_{AL}$ is stored at $V_p=0$ [V], and the quantity of charges $Q_{AH}$ at $V_p=5$ [V]. By way of example, the quantity of charges $Q_{AL}$ corresponds to a signal "0", and that $Q_{AH}$ a signal "1". The difference between the two quantities of charges, $\Delta Q_A = \Delta Q_{AL} - \Delta Q_{AH}$ is greater than the quantity of charges $\Delta Q_I$ in the prior art. In this manner, the sufficient quantity of charges is obtained without utilizing the inversion layer. The quantity of charges $Q_{AL}$ is held by the holes in the stored state, and the quantity of charges $Q_{AH}$ by the space charges in the depletion region. The charges of $Q_{AH}$ are opposite in sign to those of $Q_{AL}$, but this forms no inconvenience, and the difference of the quantities of charges is indicated by $\Delta Q_A$. In addition, at $V_p=5$ [V], the quantity of charges $Q_{AH}$ is held by the holes in the stored state located on the left side of $V_{FBA}$ in FIG. 28B. The curves (f) and (g) can be controlled by the dose of impurity ions. In this example, the dose is equal to that in the case of FIG. 28A.

Besides the principles illustrated in FIGS. 28A and 28B, a DRAM which uses the two in combination is also possible. It is possible to increase the quantity of surface charges by any method and to simultaneously increase the quantity of space charges in a depletion layer. Further, a case of employing an n-type semiconductor substrate is similar. In this case, charges to serve as information are space charges which consist of electrons in an accumulation layer or donors in a depleted state.

There will now be described a practicable method of manufacturing the eleventh embodiment of the present invention.

Figure 29A:
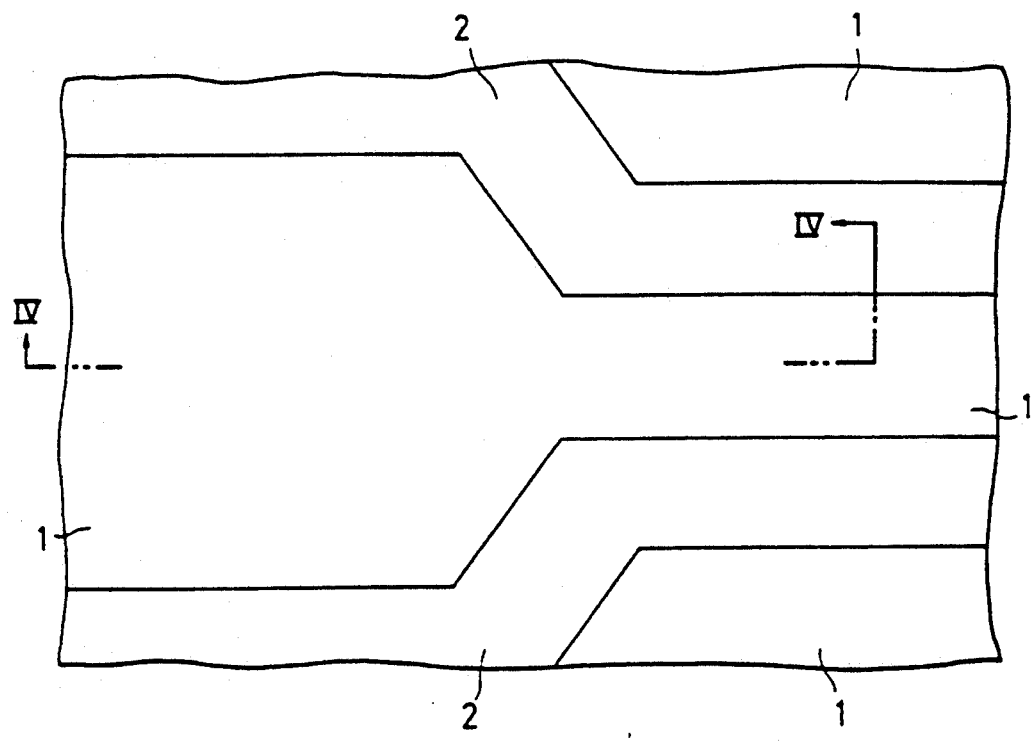
FIGS. 29A, 30A, 31A, 32A and 33A are plan views of the essential portions of the DRAM memory cell at the manufacturing steps of the DRAM shown in FIGS. 27A and 27B.
Figure 29B:
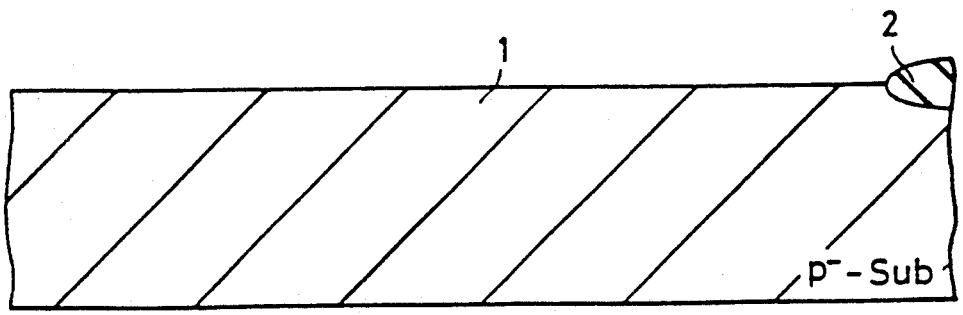
FIGS. 29B, 30B, 31B, 32B and 33B are sectional views taken along cutting-plane lines indicated in FIGS. 29A, 30A, 31A, 32A and 33A, respectively.

First, in order to construct a DRAM, a p⁻-type semiconductor substrate 1 made of single crystal silicon (Si) is prepared. As shown in FIGS. 29A and 29B, the semiconductor substrate 1 is partly covered with a thick field oxide film (SiO₂ film) 2 for electrically isolating predetermined memory cells which adjoin each other or semiconductor elements (not shown) which constitute a peripheral circuit, for example, an addressing circuit, a reading circuit or a writing circuit. The field oxide film 2 may be formed by the well-known technique in which the silicon substrate is thermally oxidized locally by employing a silicon nitride film as a mask. A p⁺-type region as a channel stopper may well be disposed under the field oxide film 2.

Figure 30A:
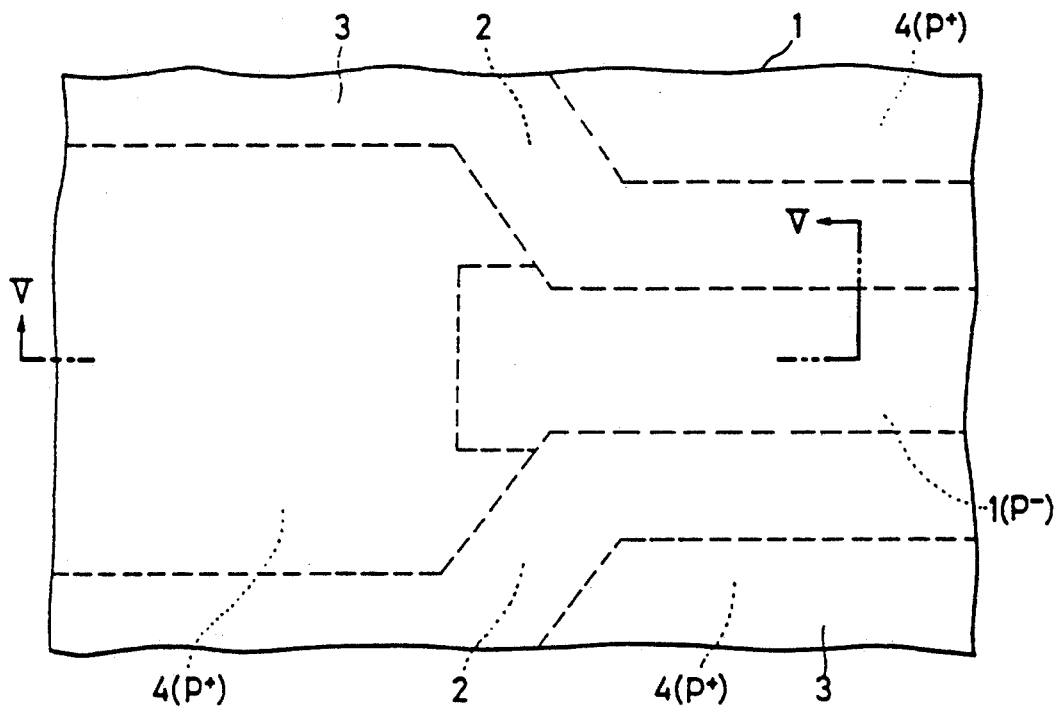
Figure 30B:
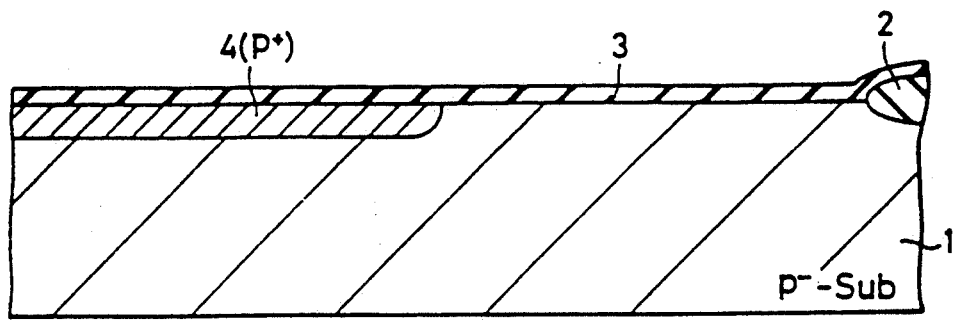

After the steps illustrated in FIGS. 29A and 29B, an insulator film 3 is formed on the whole surface in order to construct a storage capacitor. Used as the insulator film 3 is a silicon nitride (Si₃N₄) film which is formed by CVD, the relative dielectric constant of which is as high as 7-8 and which has a thickness of, e.g., approximately 150 [Å]. In order to relieve the stress between the silicon nitride film and the semiconductor substrate 1, a first silicon dioxide (SiO₂) film having a thickness of, e.g., approximately 80 [Å] is disposed under the silicon nitride film. In order to eliminate the pinholes of the silicon nitride film, a second silicon dioxide film having a thickness of, e.g., approximately 30 [Å] is disposed over the silicon nitride film. The first and second SiO₂ films may be formed by thermally oxidizing the surfaces of the semiconductor substrate and the silicon nitride film, respectively. Thereafter, as illustrated in FIGS. 30A and 30B, a p⁺-type semiconductor region 4 to serve as the second conductive plates of storage capacitors is locally formed in the vicinity of the surface of the semiconductor substrate 1 in an area for forming the storage capacitors of memory cells, in particular, unitarily with the storage capacitors adjacent in the row direction. As explained with reference to FIGS. 28A and 28B, the semiconductor region 4 is formed in the storage capacitor forming area for the purpose of producing a larger quantity of charges of holes or in a depletion layer, to be stored in the storage capacitor and to become a larger quantity of information, or for the purpose of attaining a threshold voltage ($V_{th}$) higher than an operating voltage which is applied to a first conductive plate to be described later. By way of example, boron ions on the order of $5 \times 10^{13}$ [atoms/cm²] are introduced as impurities by the ion implantation at an energy level of about 30 [keV]. In order to utilize the principle stated in conjunction with FIG. 28A, the introduced impurities may be subjected to the drive-in diffusion. The depth of the semiconductor region 4 in that case is rendered 0.3 [μm] or so. On the other hand, in case of utilizing the principle stated in conjunction with FIG. 28B, the drive-in diffusion is not carried out. In this case, it is desirable to still lower the ion implantation energy or to introduce the impurities into a very shallow position of the substrate through another insulator film. This measure is intended to cause the ion-implanted impurities to apparently function as surface charges.

Figure 30C:
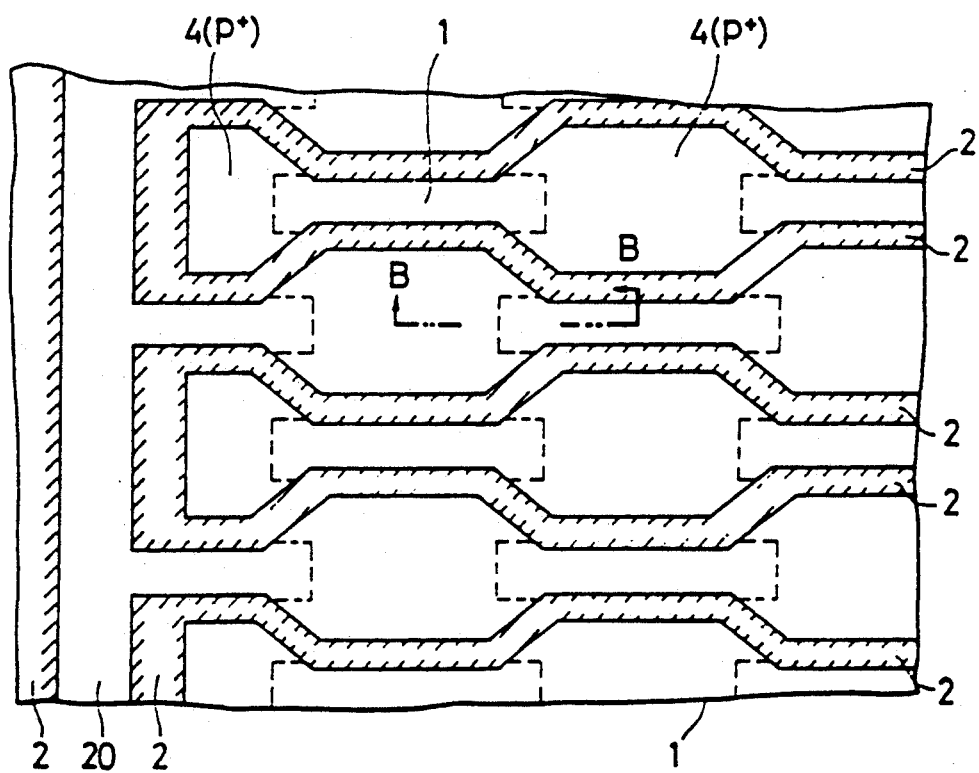
FIG. 30C is a plan view showing the manufacturing step of a memory cell array in the DRAM of FIGS. 27A and 27B.

FIG. 30C shows a part of memory cell arrays which are formed with the p⁺-type semiconductor regions 4. The field oxide film 2 is disposed for electrical isolation between the memory cells adjoining each other in the column direction, namely, in the direction in which a word line is to extend (vertical direction in the figure). The field oxide film 2 is not disposed between the memory cells adjoining each other in the row direction, namely, in the direction in which a bit line is to extend (lateral direction in the figure). In one memory cell array, the field oxide film 2 is disposed in the shape of a belt meandering from one end part to the other end part thereof. The semiconductor region 4 is disposed as a region which is common to the two capacitors adjoining each other in the row direction. A region 20 is a region which is disposed so as to surround the memory cell arrays and which serves as a guard ring. The region 20 has n-type impurities introduced thereinto later simultaneously with the formation of MISFETs Q, to be turned into an n⁺-type region. A section along a cutting-plane line B—B in the figure is shown in FIG. 30B. The insulator film 3 is omitted.

Figure 31A:
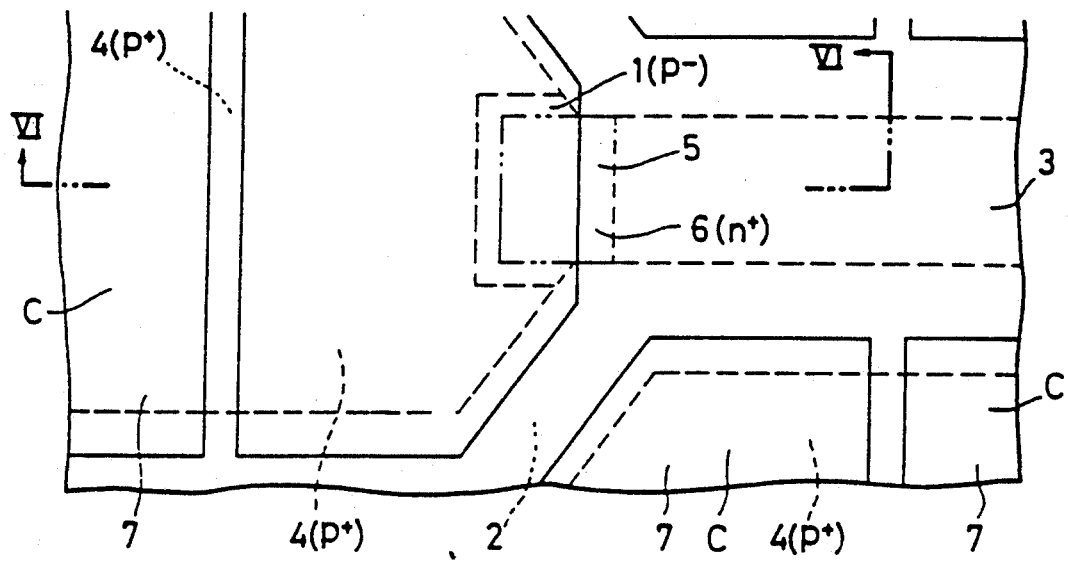
Figure 31B:
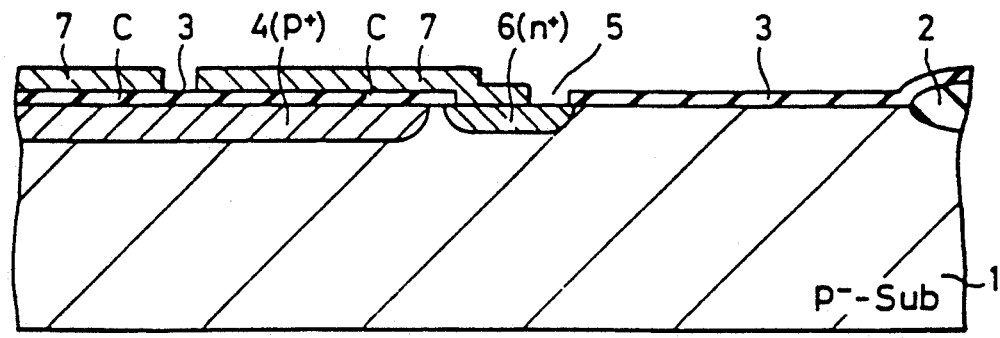

After the steps illustrated in FIGS. 30A and 30B, in the electrical connection part between the first conductive plate to be formed by a later step and one semiconductor region to constitute the MISFET, the insulator film 3 is locally removed to form a contact hole 5. The contact hole 5 is disposed in a manner to be spaced from the semiconductor region 4. Thereafter, a polycrystalline silicon film to become the first conductive plates is formed on the whole surface by the CVD. The polycrystalline silicon film may have a thickness of approximately 1500-3000 [Å] by way of example. In order to render the polycrystalline silicon film low in resistivity, the processing of diffusing phosphorus is performed, or arsenic (As) ions at a dose of approximately $5 \times 10^{14}$ [atoms/cm²] are ion-implanted at an energy level of approximately 30 [keV], whereupon a heat treatment is executed. By this treatment, the impurities are diffused into the surface part of the semiconductor substrate 1 corresponding to the contact hole 5, to form the n⁺- type semiconductor region 6 constituting the MISFET which is formed by the later step. The depth of the semiconductor region 6 becomes approximately 0.2 [μm]. Thereafter, the polycrystalline silicon film is locally patterned, to form the first conductive plate 7 which is electrically connected with the semiconductor region 6 as shown in FIGS. 31A and 31B. Thus, the storage capacitor C of the memory cell is formed.

Figure 32A:
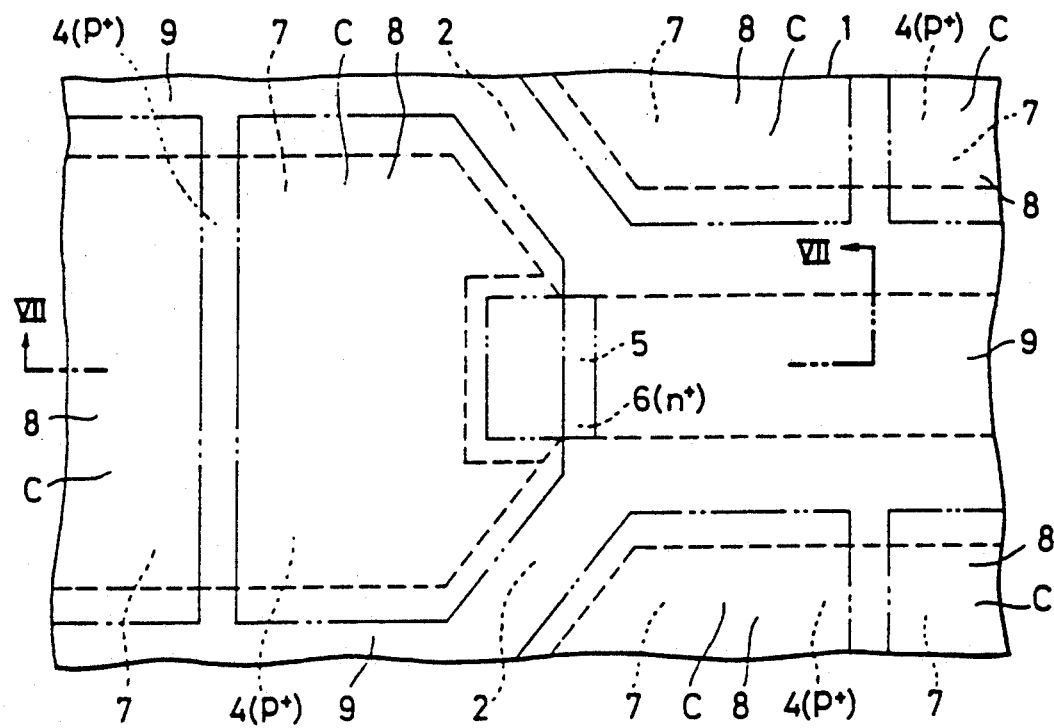
Figure 32B:
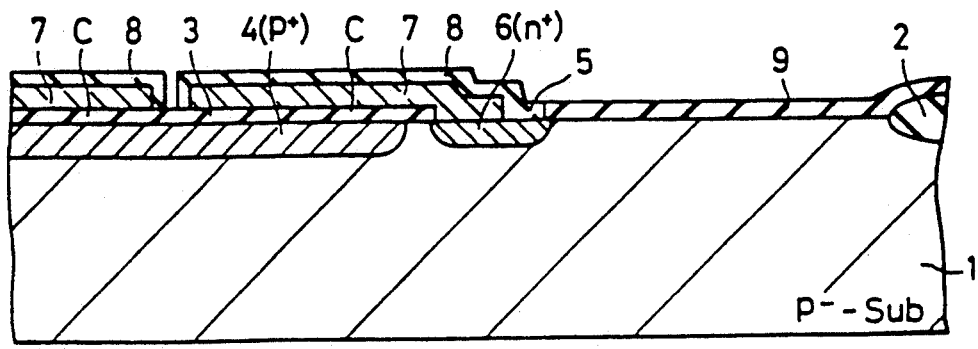

After the steps illustrated in FIGS. 31A and 31B, using principally the silicon nitride film of the exposed insulator film 3 as a mask against a heat treatment, an insulator film ($SiO_2$ film) 8 which covers the first conductive plate 7 is formed by the thermal oxidation. This $SiO_2$ film 8 may have its thickness rendered, for example, approximately 2000-3000 [Å] so that the first conductive plate 7 and the word line to be formed by a later step can be electrically isolated. Thereafter, the exposed insulator film 3 is locally removed, whereupon as illustrated in FIGS. 32A and 32B, an insulator film ($SiO_2$ film) 9 serving principally to construct a gate insulator film is formed in the removed part of the insulator film 3 by the thermal oxidation of the exposed surface of the semiconductor substrate 1. This insulator film 9 has a thickness of, for example, approximately 200 [Å].

Figure 33A:
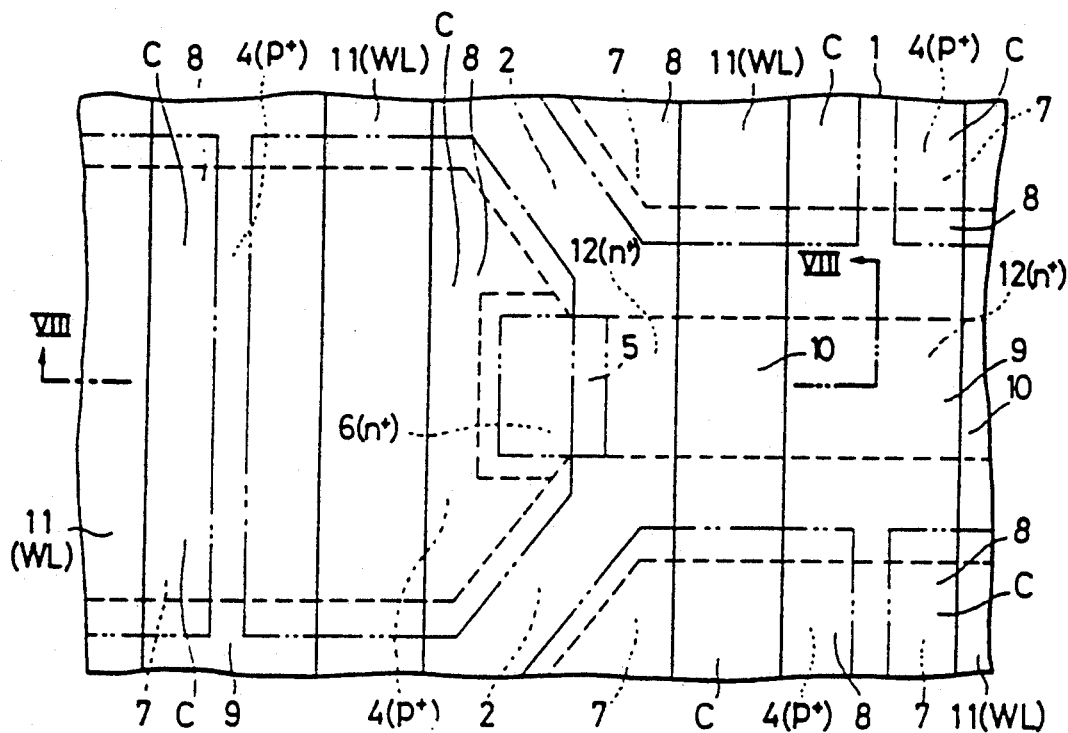
Figure 33B:
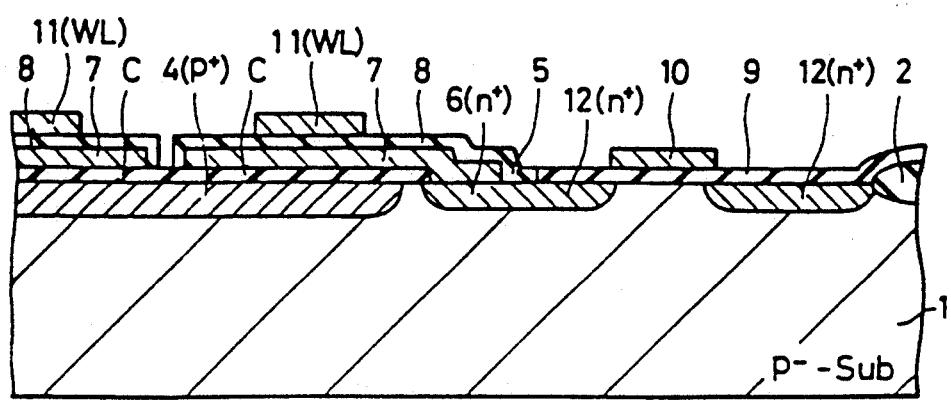

After the steps illustrated in FIGS. 32A and 32B, a polycrystalline silicon film is formed on the whole surface in order to form the gate electrodes of the MISFETs, the word lines, and the semiconductor elements of peripheral circuits. This polycrystalline silicone film is subjected to the same treatment as in the foregoing, to have its resistivity lowered. Thereafter, the polycrystalline silicon film is locally patterned, to form the gate electrode 10, the word line (WL) 11 and the gate electrode (not shown) of the MISFET of the peripheral circuit. The gate electrode 10 is electrically connected with the gate electrode 10 of the other of the memory cells adjacent in the column direction, and it constructs the word line 11 extending in the column direction. As the gate electrode 10 or the word line (WL) 11, it is also allowed to use, for example, a layer of a refractory metal such as molybdenum (Mo), tungsten (W) or titanium (Ti); a layer of any silicide which is the compound of the refractory metal and silicon; or a double-layer structure which consists of a polycrystalline silicon layer and a refractory metal layer or a refractory metal silicide layer overlying the former. Thereafter, in the MISFET forming area, using the gate electrode 10 as a mask against impurity introduction, impurities of the n+-type are introduced in self-alignment fashion in order to form the source region and drain region of the MISFET in the vicinities of the surface of the semiconductor substrate 1 through the insulator film 9 intervening between them and the gate electrode. The introduced impurities are subjected to the drive-in diffusion, whereby the n+-type semiconductor regions 12 to serve as the source region and the drain region are formed as shown in FIGS. 33A and 33B. The semiconductor region 6 is electrically connected with one of the semiconductor regions 12. Thus, the switching transistor (MISFET) Q of the memory cell is formed. In addition, arsenic ion impurities may be used as the n+-type impurities and may be introduced by the ion implantation permitting them to permeate through the insulator film 9. The depth of the n+-type region is as small as 0.2 μm.

After the steps illustrated in FIGS. 33A and 33B, an insulator film 13 is formed on the whole surface for the purpose of electrically isolating the gate electrode 10 as well as the word line (WL) 11 an-d the bit line to be formed by a later step. As this insulator film 13, a phosphosilicate glass (PSG) film may be used which relieves the undulations of the surface and which can trap sodium (Na) ions affecting the electrical performance of the DRAM. Subsequently, in order to connect the other semiconductor region 12 and the bit line to be formed by the later step, the insulator films 9 and 13 on this semiconductor region 12 are locally removed to form a contact hole 14. The bit line (BL) 15 is formed which is electrically connected with the semiconductor region 12 through the contact hole 14 and which extends in the row direction. This bit line (BL) 15 may be formed of, e.g., aluminum (Al). The resulting state is illustrated in FIGS. 27A and 27B. Thereafter, a PSG film and a silicon nitride film by the plasma CVD are formed as a final passivation film.

The DRAM of the present embodiment is finished up by these series of manufacturing steps.

Next, the concrete operation of the eleventh embodiment of the present invention will be described.

The operation of the present embodiment will be explained as to the operation of a predetermined memory cell with reference to FIGS. 27A and 27B.

First, a case of writing information into the memory cell will be explained. A voltage is selectively applied to the gate electrode 10 constituting the MISFET Q of the memory cell, to turn "on" this MISFET Q. A voltage to serve as the information is applied to the bit line (BL) 15 which is electrically connected with the semiconductor region 12 through the contact hole 14. Thus, the voltage of the bit line (BL) 15 corresponding to the information is applied to the first conductive plate 7 through the MISFET Q. The semiconductor region 4 serving as the second conductive plate is electrically connected with the semiconductor substrate 1, and is held at the fixed potential $V_{SS}$ as predetermined. If there is a potential difference between the potential of the second conductive plate and the voltage as the information applied to the first conductive plate 7, charges to serve as information are stored in the insulator film 3 which is the intervening portion between the conductive plates, that is, they are written into the storage capacitor C of the memory cell as is usually said.

In case of holding the information in the memory cell, the MISFET Q may be turned "off" in the state in which the information has been written into the storage capacitor C of the memory cell.

Besides, in case of reading out the information of the memory cell, an operation reverse to the writing operation may be performed.

According to the present embodiment, in a DRAM wherein a series circuit consisting of a storage capacitor and a MISFET is employed as a memory cell, a first conductive plate which constitutes the storage capacitor is formed on a semiconductor substrate and is disposed so as to be electrically connected with on semiconductor region of the MISFET, and a semiconductor region which has an impurity concentration higher than that of the semiconductor substrate is disposed as a second conductive plate which constitutes the storage capacitor through an insulator film, whereby charges serving as information can be stored in the storage capacitor by holes. Thus, electrons stored in an inversion layer need not be used as the charges serving as the information, so that the influence of unnecessary minority carriers attributed to α-particles or the injection thereof from a peripheral circuit portion can be prevented.

Moreover, since the storage capacitor need not take into consideration the degree of influence by the unnecessary minority carriers attributed to the α-particles or the injection from the peripheral circuit portion, the occupying area thereof can be reduced. This makes it possible to integrate the DRAM at a higher packing density.

Further, the storage capacitor can be electrically isolated from another storage capacitor adjoining it in a row direction, by the semiconductor region being the second conductive plate, so that a field oxide film of large occupying area becomes unnecessary to realize the integration of the DRAM at a higher packing density.

A twelfth embodiment of the present invention will be described with reference to FIG. 34A to FIG. 37B.

Figure 34A:
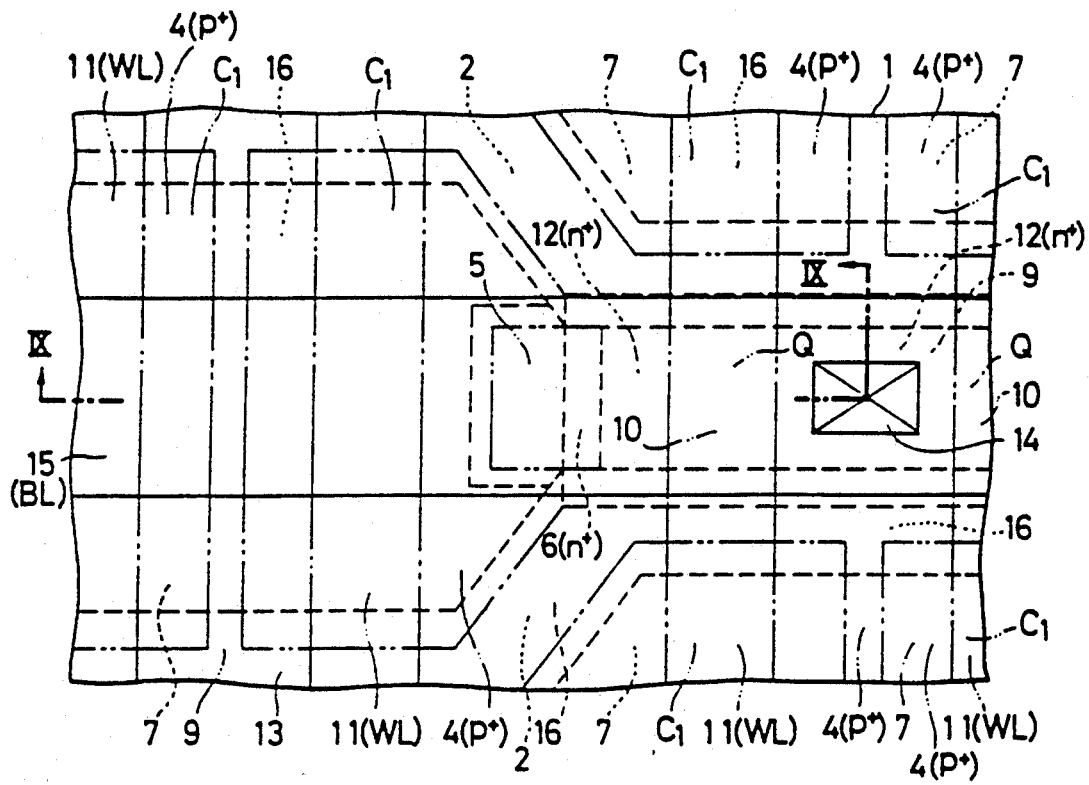
FIG. 34A is a plan view of the essential portions of a memory cell in a DRAM which is a twelfth embodiment of the present invention.
Figure 34B:
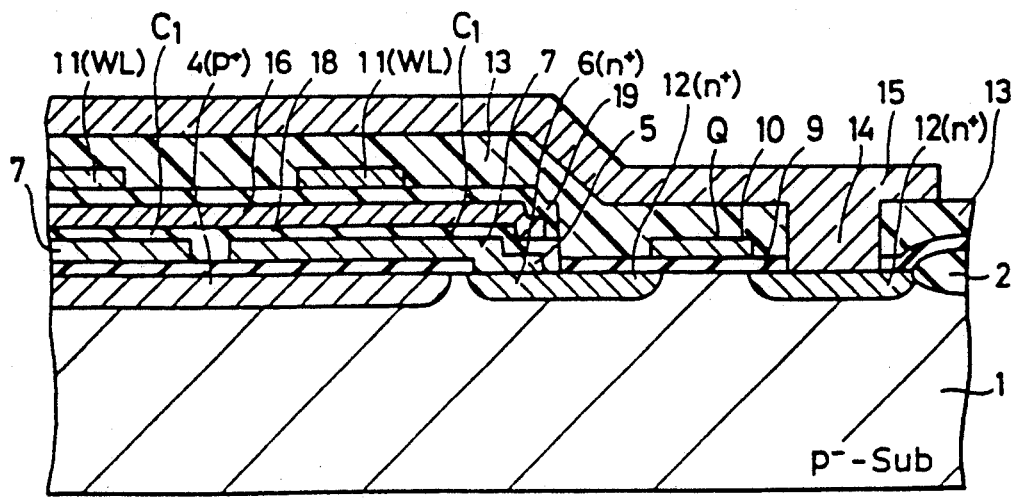
FIG. 34B is a sectional view taken along line IX—IX in FIG. 34A.

FIG. 34A is a plan view of the essential portions of a DRAM memory cell for elucidating the structure of the present embodiment, while FIG. 34B is a sectional view taken along a cutting-plane line IX—IX in FIG. 34A. In all the figures of the present embodiment, parts having the same functions as in the eleventh embodiment are assigned the same symbols, and they shall not be repeatedly explained.

In FIGS. 34A and 34B, numeral 18 designates an insulator film which is formed so as to cover at least a first conductive plate 7 and which serves to construct a storage capacitor. The insulator film 18 forms the capacitor along with the first conductive plate 7 and a third electrode to be described later (hereinbelow, termed the "third conductive plate"), and is adapted to store charges serving as information. The insulator film 18 is also adapted to electrically isolate the first conductive plates 7 of adjacent memory cells. Numeral 16 designates the third conductive plate which is disposed on the insulator film 18 outside an area for forming a MISFET Q, and which serves to construct the storage capacitor. A fixed potential, for example, the same potential as that of a substrate 1 is applied to the third conductive plate 16. The third conductive plate 16 is provided as an electrode common to the whole of one memory cell array in which a plurality of memory cells are arranged in the shape of a matrix. The third conductive plate 16 is windowed in a part for disposing the MISFET Q. The storage capacitor of the memory cell is principally constructed of a parallel circuit connection consisting of a capacitance C which is composed of the first conductive plate 7, a semiconductor region 4 being a second conductive plate and an insulator film 3, and a capacitance $C_1$ which is composed of the first conductive plate 7, the third conductive plate 16 and the insulator film 18. Numeral 19 designates an insulator film which is disposed so as to cover the third conductive plate 16, and which serves to electrically isolate the third conductive plate 16 and a word line (WL) 11. Semiconductor regions 4 and 6 are disposed so as to be spaced from each other.

Figure 35:
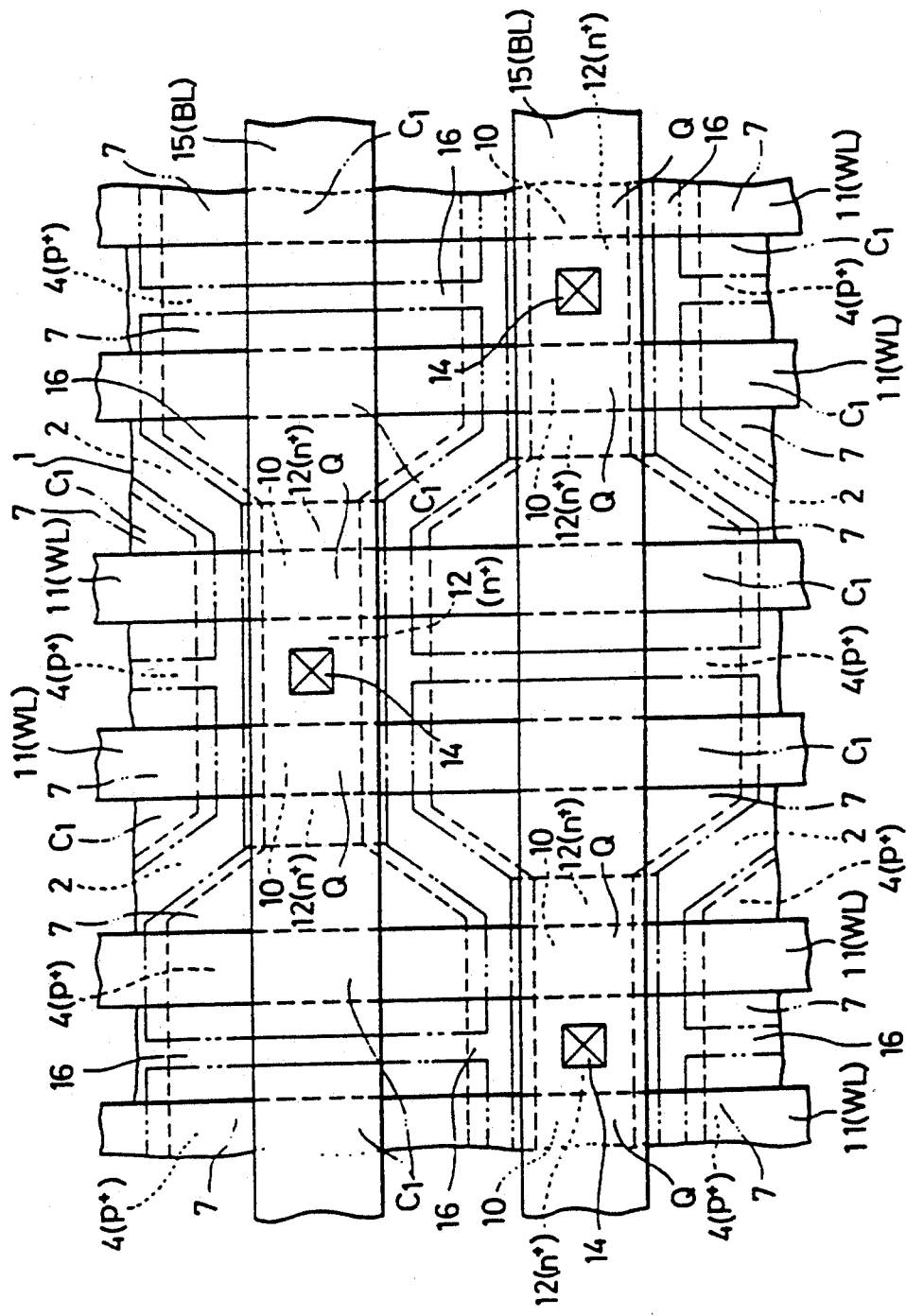
FIG. 35 is a plan view of the essential portions of a schematic memory cell array in the DRAM shown in FIGS. 34A and 34B.

When practicable memory cell arrays are constructed by the use of such memory cells shown in FIGS. 34A and 34B, they become as illustrated in FIG. 35.

FIG. 35 is a plan view of the essential portions of the schematic memory cell arrays for explaining the twelfth embodiment of the present invention. In FIG. 35, in order to make the drawing easy to see, insulator films to be disposed between respective conductive layers, contact holes 5 and the semiconductor regions 4 are omitted from the illustration. The shapes and positional relations of the contact holes 5, the semiconductor regions 4 and other regions will be apparent from FIG. 34A.

Excepting the third conductive plate 16, the twelfth embodiment is quite the same as the eleventh embodiment.

There will now be described a practicable method of manufacturing the twelfth embodiment.

Figure 36A:
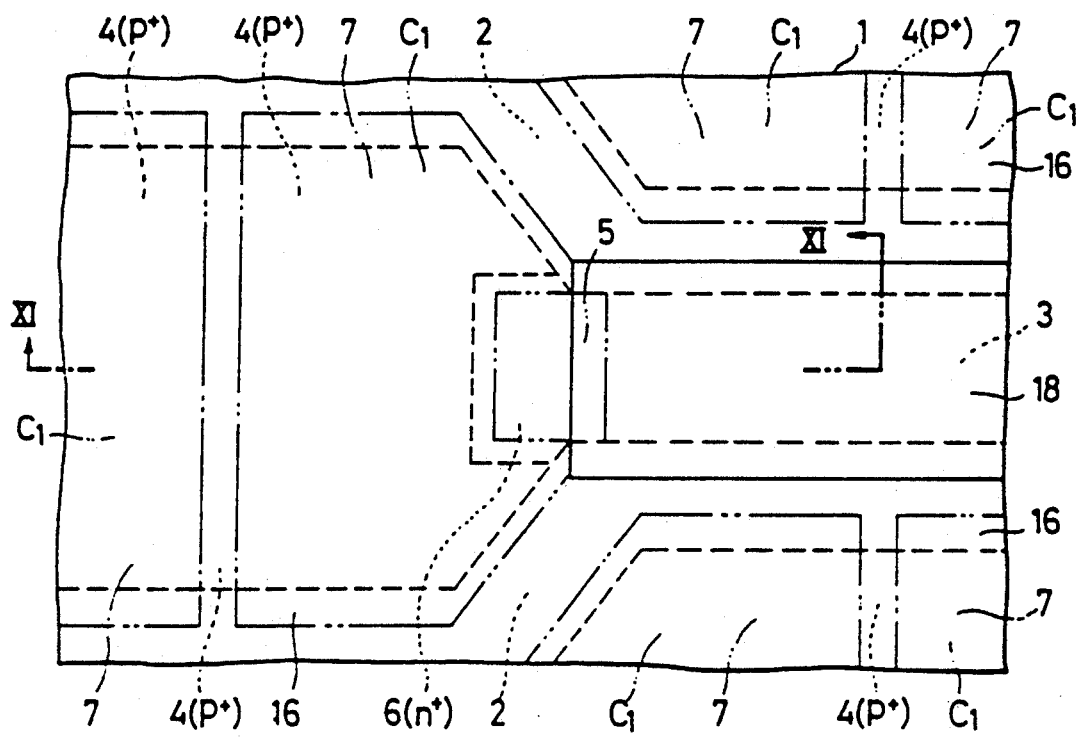
FIGS. 36A and 37A are plan views of the essential portions of the DRAM memory cell at the manufacturing steps of the DRAM shown in FIGS. 34A and 34B.
Figure 36B:
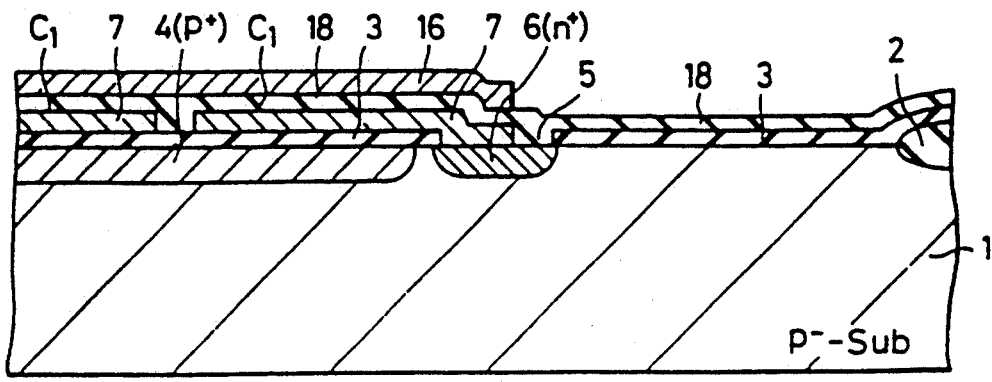
FIGS. 36B and 37B are sectional views taken along cutting-plane lines indicated in FIGS. 36A and 37A, respectively.
Figure 37A:
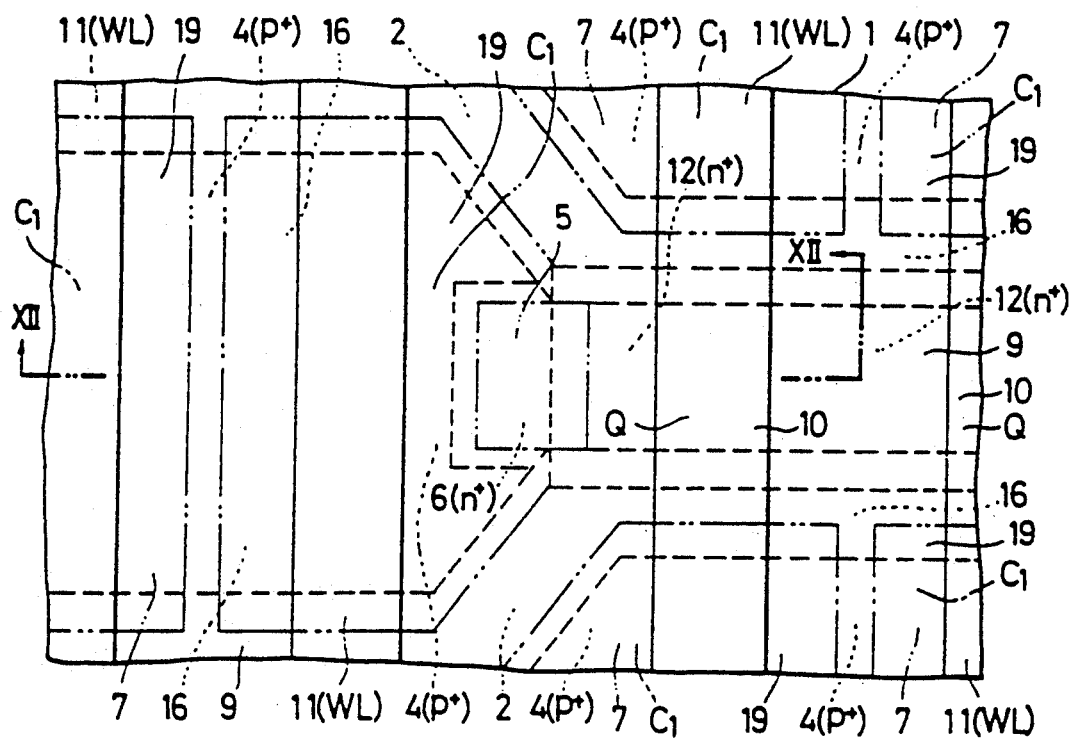
Figure 37B:
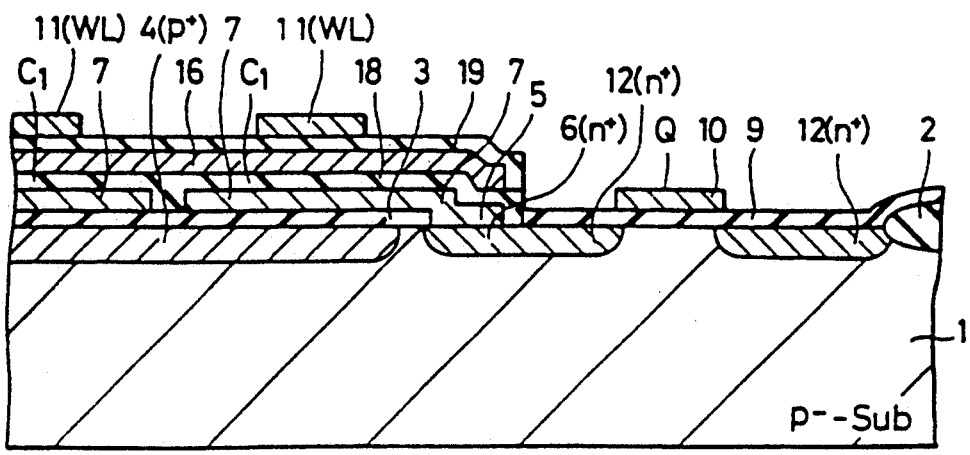

FIGS. 36A and 37A are plan views of the essential portions of a DRAM memory cell at respective manufacturing steps for explaining the manufacturing method of the present embodiment, while FIGS. 36B and 37B are sectional views along cutting-plane lines in FIGS. 36A and 37A, respectively.

After the steps of the eleventh embodiment illustrated in FIGS. 31A and 31B, an insulator film 18 is formed on the whole surface in order to construct a storage capacitor. Likewise to the foregoing insulator film 3, this insulator film 18 may be constructed of a silicon dioxide film, a silicon nitride film and another silicon dioxide film. Thereafter, a polycrystalline silicon film to become a third conductive plate is formed on the whole surface by the CVD. The polycrystalline silicon film may have a thickness of, for example, approximately 3000 [Å]. In order to render this polycrystalline silicon film low in resistivity, phosphorus or arsenic is introduced by the same method as in the foregoing. Subsequently, the polycrystalline silicon film is locally patterned, to form the third conductive plate 16 common to a plurality of memory cells outside a MISFET forming area as shown in FIGS. 36A and 36B. Thus, the storage capacitor $C_1$ of the memory cell is formed.

After the steps illustrated in FIGS. 36A and 36B, using principally the silicon nitride film of the exposed insulator film 18 as a mask against a heat treatment, the polycrystalline silicon layer being the third conductive plate is thermally oxidized, thereby to form an insulator film ($SiO_2$ film) 19 which covers the third conductive plate 16. Thereafter, the exposed insulator film 18 and the underlying insulator film 3 are locally removed. As in the eleventh embodiment, a gate insulator film 9 is formed in the removed area as shown in FIGS. 37A and 37B. Further, a gate electrode 10, a word line (WL) 11 and semiconductor regions 12 are formed.

After the steps illustrated in FIGS. 37A and 37B, an insulator film 13, a contact hole 14 and a bit line (BL) 15 are formed as in the eleventh embodiment. Then the resultant structure becomes as shown in FIGS. 34A and 34B. Thereafter, a PSG film and a silicon nitride film by the plasma CVD are formed as a final passivation film.

The DRAM of the present embodiment is finished up by these series of manufacturing steps.

Next, the concrete operation of the twelfth embodiment will be described.

The operation of the present embodiment will be explained as to the operation of a predetermined memory cell with reference to FIGS. 34A and 34B.

First, a case of writing information into the memory cell will be explained. A voltage is selectively applied to the gate electrode 10 constituting the MISFET Q of the memory cell, to turn "on" this MISFET Q. A voltage corresponding to the information is applied to the bit line (BL) 15 which is electrically connected with the semiconductor region 12 through the contact hole 14. Thus, the voltage of the bit line (BL) 15 to serve as the information is applied to the first conductive plate 7 through the MISFET Q. The semiconductor region 4 serving as the second conductive plate is electrically connected with the semiconductor substrate 1, and is held at the fixed potential $V_{SS}$ as predetermined. Also the third conductive plate 16 is held at the fixed potential $V_{SS}$ by way of example. If there is a potential difference between the potentials of the second conductive plate and the third conductive plate 16 equal to each other and the voltage as the information applied to the first conductive plate 7, charges to serve as information are stored in the insulator film 3 and the insulator film 18 which are the intervening portions between the conductive plates, that is, they are written into the storage capacitor C and $C_1$ of the memory cell as is usually said.

In case of holding the information in the memory cell, the MISFET Q may be turned "off" in the state in which the information has been written into the storage capacitor C and $C_1$ of the memory cell.

Besides, in case of reading out the information of the memory cell, an operation reverse to the writing operation may be performed.

According to the present embodiment, effects similar to those of the eleventh embodiment are achieved.

Furthermore, by disposing a third conductive plate on a first conductive plate through an insulator film the quantity of charges to be stored by the first conductive plate and the second conductive plate and the quantity of charges by the first conductive plate and the third conductive plate can be stored in a storage capacitor. Thus, when the twelfth embodiment is compared with the eleventh embodiment, the quantity of charge storage of the storage capacitor per unit area can be increased to approximately double, and the integration of the DRAM at a higher packing density can be realized.

By the way, when the potential of a substrate or a $p^+$-type semiconductor region 4 is a substrate bias potential $V_{BB}=-3.0$ V and the potential of a polycrystalline silicon layer 16 is the ground potential $V_{SS}=0$ V, the quantity of charge storage becomes about 1.5 times that in the absence of the polycrystalline silicon layer 16.

In addition, by disposing the third conductive plate 16 of the fixed potential on the first conductive plate, a word line WL to which a control voltage of fluctuating magnitude is applied can be prevented from affecting the first conductive plate 7, so that the quantity of charges to be stored in the storage capacitor can be stabilized. Thus, the writing and reading operations of the DRAM can be stabilized, and the reliability of the DRAM can be enhanced.

A thirteenth embodiment is an example wherein, in the twelfth embodiment, the thick field oxide film 2 which isolates the memory cells is not formed at all. The plane and sectional shapes of the thirteenth embodiment become identical to those of FIGS. 34A and 34B and FIG. 35 from which the field oxide film 2 has been omitted For this reason, the plane and sectional shapes of the DRAM of the thirteenth embodiment shall not be explained, and a practicable method of manufacturing the embodiment will be described, along with the brief description of the structure thereof.

Figure 38:
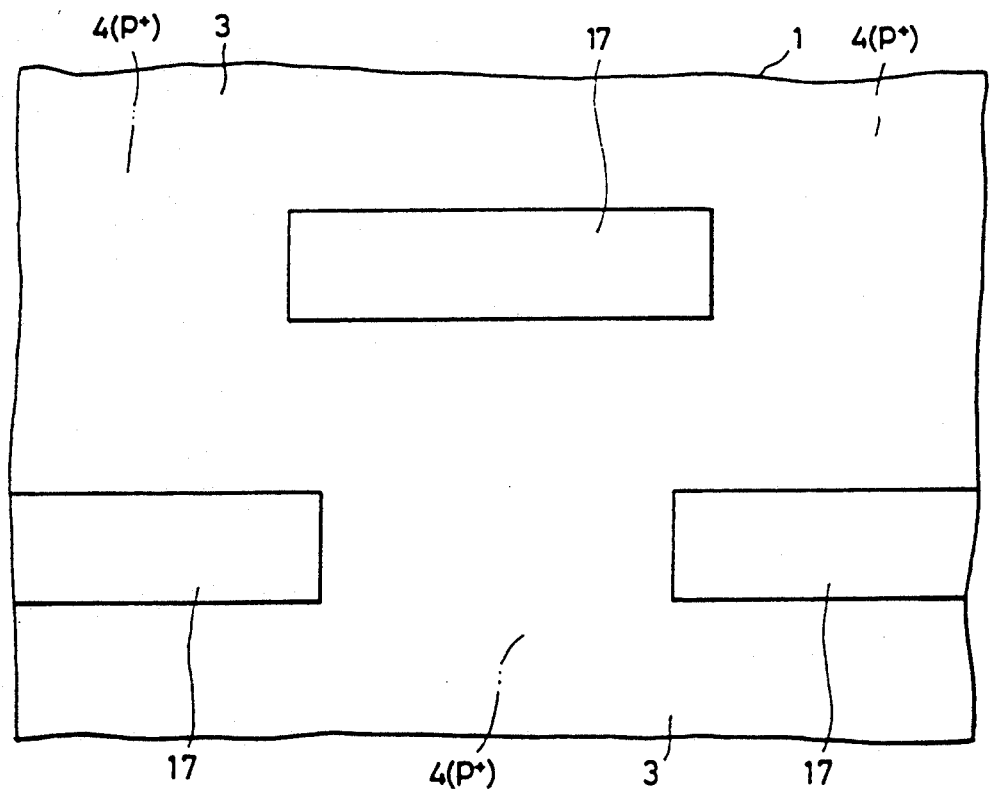
FIGS. 38, 39 and 40 are plan views of the essential portions of a memory cell array at the manufacturing steps of a DRAM which is a thirteenth embodiment of the present invention.
Figure 39:
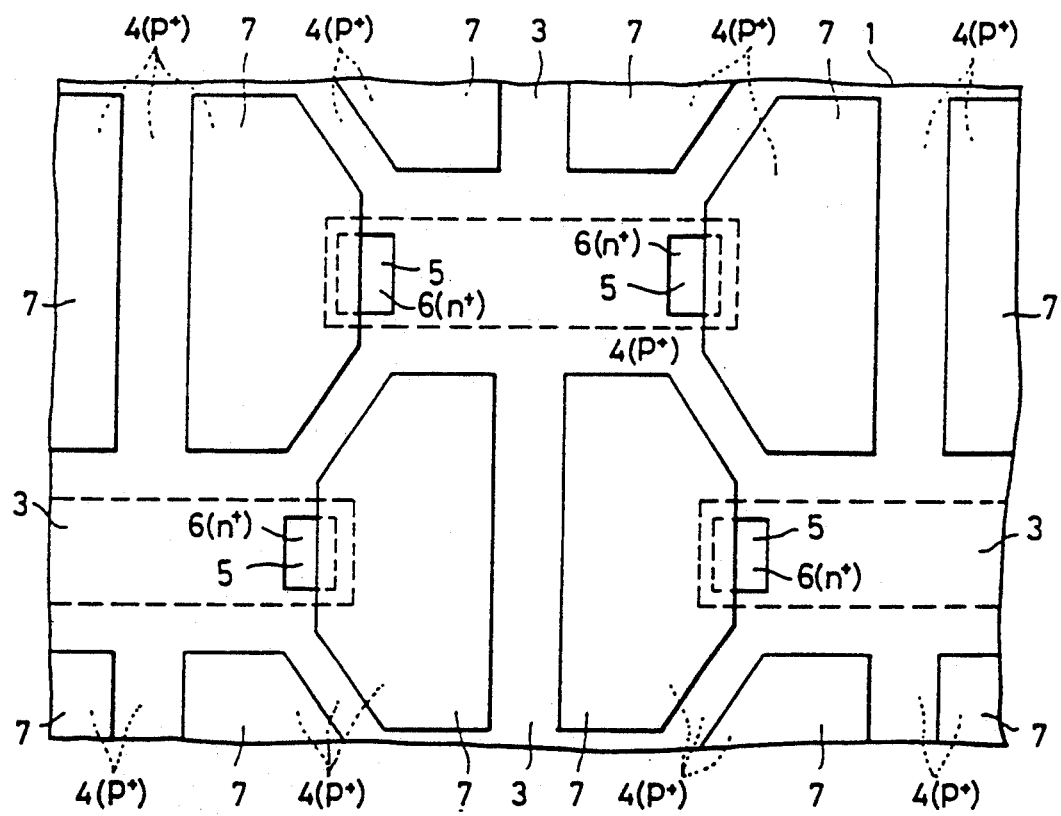
Figure 40:
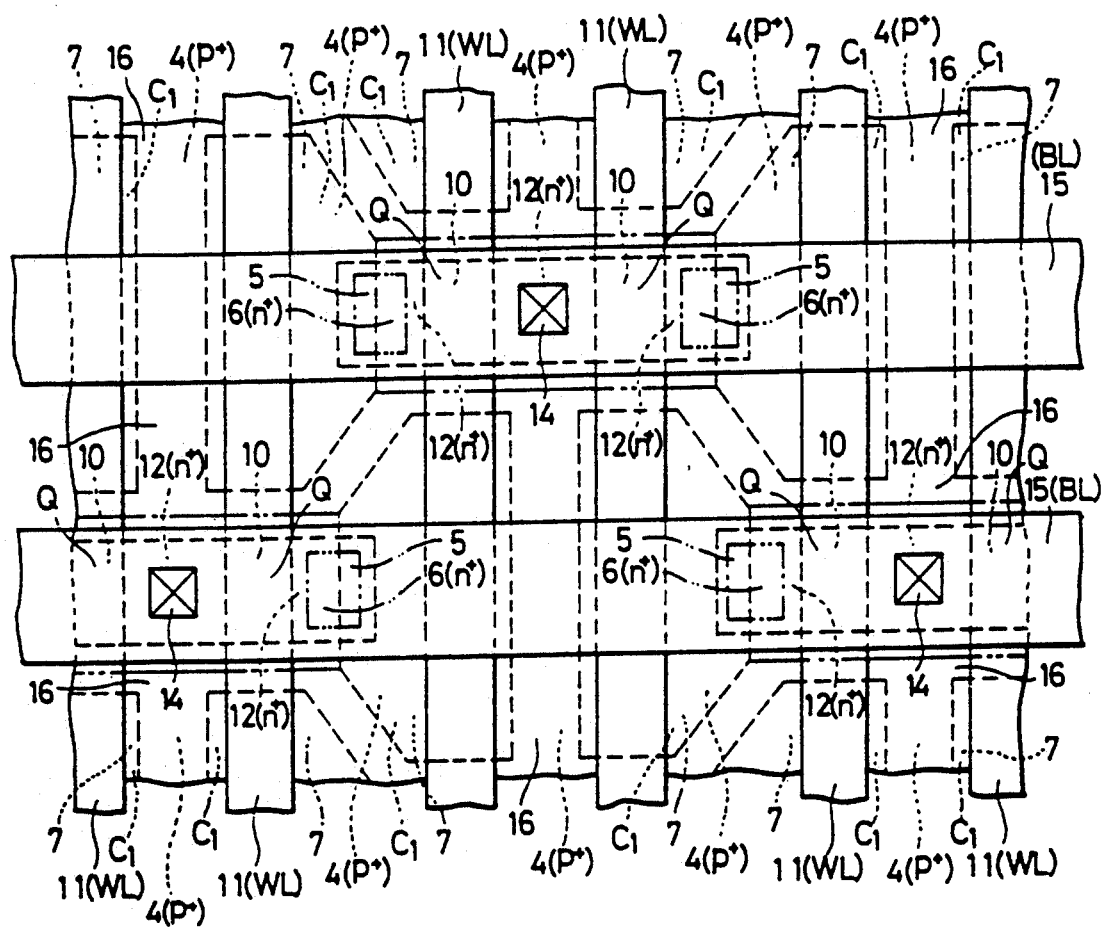

FIGS. 38, 39 and 40 are plan views of the essential portions of memory cell arrays at various manufacturing steps for explaining the manufacturing method of the present embodiment. Throughout the drawings of the present embodiment, parts having the same functions as in the eleventh and twelfth embodiments are assigned the same symbols, and they shall not be repeatedly described.

First, excepting a memory cell array portion, a semiconductor substrate 1 is partly covered with a field oxide film in order to electrically isolate the semiconductor elements (not shown) of a peripheral circuit. As in the eleventh and twelfth embodiments, an insulator film 3 is formed on the whole surface. Thereafter, a mask 17 for impurity introduction made of, e.g., a silicon nitride film is formed selectively on the insulator film 3 in an area in which the MISFET of a switching transistor is to be formed by a later step. An area outside the memory cell array, namely, an area to ,form the peripheral circuit therein is covered with the mask 17. Subsequently, using the mask 17, p-type impurities are introduced into the part of the semiconductor substrate 1 other than the mask 17, to form a $p^+$-type semiconductor region 4 which becomes the second conductive plate of a storage capacitor and which serves to electrically isolate memory cells adjacent in row and column directions, as illustrated in FIG. 38. That is, the $p^+$-type semiconductor region 4 is formed on the whole surface of the memory cell array except for the area in which the MISFETs are to be disposed.

After the steps illustrated in FIG. 38, the mask 17 is removed, whereupon in the electrical connection part between a first conductive plate to be formed by a later step and one semiconductor region to constitute the MISFET, the insulator film 3 is locally removed to form a contact hole 5. The contact hole 5 and the semiconductor region 4 are disposed so as to be spaced. Thereafter, a polycrystalline silicon film to become the first conductive plate is formed on the whole surface, and it is implanted with As ions to lower its resistivity and simultaneously to locally form an $n^+$-type semiconductor region 6. Subsequently, the polycrystalline silicon film is locally patterned to form the first conductive plate 7 as shown in FIG. 14.

After the steps illustrated in FIG. 39, as in the twelfth embodiment, an insulator film 18 and a third conductive plate 16 are formed thereby to construct a storage capacitor $C_1$. After forming insulator films 19 and 9, a gate electrode 10 and a word line (WL) 11 are formed. By forming semiconductor regions 12, the MISFET Q is constructed. After forming an insulator film 13 and a contact hole 14, a bit line (BL) 15 is formed as shown in FIG. 40. In FIG. 40, insulator films to be provided between respective conductive layers are omitted in order to make the drawing easy to see.

As in the eleventh embodiment, the MISFETs Q may well be formed to finish up the DRAM, without forming the storage capacitors $C_1$.

The DRAM of the present embodiment is finished up by these series of manufacturing steps. Thereafter, a final passivation film is formed as in the eleventh or twelfth embodiment.

According to the present embodiment, effects similar to those of the twelfth embodiment are achieved.

Furthermore, the memory cell of the DRAM can be electrically isolated from other memory cells adjoining it in row and column directions, by a semiconductor region being a second conductive plate which constitutes a storage capacitor. Accordingly, a field oxide film in a memory cell array becomes unnecessary, and the integration of the DRAM at a higher packing density can be realized.

A fourteenth embodiment will be described with reference to FIGS. 41 to 48. The fourteenth embodiment is an example wherein a trench (groove) is added to the eleventh embodiment in order to increase the quantity of charges which can be stored in a capacitor. Throughout the drawings of the present embodiment, parts having the same functions as in the eleventh embodiment are assigned the same symbols, and they shall not be repeatedly explained.

Figure 41A:
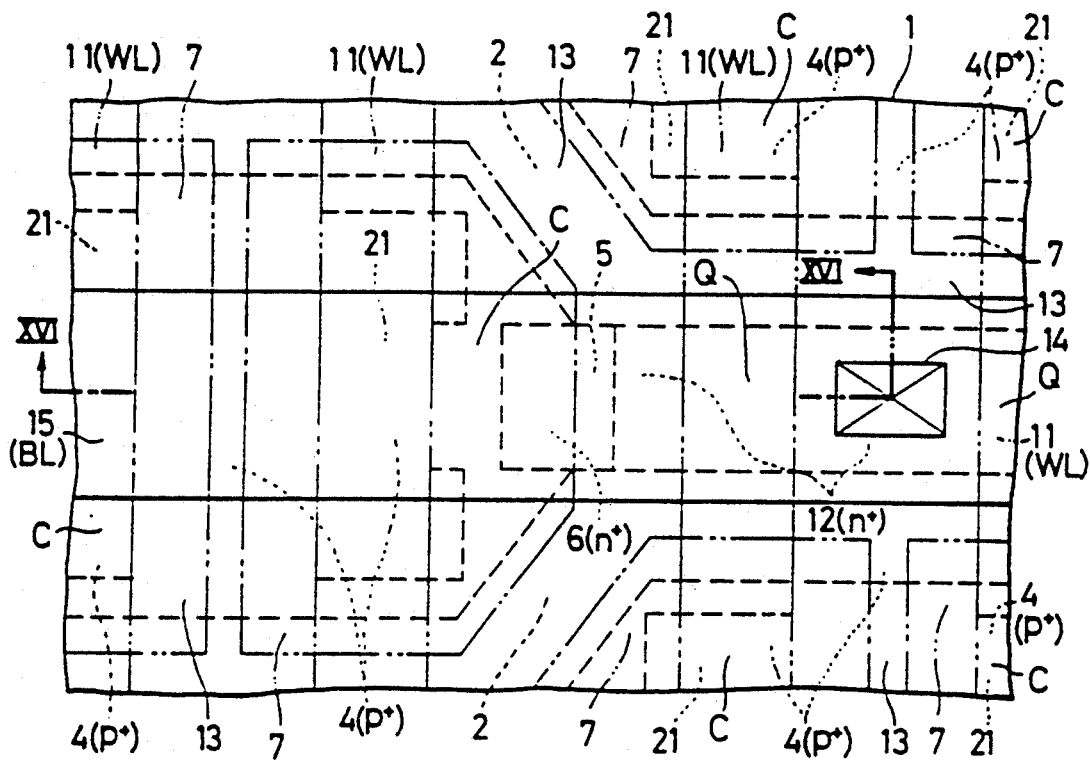
FIG. 41A is a plan view of the essential portions of a memory cell in a DRAM which is a fourteenth embodiment of the present invention.
Figure 41B:
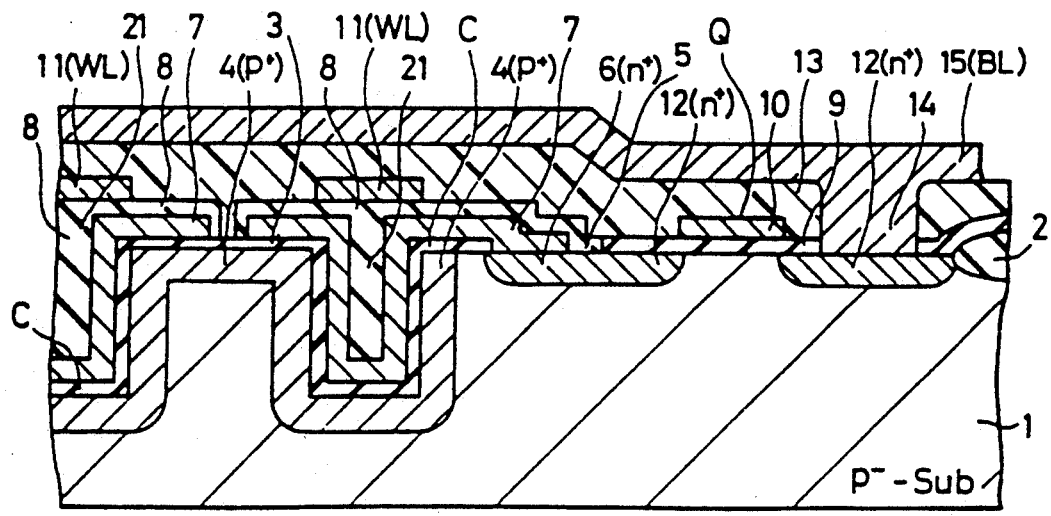
FIG. 41B is a sectional view taken along line XVI—XVI in FIG. 41A.
Figure 44:
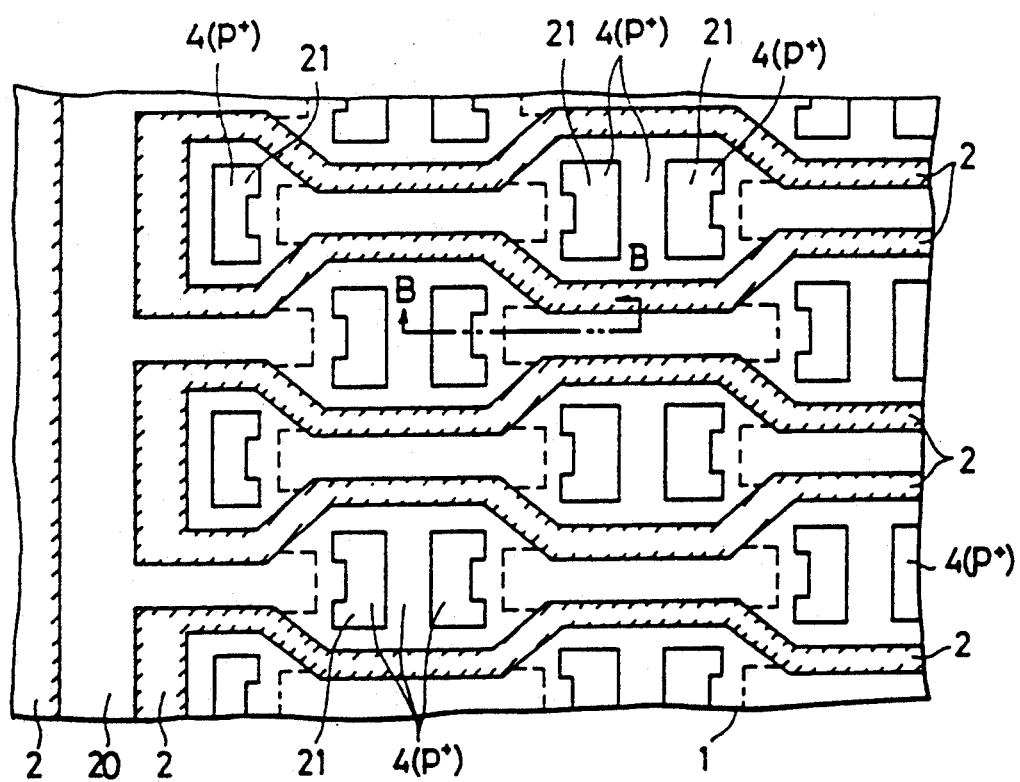
FIG. 44 is a plan view showing an intermediate state in the manufacturing process of the DRAM shown in FIGS. 41A and 41B.

In FIGS. 41A and 41B, numeral 2 designates a field oxide film. Memory cells are shaped by the field oxide films 2 so that the pattern of one pair of the memory cells may be repeated in a row direction as shown in FIG. 44. Within a memory cell array, the field oxide film 2 is disposed principally between the memory cells adjacent in a column direction. This is the same as in the eleventh or twelfth embodiment.

Numeral 21 indicates a trench (groove) which is provided in a semiconductor substrate 1 in an area for forming a storage capacitor therein, and which serves to construct the storage capacitor. This trench 21 increases the quantity of charges as information per unit area in the storage capacitor.

A $p^+$-type semiconductor region 4 serving as a second conductive plate is disposed in the main surface of the semiconductor substrate 1 in the storage capacitor forming area and the surface of the substrate 1 within the trench 21, and is provided unitarily with the storage capacitors adjacent in the row direction. The situation of such $p^+$-type semiconductor regions 4 is shown in FIG. 44.

Now, a method of manufacturing the fourteenth embodiment will be described.

First, a field oxide film (SiO$_2$ film) 2 and $p^+$-type semiconductor regions 4 are formed by the same method as that of the eleventh embodiment illustrated in FIGS. 29A,29B,30A and 30B.

Figure 42A:
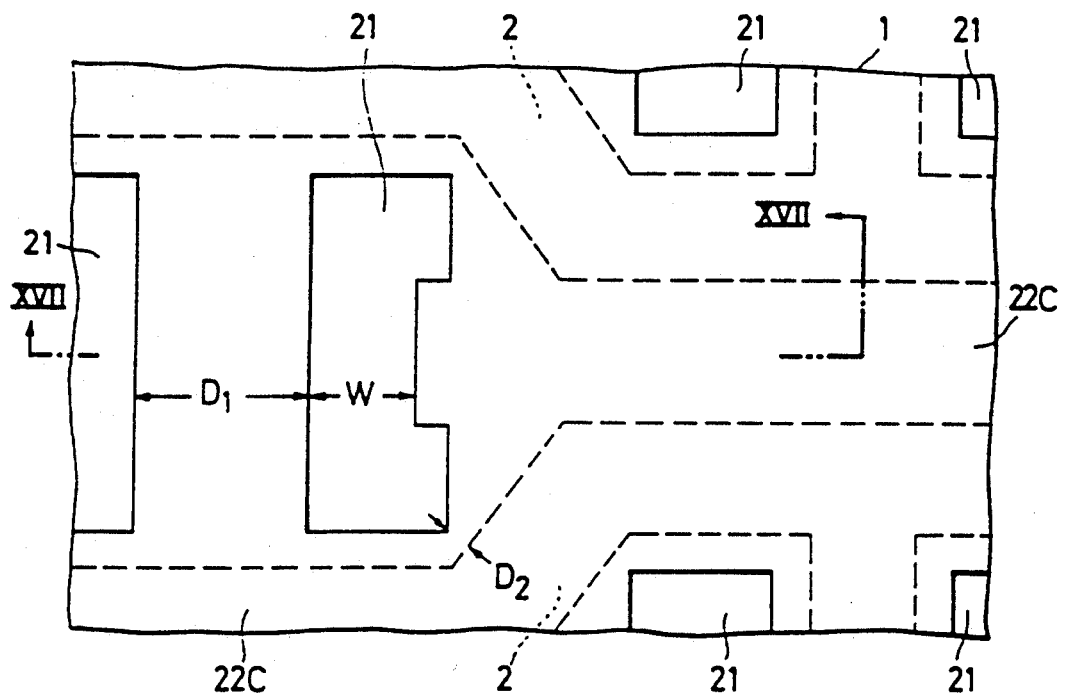
FIGS. 42A, 43A, 45A, 46A, 47A and 48A are plan views of the essential portions of the memory cell at the various manufacturing steps of the DRAM shown in FIGS. 41A and 41B.
Figure 42B:
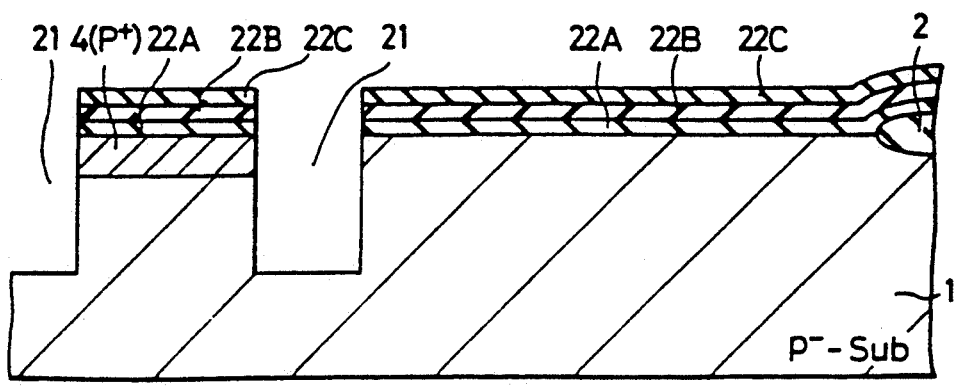
FIGS. 42B, 43B, 45B, 46B, 47B and 48B are sectional views taken along cutting-plane lines indicated in FIGS. 42A, 43A, 45A, 46A, 47A and 48A, respectively.

After the step illustrated in FIGS. 30A and 30B, an insulator film 22A, an insulator film 22B and an insulator film 22C are formed on the whole surface of a semiconductor substrate 1 in order to form a trench and a second conductive plate. The insulator film 22C is a mask against etching for forming the trench, and a silicon dioxide (SiO$_2$) film may be employed by way of example. The insulator film 22B is a mask against impurity introduction for forming the second conductive plate, and a silicon nitride (Si$_3$N$_4$) film may be employed by way of example. The insulator film 22A serves to relieve the stress between the semiconductor substrate 1 and the silicon nitride film 22B, and a silicon dioxide film may be employed by way of example. The insulator film 22A may be formed by the thermal oxidation of the surface of the substrate 1. The insulator films 22B and 22C may be formed by the CVD. The insulator film 22C in a storage capacitor forming area is locally patterned, to form a first mask for forming the trench. Anisotropic dry etching is performed using the first mask, whereby the insulator films 22B and 22C are locally removed to form a second mask out of the insulator film 22B, and further, a predetermined part of the semiconductor substrate 1 is locally removed to form the trench 21 as shown in FIGS. 42A and 42B. The widthwise dimension W of the trench 21 may be approximately 1–1.5 [$\mu$m], and the depth thereof from the surface of the semiconductor substrate 1 may be approximately 2–4 [$\mu$m].

Figure 43A:
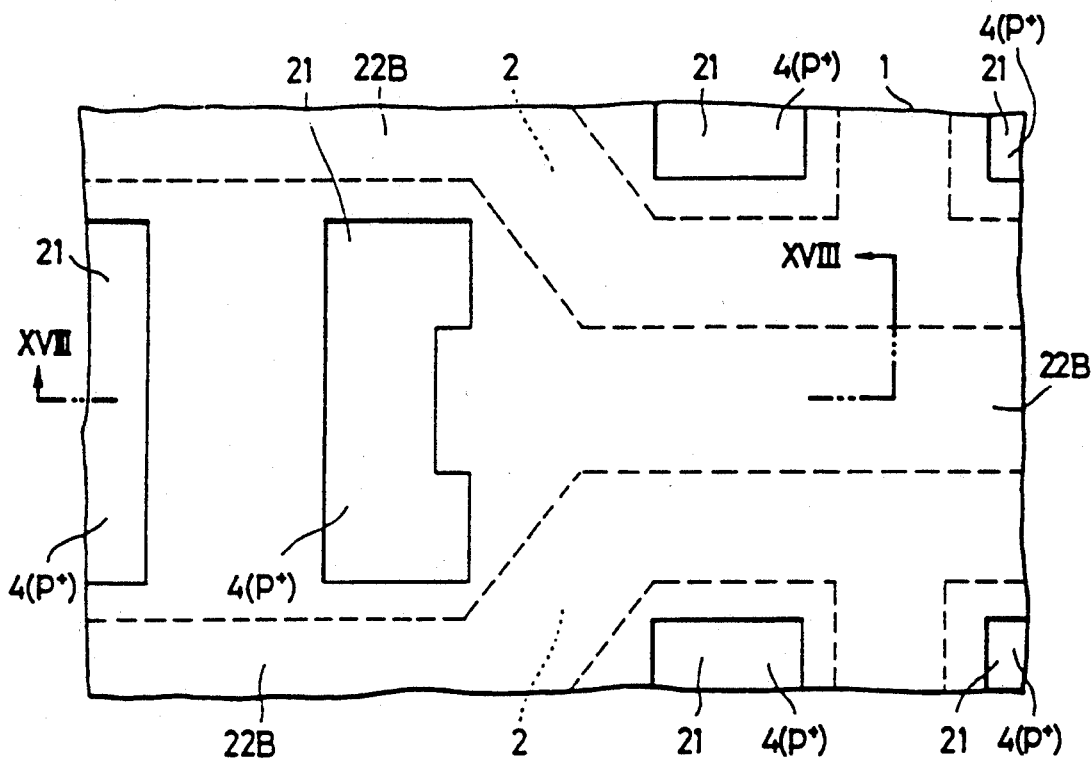
Figure 43B:
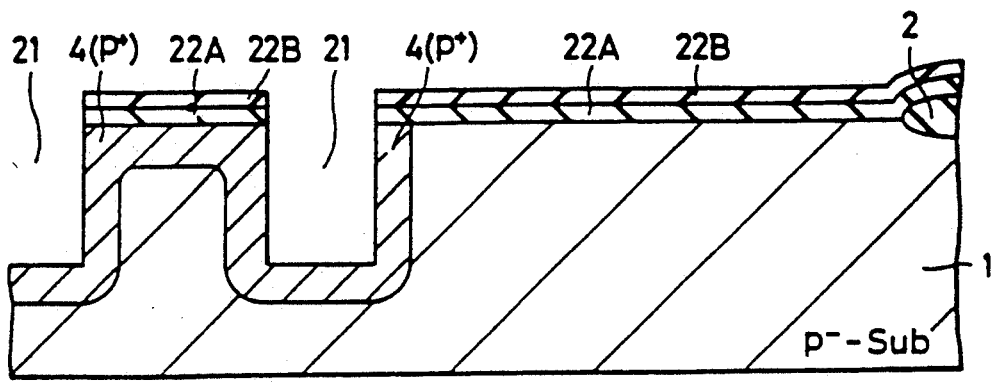

After the steps illustrated in FIGS. 42A and 42B, the insulator film 22C having served as the first mask is removed, and the insulator film 22B to serve as the second mask is exposed. Using this second mask, impurities are introduced into the vicinity of the surface of the semiconductor substrate 1 exposed inside the trench 21, whereby a $p^+$-type semiconductor region 4 to become the second conductive plate is formed as shown in FIGS. 43A and 43B. By way of example, the semiconductor region 4 is formed in such a way that boron (B) ions at a concentration of approximately $1 \times 10^{18}$ [atoms/cm$^3$] or above are introduced by thermal diffusion at approximately 900–1000 [°C.]. In this case, the depth of the semiconductor region 4 taken from the surface of the semiconductor substrate 1 inwardly thereof is made approximately 0.3 [$\mu$m].

The state of memory cell arrays after the formation of the semiconductor regions 4 is shown in FIG. 44. The insulator films 22A and 22B are omitted in FIG. 44. A section along a cutting-plane line B—B in FIG. 44 is shown in FIG. 43B.

Figure 45A:
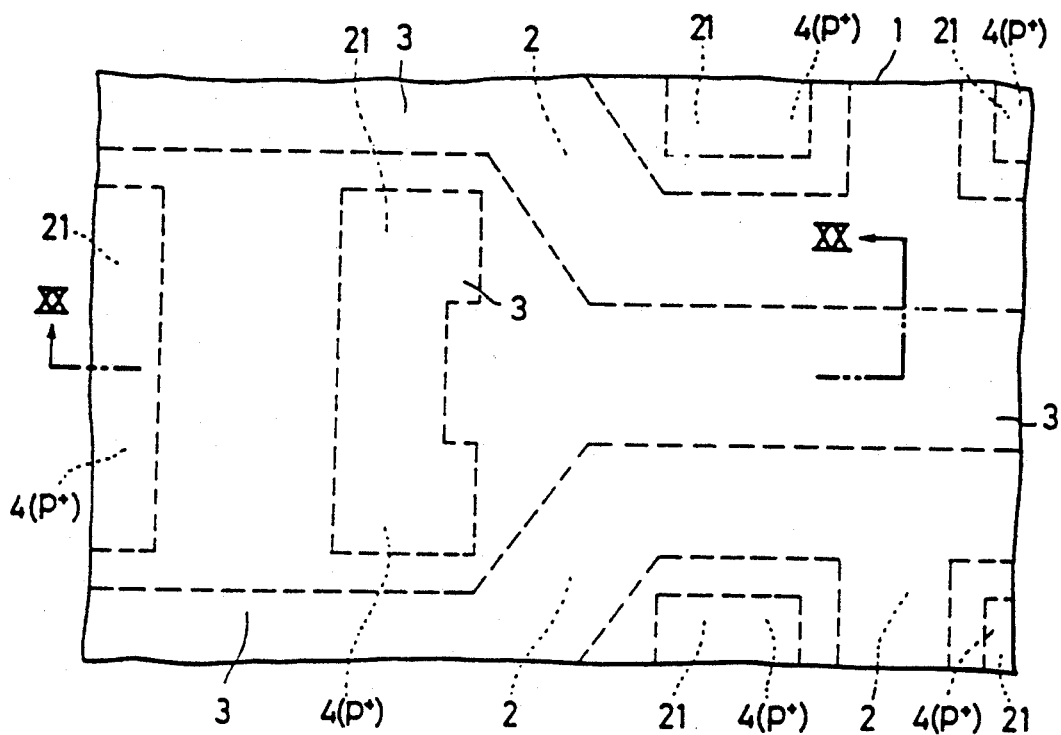
Figure 45B:
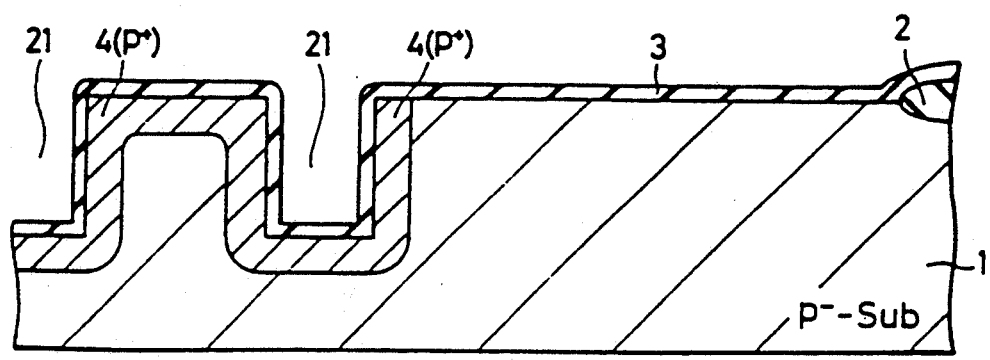

After removing the insulator films 22B and 22A, the same insulator film 3 as in the eleventh embodiment for forming the storage capacitor is formed as shown in FIGS. 45A and 45B.

Figure 46A:
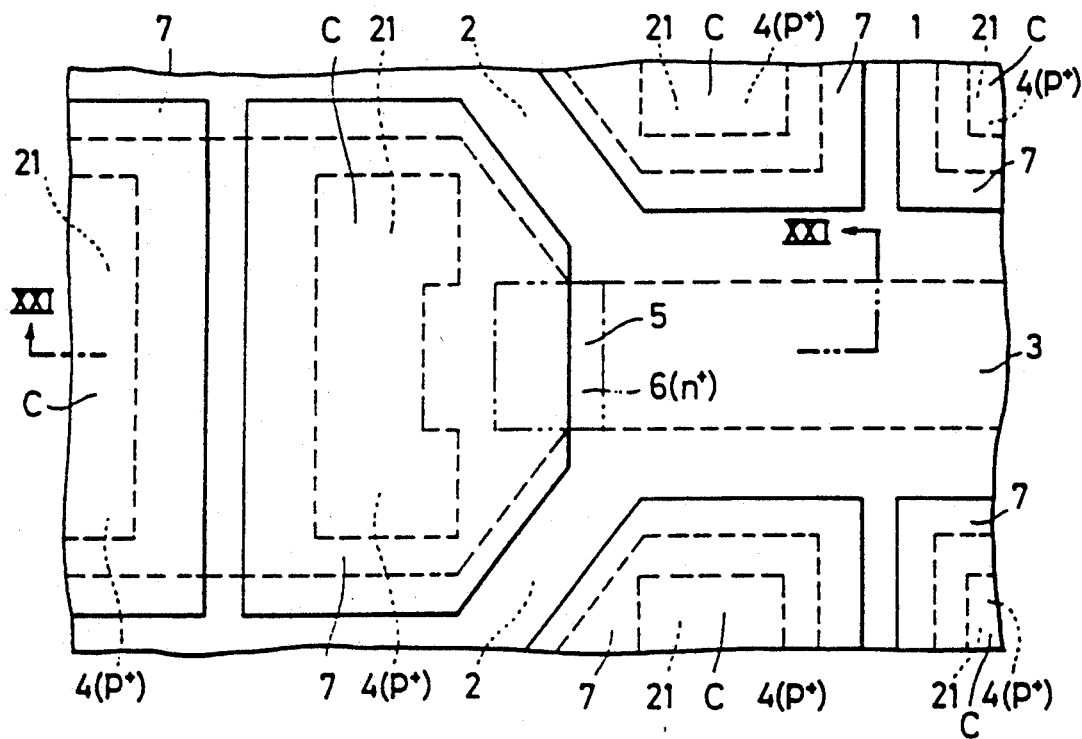
Figure 46B:
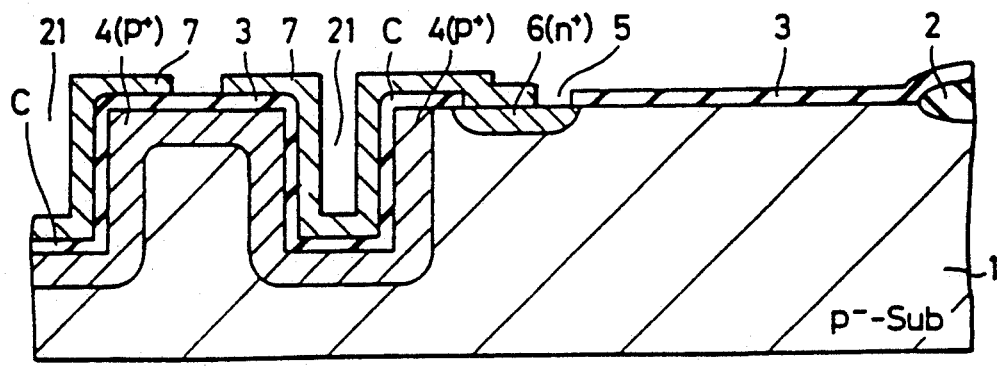

After the step illustrated in FIGS. 45A and 45B, a contact hole 5, an $n^+$-type semiconductor region 6 and a first conductive plate 7 are formed as shown in FIGS. 46A and 46B by the same method as that illustrated in FIGS. 31A and 31B. The trench 21 may well be buried with polycrystalline silicon for the first conductive plate 7 so as to flatten the surface thereof.

After the steps illustrated in FIGS. 46A and 46B, using principally the silicon nitride film of the exposed insulator film 3 as a mask against a heat treatment, an insulator film (SiO$_2$ film) 8 which covers the first conductive plate 7 is formed by the thermal oxidation. The insulator film 8 may have its thickness made, e.g., approximately 2000–3000 [Å] so that the first conductive plate 7 and a word line to be formed by a later step can be electrically isolated. Thus, in a case where the portion of the trench 21 is not buried, the interior of the groove needs to be buried by the use of a burying material, for example, a polycrystalline silicon film or an insulator film. The polycrystalline silicon needs to be turned into an insulator by oxidation. Thereafter, the exposed insulator film 3 is locally removed, whereby the same insulator film 9 as in the eleventh embodiment is formed as shown in FIGS. 47A and 47B.

Figure 47A:
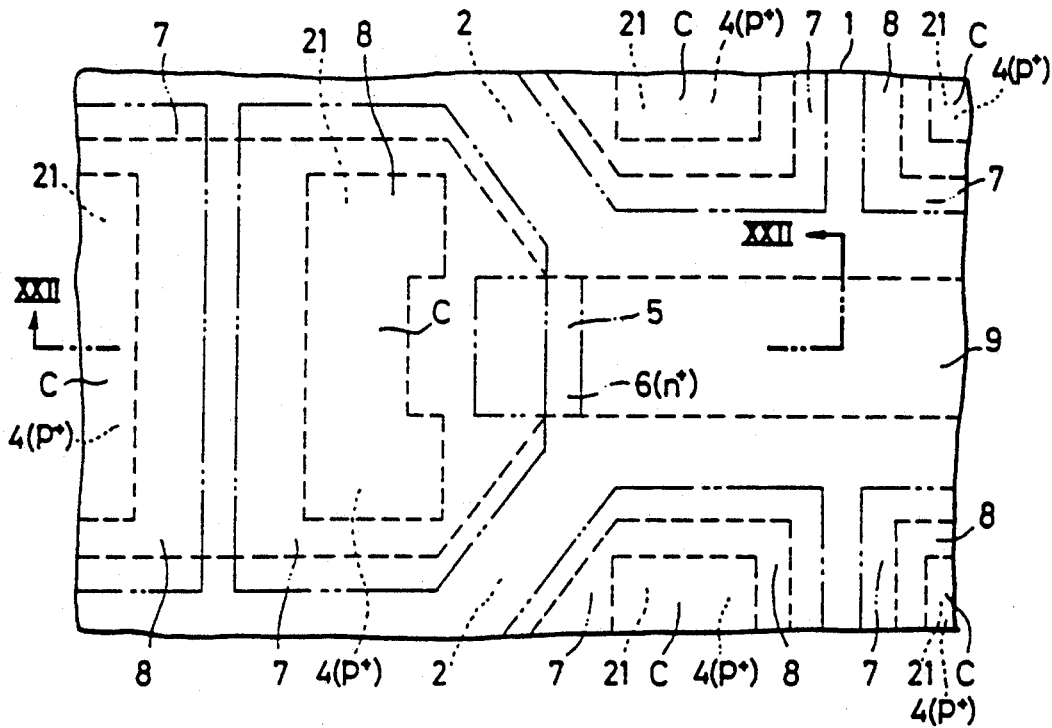
Figure 47B:
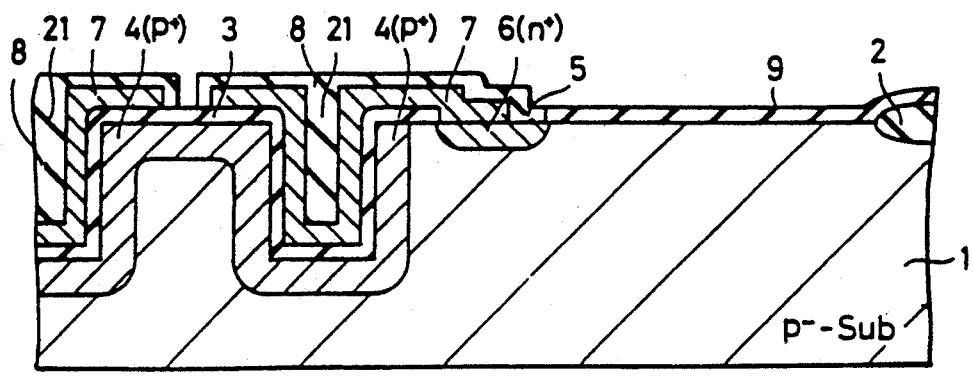
Figure 48A:
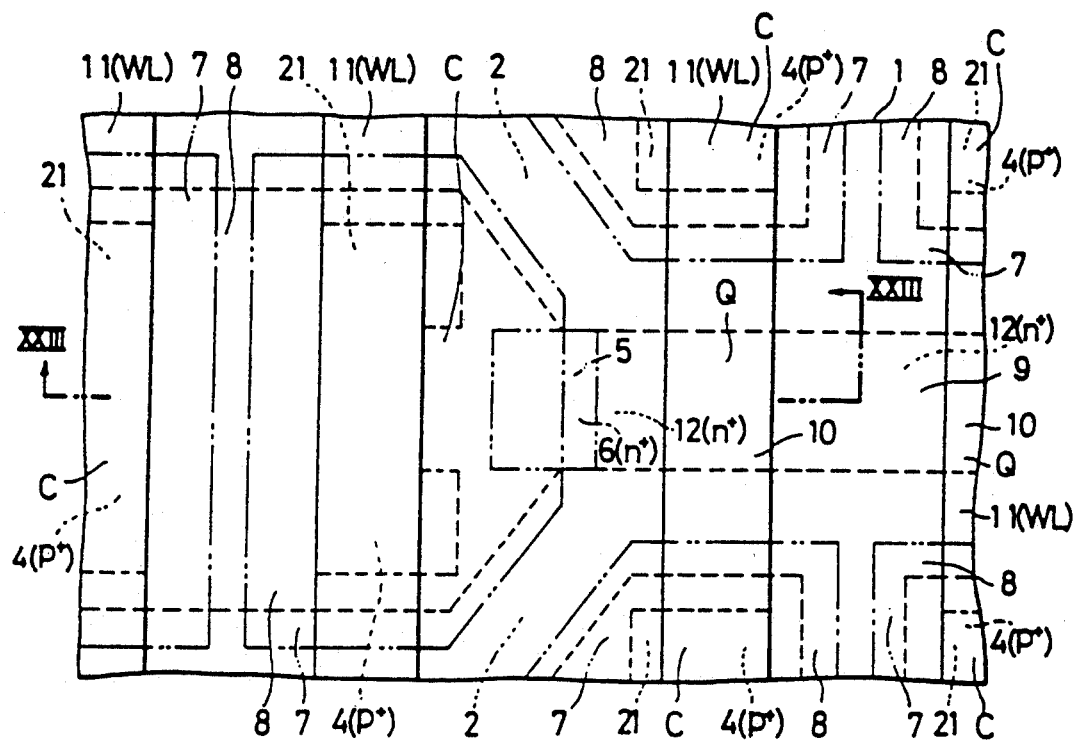
Figure 48B:
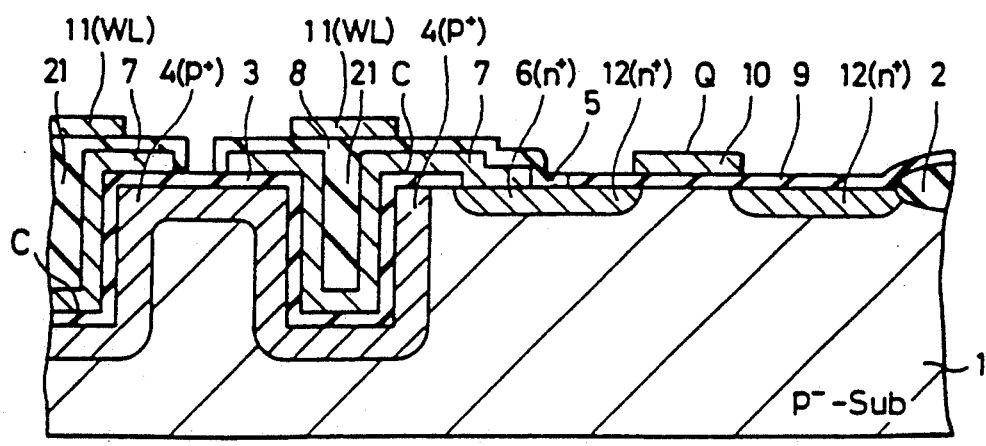

After the steps illustrated in FIGS. 47A and 47B, a MISFET Q and a word line WL are formed as shown in FIGS. 48A and 48B. These are the same as those of the eleventh embodiment shown in FIGS. 33A and 33B.

Thereafter, an insulator film 13, a bit line BL, etc are formed as in the eleventh embodiment. Then, the resultant structure becomes as shown in FIGS. 41A and 41B.

Thereafter, a PSG film and a silicon nitride film by the CVD are formed as a final passivation film.

The DRAM of the present embodiment is finished up by these series of manufacturing steps.

Operations in the cases of writing information into the memory cell of the fourteenth embodiment, holding the information and reading out the information are the same as in the eleventh embodiment.

According to the fourteenth embodiment, the same effects as in the eleventh embodiment are achieved.

In addition, the variation of the quantity of charge storage ascribable to minority carriers and the coupling of the depletion layer of one trench with that of another trench in the deep parts of the trenches 21 can be prevented. Accordingly, the trenches 21 can be formed deep. The distance between adjacent trenches, namely, the distance $D_1$ indicated in FIG. 42A can also be shortened.

Furthermore, since all regions for forming capacitors are $p^+$-type semiconductor regions, the distance $D_2$ between a trench and a field oxide film as indicated in FIG. 12A can be shortened.

A fifteenth embodiment will be described with reference to FIGS. 49A, 49B and 50. Since the manufacturing method thereof is substantially similar to that of the fourteenth embodiment, it shall not be explained. The fifteenth embodiment is an example wherein the first conductive plate of the fourteenth embodiment is further overlaid with a third conductive plate to which a fixed potential is applied, so as to increase and stabilize a capacitance.

Throughout the drawings of the present embodiment, parts having the same functions as in the fourteenth embodiment are assigned the same symbols, and they shall not be repeatedly explained.

Figure 49A:
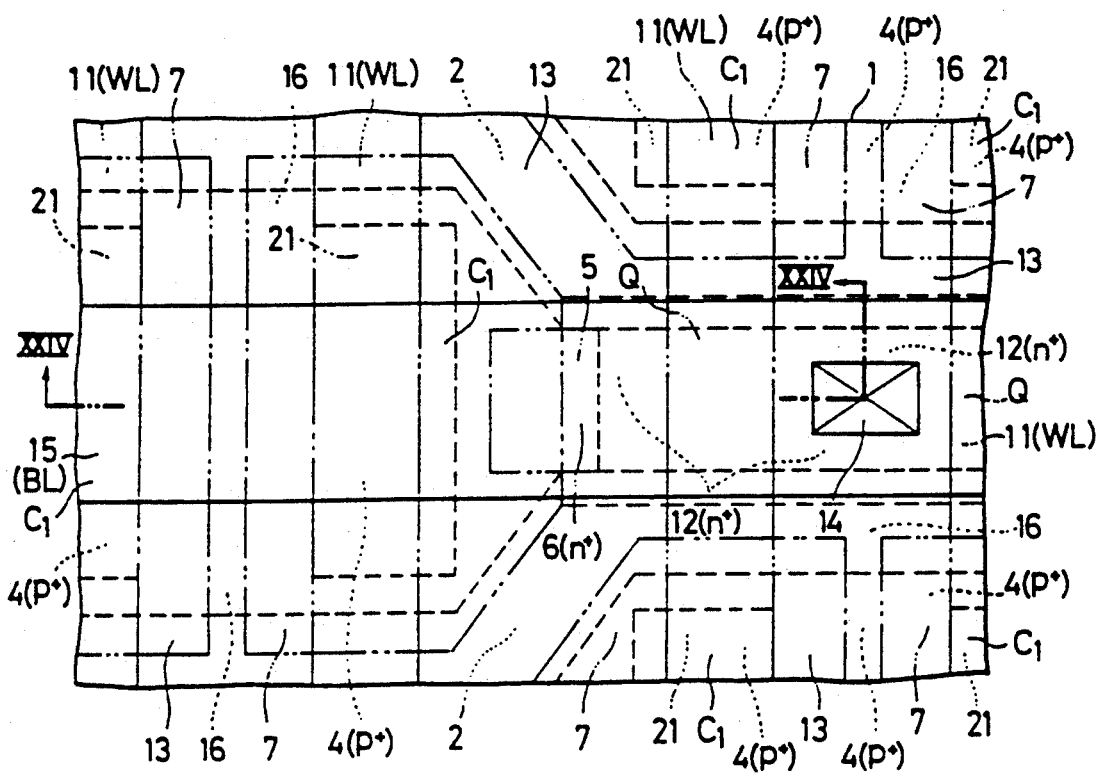
FIG. 49A is a plan view of the essential portions of a memory cell in a DRAM which is a fifteenth embodiment of the present invention.
Figure 49B:
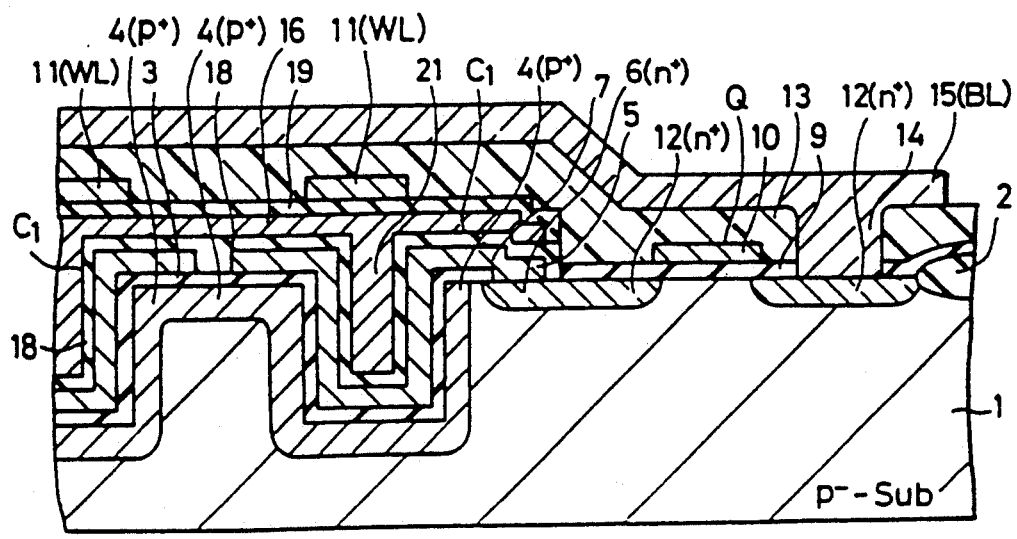
FIG. 49B is a sectional view taken along line XXIV—XXIV in FIG. 49A.

In FIGS. 49A and 49B, numeral 18 designates an insulator film, similar in construction to the foregoing insulator film 3, which is disposed so as to cover at least a first conductive plate 7 and which serves to construct a storage capacitor $C_1$. This insulator film 18 stores charges owing to the first conductive plate 7 and a third electrode to be described later (hereinbelow, termed "third conductive plate"). It electrically isolates the first conductive plates 7 of adjacent memory cells. Numeral 16 designates the third conductive plate for constructing the storage capacitor, which is disposed on the insulator film 18 outside an area for forming a MISFET Q therein and which is connected and provided unitarily with the third conductive plate of the other memory cell in an identical memory cell array. A fixed potential, for example, the same potential as that of a substrate is applied to this third conductive plate 16. The storage capacitor of the memory cell is principally constructed of a parallel connection consisting of a capacitance C which is composed of the first conductive plate 7, a semiconductor region 4 being a second conductive plate and the insulator film 3, and a capacitance $C_1$ which is composed of the first conductive plate 7, the third conductive plate 16 and the insulator film 18. Numeral 19 designates an insulator film which is disposed so as to cover the third conductive plate 16, and which serves to electrically isolate the third conductive plate 16 and a word line (WL) 11.

Figure 50:
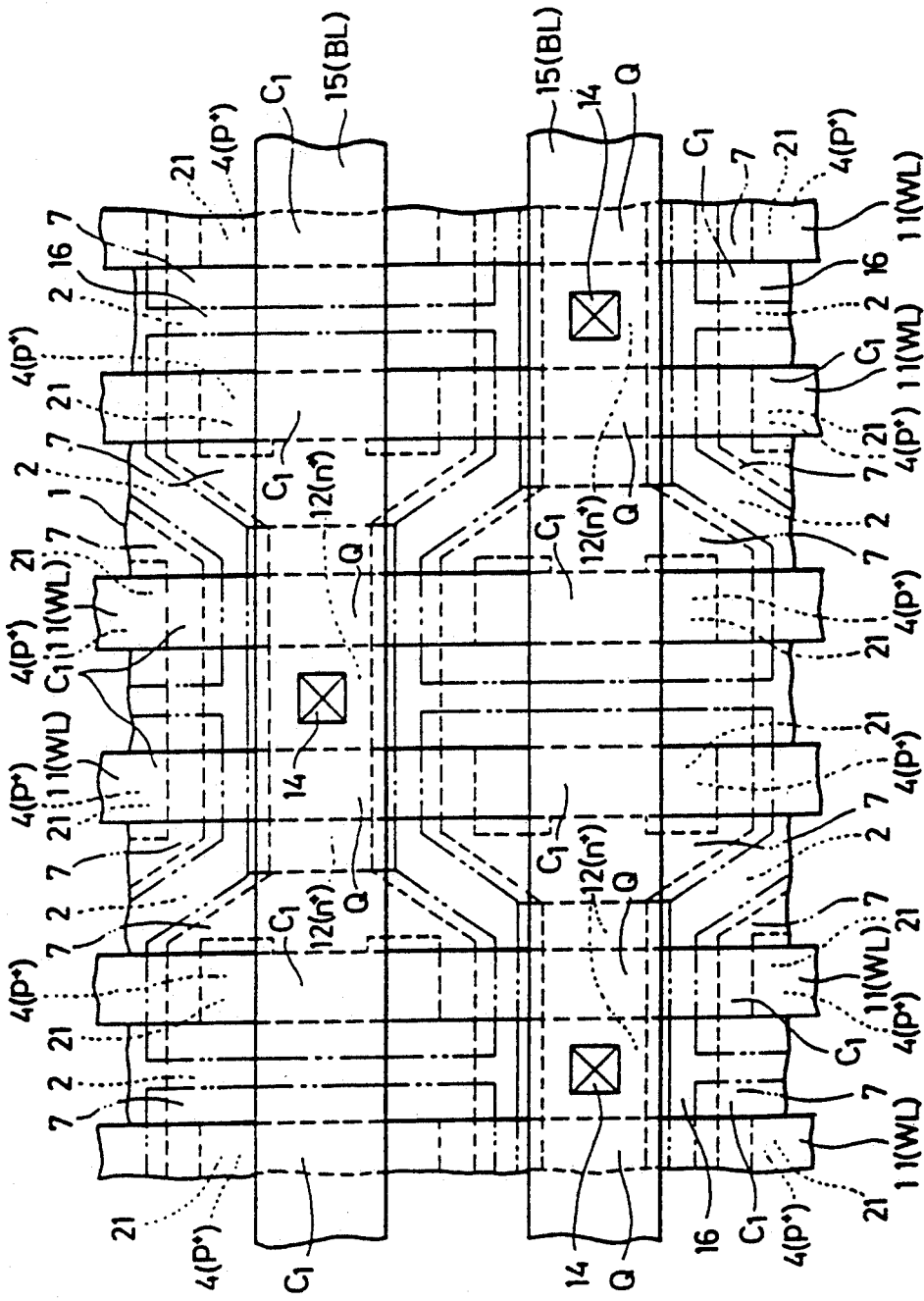
FIG. 50 is a plan view of the essential portions of a schematic memory cell array in the DRAM shown in FIGS. 49A and 49B.

When practicable memory cell arrays are constructed by the use of the memory cells as shown in FIGS. 49A and 49B, they become as illustrated in FIG. 50.

FIG. 50 is a plan view of the essential portions of the schematic memory cell arrays for explaining the fifteenth embodiment of the present invention. In FIG. 50, in order to make the drawing easy to see, insulator films to be disposed between respective conductive layers are not illustrated.

A figure obtained by omitting the third conductive plates 16 in FIG. 50 is identical to the plan view of the fourteenth embodiment.

The operations of the fifteenth embodiment are the same as those of the twelfth embodiment.

According to the fifteenth embodiment, effects similar to those of the twelfth and fourteenth embodiments are achieved.

A sixteenth embodiment will be described with reference to FIGS. 51, 52 and 53. The sixteenth embodiment is an example wherein, in the fifteenth embodiment, the field oxide film 2 which electrically isolates the memory cells adjacent in the column direction is omitted, and quite no field oxide film is disposed within the memory cell array.

Figure 51:
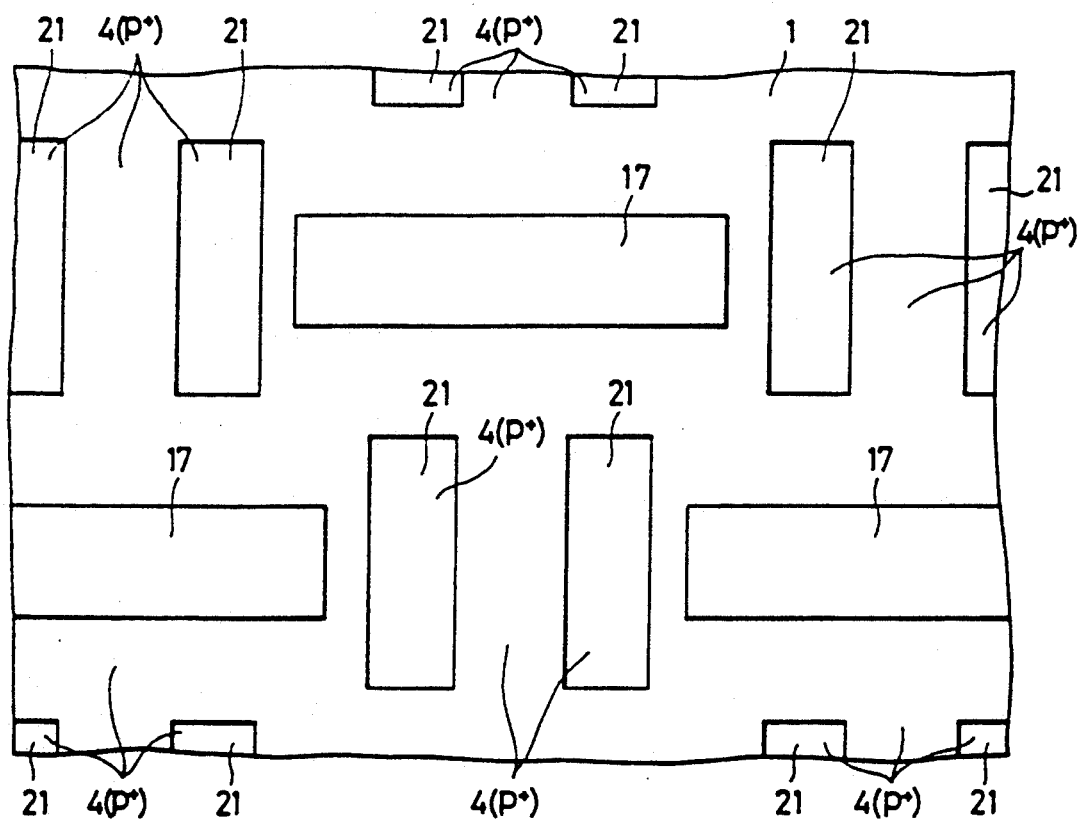
FIGS. 51, 52 and 53 are plan views showing the manufacturing steps of a DRAM which is a sixteenth embodiment of the present invention.
Figure 52:
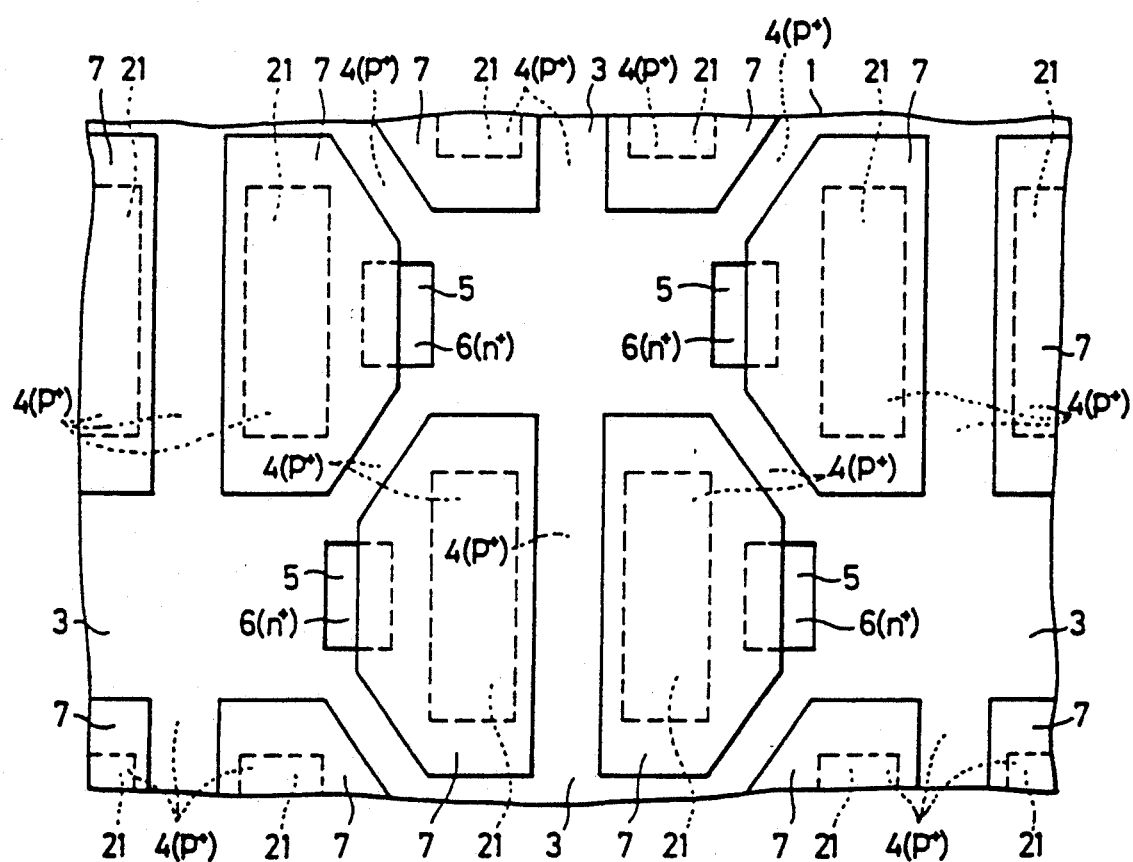
Figure 53:
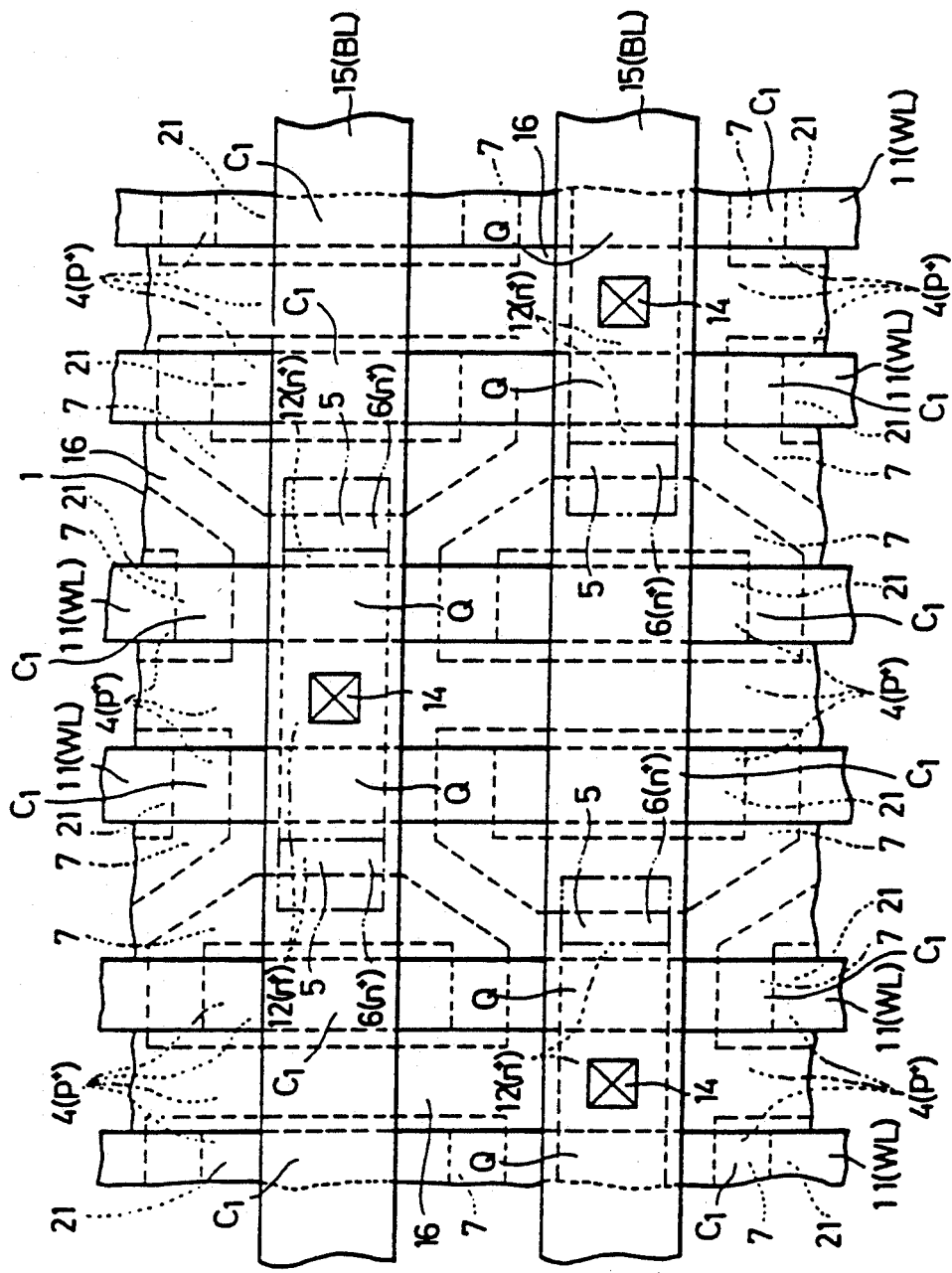

FIGS. 51 to 53 are plan views of the essential portions of memory cell arrays at various manufacturing steps for explaining the manufacturing method of the present embodiment. Throughout the drawings of the present embodiment, parts having the same functions as in the thirteenth and fourteenth embodiments are assigned the same symbols, and they shall not be repeatedly explained.

First, excepting a memory cell array portion, a semiconductor substrate 1 is partly covered with a field oxide film by the local thermal oxidation of the substrate 1 in order to electrically isolate the semiconductor elements (not shown) of a peripheral circuit. A trench 21 and the insulator film 3 are formed. Thereafter, a $p^+$-type semiconductor region 4 is formed in the whole area of the memory cell array except for an area covered with a mask 17, by the same method as shown in FIG. 38.

After the steps illustrated in FIG. 51, a contact hole 5, an $n^+$-type semiconductor region 6 and a first conductive plate 7 are formed by the same method as shown in FIG. 39. A section of FIG. 52 is identical to FIG. 46B in which the field oxide film 2 is replaced with the $p^+$-type semiconductor region 4.

After the steps illustrated in FIG. 52, as in the thirteenth embodiment, an insulator film 18 and a third conductive plate 16 are formed, thereby to construct a storage capacitor $C_1$. After forming insulator films 19 and 9, a gate electrode 10 and a word line (WL) 11 are formed, and semiconductor regions 12 are formed, thereby to form a MISFET Q. After forming an insulator film 13 and a contact hole 14, a bit line (BL) 15 is formed as shown in FIG. 53. In FIG. 53, in order to make the drawing easy to see, insulator films to be disposed between respective conductive layers are not shown. In addition, a section of FIG. 53 is equal to FIG. 49B in which the field oxide film 2 is replaced with the $p^+$-type semiconductor region. Thereafter, the processing of a protective film etc. is performed as in the eleventh embodiment.

In the present embodiment, the $p^+$-type semiconductor region 4 and the $n^+$-type semiconductor region 6 need to be disposed in spaced fashion as in the other embodiments.

The operations of the sixteenth embodiment are the same as those of the twelfth embodiment.

According to the sixteenth embodiment, effects similar to those of the thirteenth and fifteenth embodiments are achieved.

In the present embodiment, it is needless to say that the formation of the third conductive plate 16 may well be omitted. This is identical to the relation between the thirteenth embodiment and the eleventh embodiment. The plan and section of the memory cells of the DRAM in this case and the sections thereof in the course of the manufacturing steps will be apparent from the description of the thirteenth and fourteenth embodiments.

The present embodiment brings forth the following effects:

A storage capacitor is constructed of an insulator film which is disposed on the surface of a semiconductor substrate, a first conductive plate one end part of which is disposed on the insulator film and the other end part of which is disposed so as to be electrically connected with one semiconductor region of a MISFET, and a semiconductor region to serve as a second conductive plate, which is disposed in a predetermined surface part of the semiconductor substrate. This eliminates the coupling between the depletion layers of the adjacent storage capacitors, and the leakage of charges between them.

Since the leakage of the charges is eliminated, the retention time of charges in the storage capacitor is enhanced, and the frequency of refreshing operations is lowered. Accordingly, the operating speed of the DRAM is enhanced.

As charges to be stored in a storage capacitor, charges in an accumulation layer or a narrow depletion layer are used. Accordingly, it becomes unnecessary to use electrons which are stored in a wide depletion layer or an inversion layer, so that the DRAM is not affected by minority carriers.

Since the degree of influence of minority carriers on a storage capacitor need not be considered, the occupying area of the storage capacitor can be reduced. Thus, the integration of the DRAM at a higher packing density is realized.

Since charges can be stored between a first conductive plate and a second conductive plate and between the first conductive plate and a third conductive plate, the quantity of charge storage of a storage capacitor per unit area increases.

A memory cell is electrically isolated from another memory cell adjoining it in a row direction or/and a column direction, by a semiconductor region being a second conductive plate which constitutes a storage capacitor. An isolation region made of an insulator film becomes unnecessary, and the integration of the DRAM at a higher packing density is permitted.

The occupying area of a memory cell can be markedly reduced, and the integration of the DRAM at a still higher packing density is permitted.

By disposing a third conductive plate of fixed potential on a first conductive plate, the influence of a word line on the first conductive plate is eliminated, and the quantity of charges to be stored in a storage capacitor is stabilized. The writing and reading operations of the DRAM are also stabilized.

Since a semiconductor region of a first conductivity type constituting the capacitance of a memory cell and a semiconductor region of a second conductivity type connected with the MISFET of the memory cell are disposed so as to be spaced from each other, the reverse breakdown voltage of a junction is not deteriorated.

While, in the above, the invention made by the inventors has been concretely described in conjunction with embodiments, it is needless to say that the present invention is not restricted to the foregoing embodiments, but that it can be variously modified within a scope not departing from the purport thereof.

By way of example, it is also allowed to form a p-type well region in an n-type semiconductor substrate and to construct the memory cells of a DRAM within the well region. In addition, it is allowed to employ an n-type semiconductor substrate and to use an n-type semiconductor region as a second conductive plate so as to store charges for information. Besides, it is allowed to form an n-type well region in a p-type semiconductor substrate and to form the memory cells of a DRAM within the well region.

In the fourteenth to sixteenth embodiments, an ion implantation process may well be employed as a method of forming a semiconductor region which is a second conductive plate. In this case, the ion implantation is performed in the state shown in FIG. 43B. The implanted impurity element, for example, boron is introduced into the bottom of a trench 21. The boron is diffused by subsequent annealing, to form a semiconductor region in the bottom of the trench 21 and to rise along the side wall of the trench toward the surface of a substrate. Therefore, the semiconductor region is formed also in a part of the side wall of the trench. The semiconductor region extending along the side wall does not reach the vicinity of the substrate surface (a region where a semiconductor region 6 of the opposite conductivity type is formed). With this measure, the capacitance of a memory cell decreases to some extent, but a mask registration margin for spacedly arranging the semiconductor regions 4 and 6 of the conductivity types opposite to each other can be dispensed with.

The structure and fabrication method of a seventeenth embodiment will be described in connection with the memory cell of the DRAM.

Figure 54:
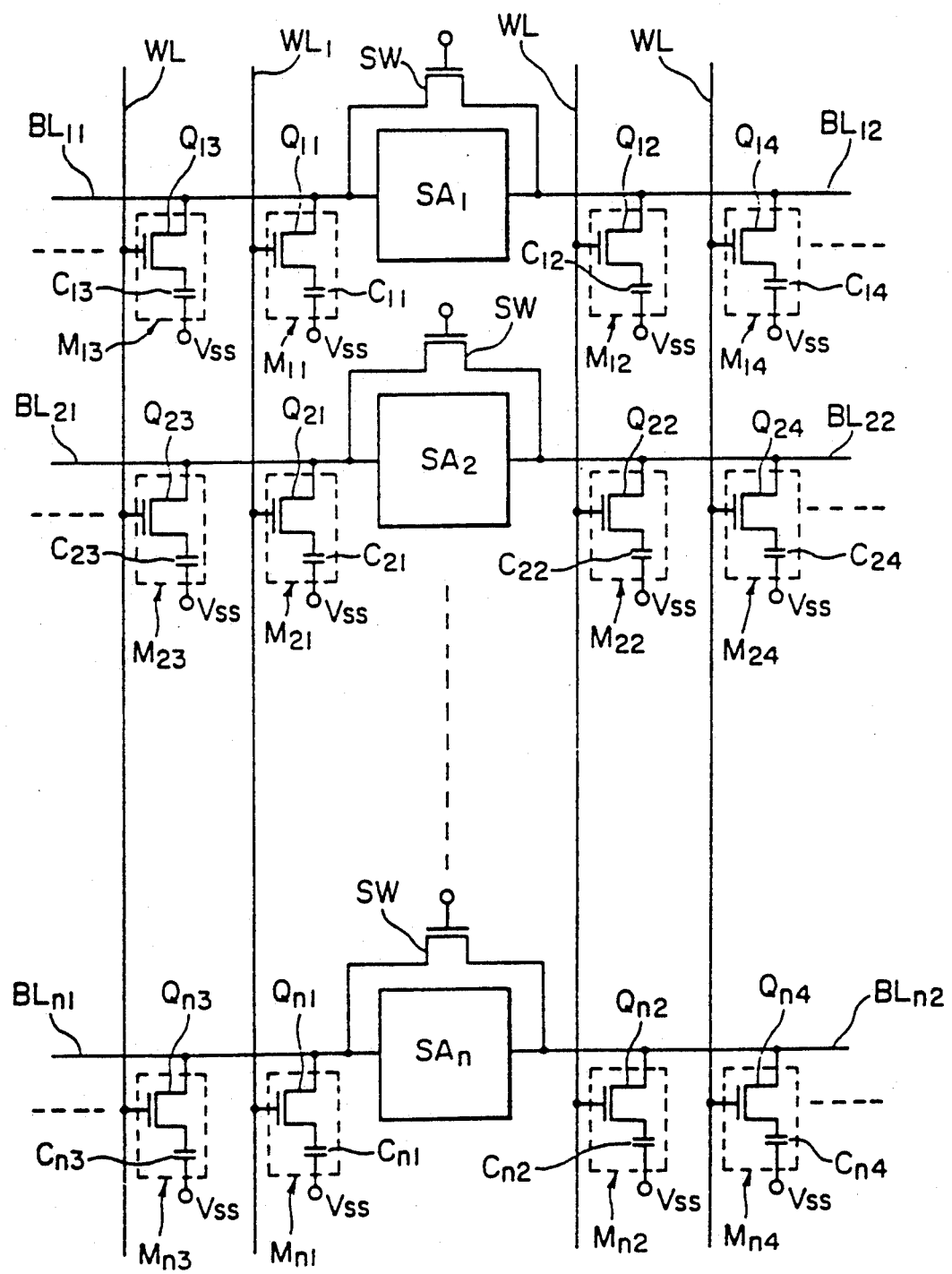
FIG. 54 is a diagram of an equivalent circuit showing the essential portion of the memory cell array of the DRAM for explaining the seventeenth embodiment of the present invention.

FIG. 54 is a diagram of an equivalent circuit showing an essential portion of the memory cell array of the DRAM for explaining the seventeenth embodiment of the present invention. As to all embodiments described hereinafter, incidentally, the description will be made on the DRAM which adopts the open-bit line type In FIG. 54, the bit lines $BL_{11}$, $BL_{12}$, $BL_{21}$, $BL_{22}$ and so on are arranged to extend in a paired manner in the row direction from both the ends of the sense amplifiers $SA_1$, $SA_2$ and so on. Reference letters SW indicate a switch element which is connected with the paired bit lines BL to short-circuit them. As a result, the memory cell array does not need any dummy cell which has capacitor elements of a charge storage of one-half as high as that of the memory cells (as is generally used in folded bit line memories).

Next, the specific structure of the seventeenth embodiment of the present invention will be described in the following.

Figure 55A:
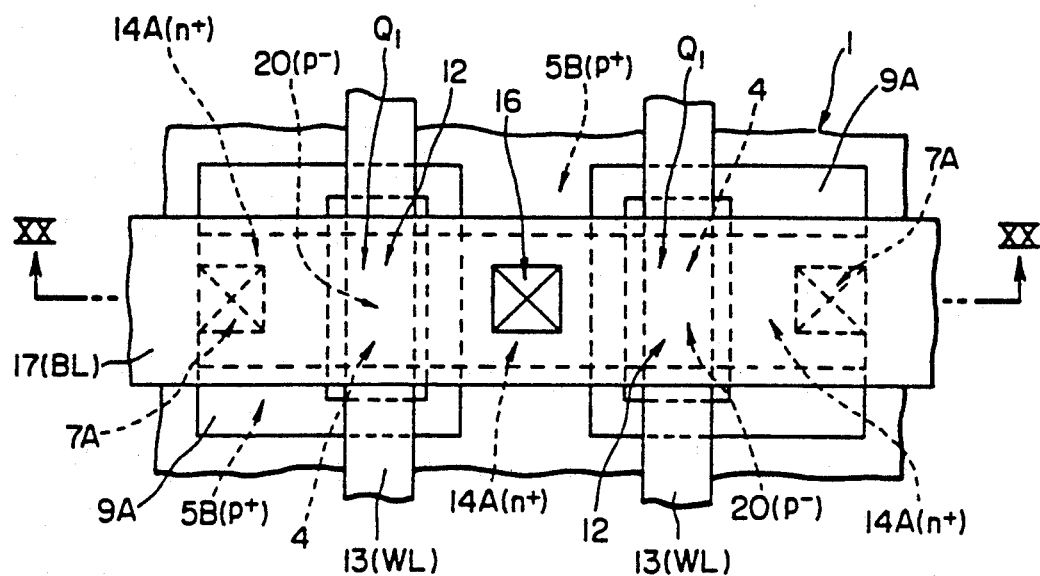
FIG. 55A is a top plan view showing the essential portion of the DRAM memory cell for explaining the structure of the seventeenth embodiment of the present invention.
Figure 55B:
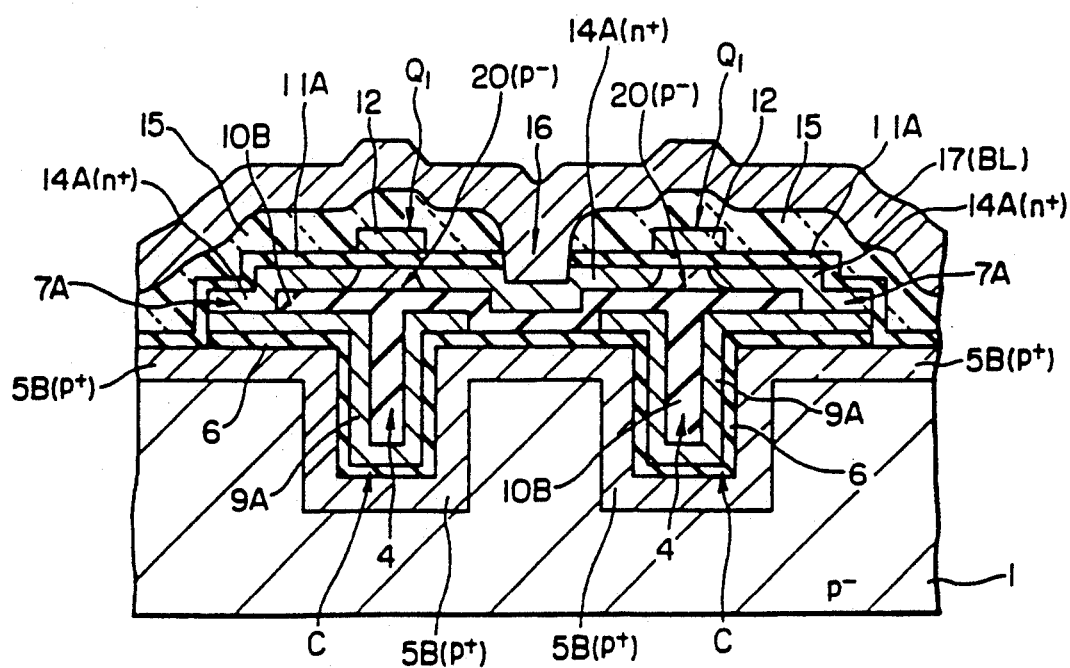
FIG. 55B is a sectional view taken along line XX—XX of FIG. 55A.

FIG. 55A is a top plan view showing an essential portion of the DRAM memory cell for explaining the structure of the present embodiment, and FIG. 55B is a section taken along line XX—XX of FIG. 55A. Incidentally, for purposes of drawing simplification, FIG. 55A does not show the insulating films to be formed between the individual conductive layers.

Indicated at reference characters 9A in FIGS. 55A and 55B is a first conductive plate which is formed over the insulating film 6 of the storage capacitor element forming portion independently for each memory cell, which has its one end connected electrically with one semiconductor region of a later-described MISFET. Indicated at characters 10B is an insulating film which is formed to cover the first conductive plate 9A to mainly effect electric isolation between the first conductive plate 9A and a later-described MISFET to be arranged thereover, between the first conductive plates 9A positioned close to each other, and between the first conductive plate 9A and the word lines (WL). The insulating film 10B can fill up the insulating film 6 and the first conductive plate 9A with the moats 4 to flatten their upper surfaces. Indicated at characters 7A are connection holes which are formed by selectively removing the insulating film 10B at portions where the first conductive plate 9A and one of the semiconductor regions of the later-described MISFET are to be connected, thereby to provide their electric connection. Indicated at reference numeral 20 is a semiconductor plate made of $p^-$-type single-crystal silicon, which is connected with one end of the first conductive plate 9A at a predetermined portion and which is arranged over the capacitor element C through the insulating film 10B while making a pair with the capacitor element C adjoining thereto in a predetermined direction, thereby to construct the MISFET. Indicated at characters 11A is an insulating film which is formed to cover at least the semiconductor plate 20 thereby to mainly construct the gate insulating film of the MISFET. Indicated at characters 14A are n+-type semiconductor regions which are formed to extend depthwise from the main surface of the semiconductor plate 20 at both the sides of the gate electrode 12 for providing a source region and a drain region to construct the MISFET. The switching transistor, i.e., the MISFET $Q_1$, is composed of the gate electrodes 12, the semiconductor regions 14A, the semiconductor plate 20 and the insulating film 11A. One semiconductor region 14A is electrically connected through the connection hole 7A with one end of the first conductive plate 9A.

Next, the specific fabrication method of the first embodiment of the present invention will be described in the following.

FIGS. 56A to 60A are top plan views showing the essential portions of the DRAM memory cell at the respective fabrication steps for explaining the fabrication method of the present embodiment, and FIGS. 56B to 60B are sectional views taken along the cut lines of FIGS. 56A to 60A. In a manner to correspond to the respective fabrication steps of the memory cell (as is located at the righ-hand side of the drawings) of the DRAM, incidentally, the fabrication steps of a MISFET (as is located at the left-hand side of the drawings) constructing the peripheral circuit of the DRAM will be described in the following.

First of all, an insulating film 21 is formed on the main surface of the p−-type silicon semiconductor substrate 1 at a region to be formed with the MISFET except for the memory cell array portion, and a p-type channel stopper region 22 is formed on the main surface of the semiconductor substrate 1 at the region to be formed with the MISFET whereas a field insulating film 2B is formed over that main surface. After that, the moats 4 are formed in the memory cell array portion in a manner similar to that described earlier in this case, and the p+-type semiconductor region 5B for providing the second conductive plate is formed in the vicinity of the surface of the semiconductor substrate 1 and in the moats 4 in the vicinity of the exposed surface of the semiconductor substrate 1. Moreover, the insulating film 6 made of $SiO_2$ is formed all over the surface, as shown in FIGS. 56A and 56B.

Figure 56A:
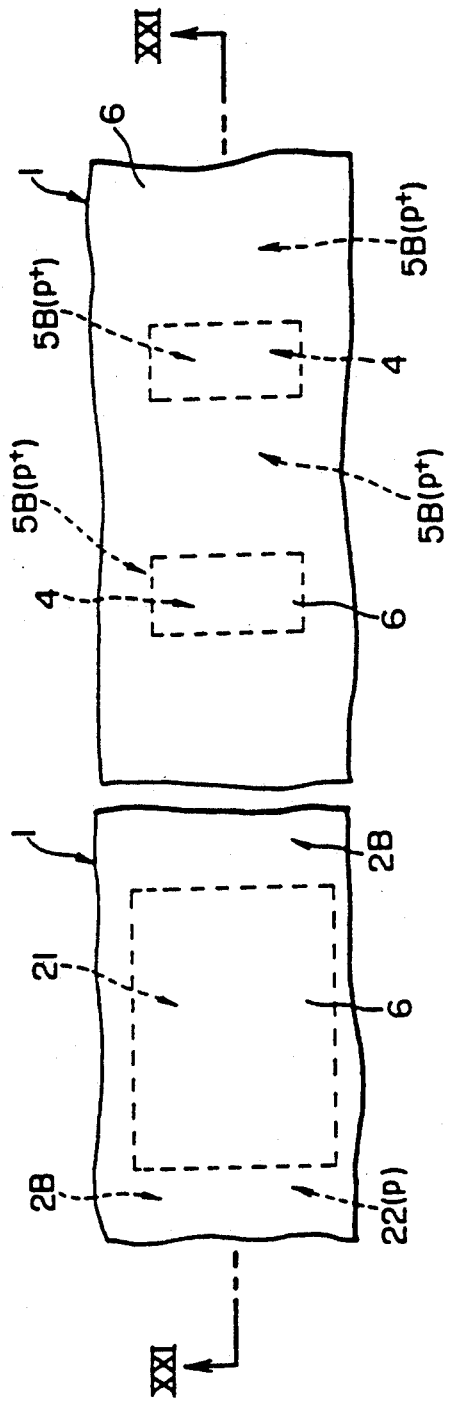
Figure 56B:
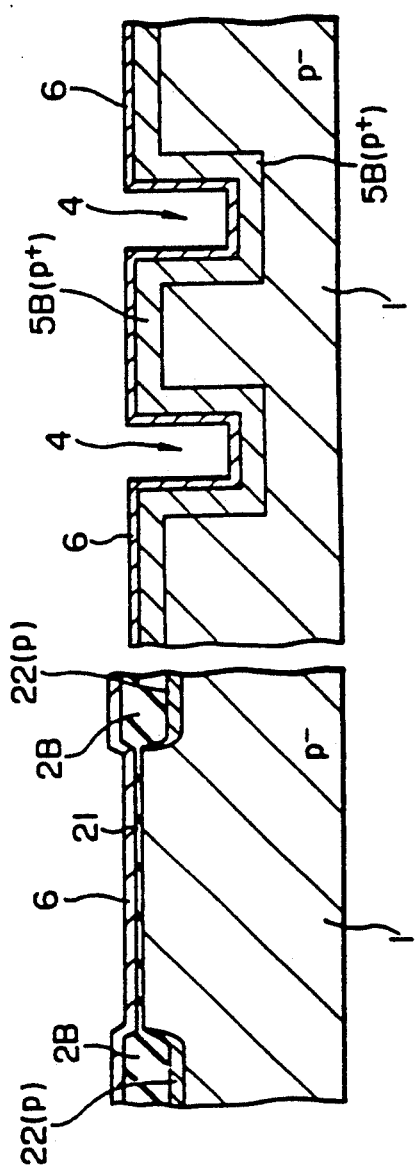

After the step shown in FIGS. 56A and 56B, the first conductive plate 9A is so formed over the insulating film 6 as to cover the moats 4 at the memory cell array portion. The first conductive plate 9A may be made of a polycrystalline silicon film by the CVD method like that described earlier in this case to have a thickness of about 800 to 1,200 (Å). As a result, the storage capacitor element C of the memory cell is formed. After that, the insulating film 10B is formed all over the surface to cover the first conductive plate 9A and is then removed selectively at a portion, where the first conductive plate 9A and one semiconductor region of the MISFET are to be connected, to form the connection hole 7A. The insulating film 10B may be made of a silicon oxide ($SiO_2$) film by the CVD method, for example, to have a thickness of about 3,000 to 4,000 (Å). As shown in FIGS. 57A and 57B, moreover, a polycrystalline silicon film 20A is formed all over the surface by the CVD method so as to form the semiconductor plate of single-crystal silicon. This polycrystalline silicon film 20A may have a thickness of about 2,500 to 3,500 (Å), for example. Incidentally, the polycrystalline silicon film 20A is connected with the first conductive plate 9A through the connection hole 7A.

After the step shown in FIGS. 57A and 57B, the silicon film 20A is turned into a single-crystal silicon film. This may be conducted by a heat treatment technique using a CW argon laster (i.e., Ar-Laser), for example, or by a laser annealing treatment under the conditions of an energy of 3 to 15 (W), a scanning speed of 5 to 100 (cm/sec), a substrate temperature of 300 (°C.) and a beam diameter of 30 ($\mu$m). Moreover, an impurity for controlling the threshold voltage of the MISFET is introduced into the main surface of the single-crystal silicon film at a portion where at least the channel of the MISFET is to be formed. This may be conducted by a heat treatment after boron ions of $1 \times 10^{11}$ (atoms/cm$^2$), for example, have been implanted with an energy of about 50 to 70 (KeV).

Figure 58A:
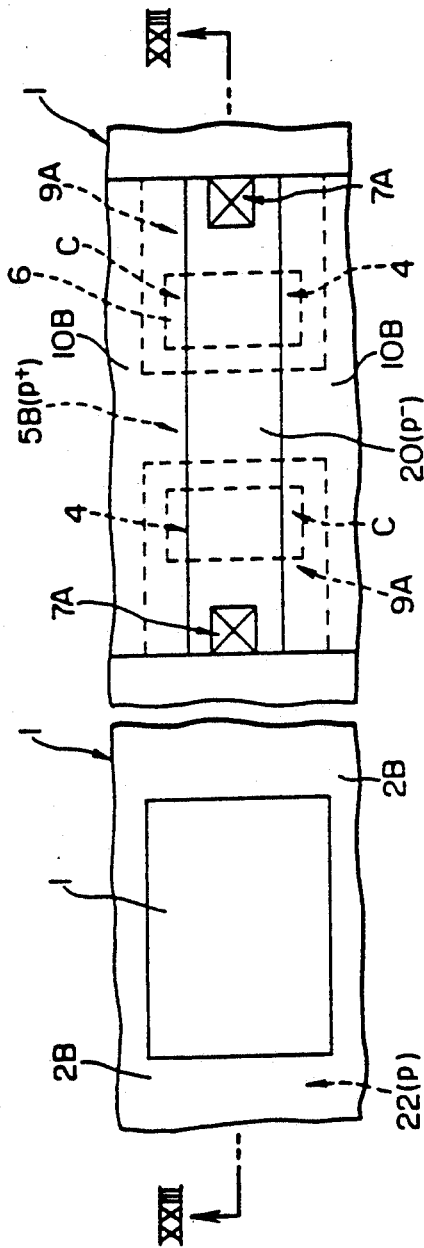
Figure 58B:
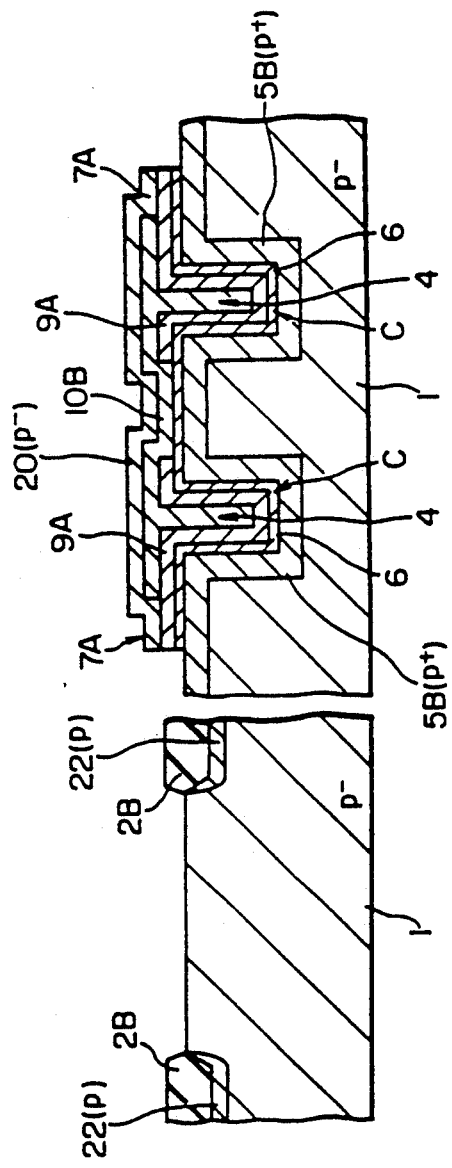

After that, as shown in FIGS. 58A and 58B, the single-crystal silicon film is selectively patterned to form the semiconductor plate 20 which has its one end connected through the connection hole 7A with the first conductive plate 9A constructing the storage capacitor element and its other end connected through the connection hole 7A with the first conductive plate 9A constructing another storage capacitor element adjoining thereto. The layer 20 is of the p−-type at least at its portion where the channel of the MISFET is to be formed. Moreover, the insulating films 10B and 6 at predetermined portions are selectively removed to expose the surface of the p+-type semiconductor region 5B of the memory cell array portion and the main surface of the semiconductor substrate 1 at the MISFET forming portion constructing the peripheral circuit to the outside.

After the step shown in FIGS. 58A and 58B, insulating films 11A and 11B of $SiO_2$ are so formed by a thermally oxidizing technique to cover the semiconductor plate 20, which is exposed at the memory cell array portion, the first conductive plate 9A, the p+-type semiconductor region 5B, and the surface portion of the semiconductor substrate 1 which is exposed at the MISFET forming portion constructing the peripheral circuit. Those insulating films 11A and 11B may be so formed by the thermal oxidation to have a thickness of about 200 to 300 (Å) that the gate insulating films of the MISFET may be formed. After that, the gate electrodes 12 and the word lines (WL) 13, which are electrically connected with the former and which extend in the column direction, are formed over the insulating film 11A, and a gate electrode 12A is formed over the insulating film 11B. As shown in FIGS. 59A and 59B, moreover, the n+-type semiconductor regions 14A are formed at the memory cell array portion on the semiconductor plate 20 through the insulating film 11A at both the sides of the gate electrode 12. Simultaneously with this, at the MISFET portion constructing the peripheral circuit, n+-type semiconductor regions 14B are formed on the main surface of the semiconductor substrate 1 through the insulating film 11B at both the sides of the gate electrode 12A. Those regions may be formed by the ion implantation using the gate electrode as a mask. As a result, a MISFET $Q_1$ of the memory cell and a MISFET $Q_2$ constructing the peripheral circuit are formed. Moreover, the semiconductor regions 14A of the MISFET $Q_1$ are not extended and diffused at a deeper portion than the thickness of the semiconductor plate 20.

After the step shown in FIGS. 59A and 59B, the insulating film 15 is formed all over the surface in a manner similar to that discussed earlier in this case. This insulating film 15 is made of a phosphosilicate glass (i.e., PSG) film. After that, the insulating films 11A, 11B and 15 overlying the predetermined semiconductor regions 14A and 14B are selectively removed to form connection holes 16 and 16A. As shown in FIGS. 60A and 60B, moreover, the bit lines (BL) 17, which are electrically connected with the semiconductor regions 14A through the connection hole 16 and which extend in the row line over the insulating film 15, and wires 17A, which are electrically connected with the semiconductor regions 14B through the connection holes 16A, are formed over the insulating film 15.

After this, the PSG film and the silicon nitride film are formed by a plasma CVD method as the final protecting films.

The DRAM of the present embodiment is completed by the series fabrication steps thus far described.

Figure 61:
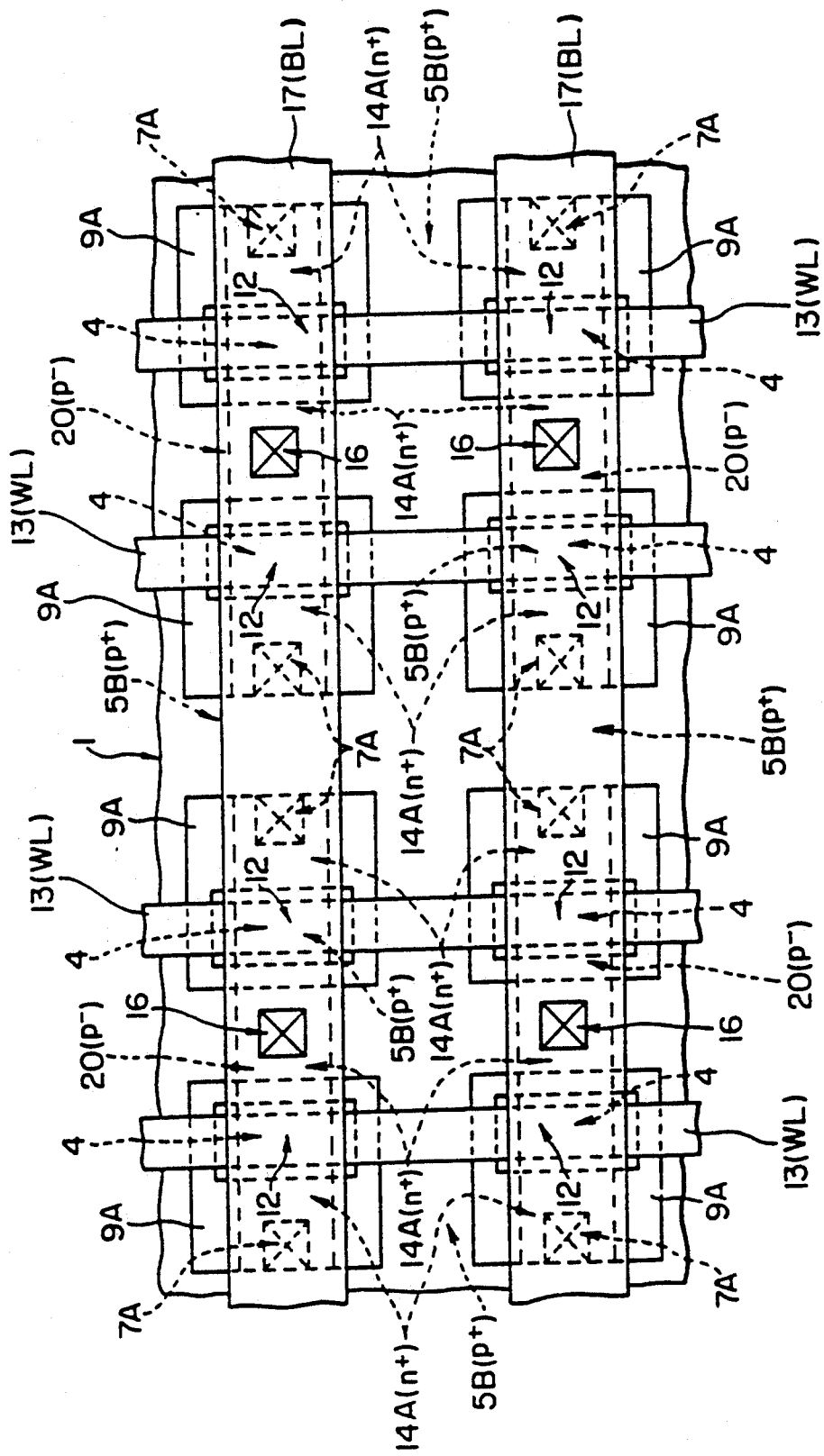
FIG. 61 is a top plan view showing the essential portion of the schematic memory cell array for explaining the seventeenth embodiment of the present invention.

By using the memory cells thus formed, the specific memory cell array is constructed, as shown in FIG. 61.

FIG. 61 is a top plan view showing an essential portion of the schematic memory cell array for explaining the first embodiment of the present invention.

The memory cell array is constructed by repeatedly arranging in a matrix form the patterns of the two memory cells shown in FIGS. 55A and 55B. Incidentally, for purposes of drawing simplification, FIG. 61 does not show any insulating film formed between the individual conductive layers.

Incidentally, the specific operations of the present embodiment are substantially similar to those of the foregoing embodiments, and their descriptions are omitted.

According to the present embodiment, effects similar to those found in the devices shown in foregoing embodiments can be attained in the DRAM using as the memory cell the series circuit of the storage capacitor element and the MISFET by the moat technique. Since the MISFET can be arranged over the storage capacitor element, moreover, the area for forming the MISFET is not necessary so that the DRAM can be more highly integrated than in foregoing embodiments where this is not done.

In addition to the above advantage, since the MISFET can be arranged over the storage capacitor element, the breakdown voltage in the backward direction is not degraded by the possible junction which might occur in some of the foregoing embodiments between the $n^+$-type semiconductor regions of the MISFET and the $p^+$-type semiconductor region for providing the second conductive plate of the storage capacitor element. As a result, it is possible to ensure high integration of the DRAM.

Thanks to the provision of the MISFET on the semiconductor plate, furthermore, the unnecessary parasitic capacitance, which is caused by the pn-junction between the semiconductor regions of the MISFET and the semiconductor plate, can be reduced more than the case in which the MISFET is formed on the semiconductor substrate. This makes it possible to reduce the unnecessary parasitic capacitance to be added to the bit lines so that the information writing and reading operations of the DRAM can be conducted at a high speed.

Since the diffusion depth of the semiconductor regions of the MISFET can be regulated in terms of the thickness of the semiconductor plate by providing the MISFET on the semiconductor plate, furthermore, it is possible to prevent the unnecessary diffusion of the impurity to the region where the channel is to be formed and to ensure the effective channel length of the MISFET. This makes it possible to prevent the short channel effect.

The structure and fabrication method of a eighteenth present embodiment will be described in connection with the memory cell of the DRAM. The eighteenth embodiment is one in which a third conductive plate 18 having a fixed potential applied thereto is further formed over the first conductive plate 9A of the seventeenth embodiment to increase and stabilize the capacitance.

Figure 62A:
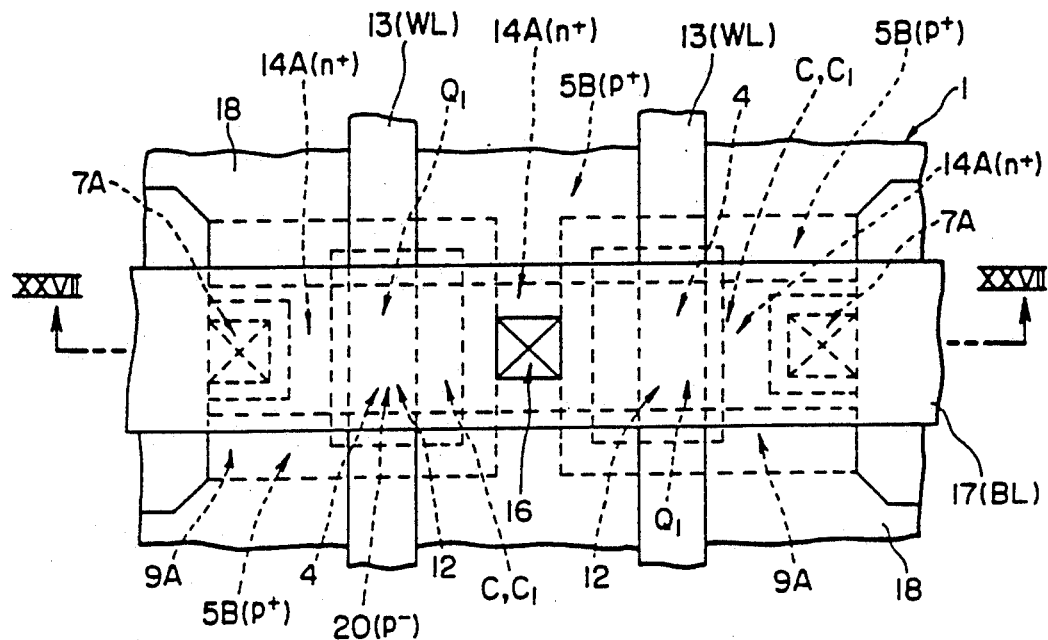
FIG. 62A is a top plan view showing the essential portion of the DRAM memory cell for explaining the structure of the eighteenth embodiment of the present invention.
Figure 62B:
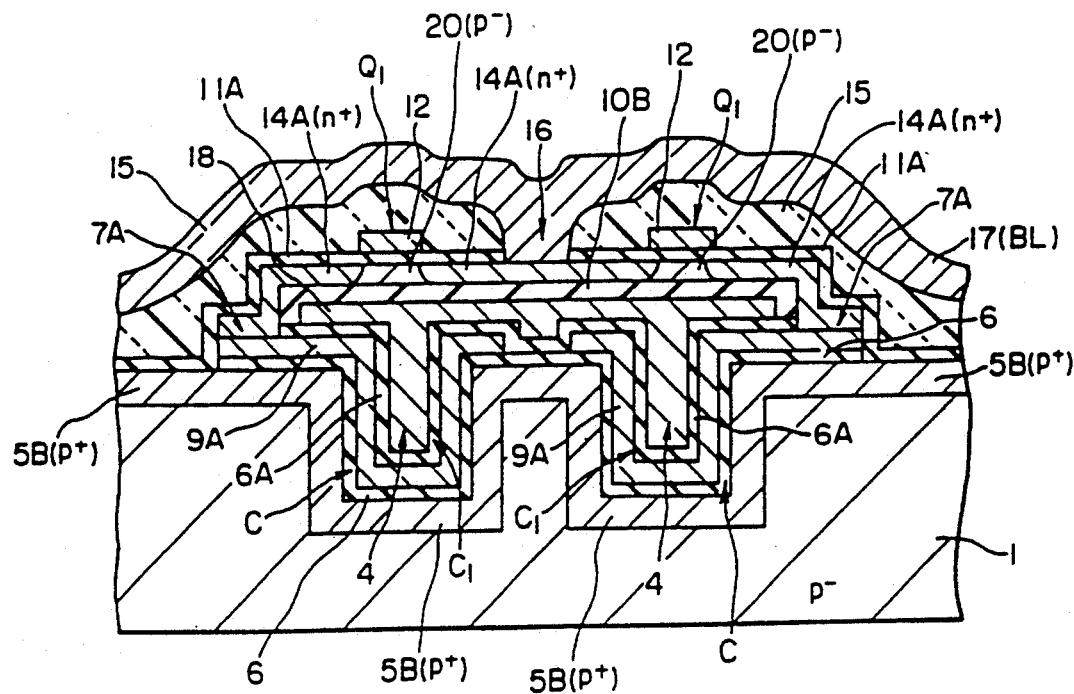
FIG. 62B is a sectional view taken along line XXVII—XXVII of FIG. 62A.

FIG. 62A is a top plan view showing an essential portion of the DRAM memory cell for explaining the specific structure of the eighteenth embodiment, and FIG. 62B is a sectional view taken along line XXVII—XXVII of FIG. 62A. Incidentally, FIG. 62A does not show any insulating film between the individual conductive layers for purposes of drawing clarity.

Throughout all the figures of the eighteenth embodiment, incidentally, the portions having the same functions as those of the seventeenth embodiment are indicated with the same reference characters, and their repeated descriptions are omitted.

Indicated at reference characters 6A in FIG. 62B is an insulating film which is formed to cover at least the first conductive plate 9A and which has a construction similar to that of the insulating film 6 to construct the storate capacitor element. This insulating film 6A is stored with the charges of the positive holes for the information by the first conductive plate 9A and a later-described third electrode (which will be called the "third conductive electrode"). Moreover, the insulating film 6A electrically isolates the first conductive plates 9A of the adjoining memory cells. Indicated at numeral 18 is the third conductive plate which is formed over the insulating film 6A and which is connected and integrated with the third conductive plate of another memory cell in the common memory cell array to construct the storage capacitor element. A fixed potential, e.g., the same potential as that of the substrate is applied to that third conductive plate 18. The storage capacitor element of the memory cell is composed mainly of a parallel circuit of the capacitor C, which is composed of the first conductive plate 9A, the semiconductor region 5B for providing the second conductive plate, and the insulating film 6, and a capacitor $C_1$ which is composed of the first conductive plate 9A, the third conductive plate 18 and the insulating film 6A. Indicated at characters 10B is an insulating film which is formed to cover the third conductive plate 18 thereby to electrically isolate the third conductive plate 18 and the word lines (WL) 13.

Next, the specific operations of the eighteenth embodiment of the present invention will be described in the following.

The operations of the present embodiment will be described in connection with the operations of a predetermined memory cell with reference to FIGS. 62A and 62B.

First of all, the description will be made in case the information is to be written in the memory cell. A control voltage is selectively applied to the gate electrodes 12 of the memory cell, which constructs the MISFET Q, to turn on this MISFET Q. After this, a voltage for the information is applied to the bit lines (BL) 17 which are electrically connected with the semiconductor regions 14 through the connection hole 16. As a result, the voltage for the information at the bit lines (BL) 17 is applied through the MISFET Q to the first conductive plate 9A. The semiconductor region 5B for providing the second conductive plate is electrically connected with the semiconductor substrate 1 and is held at the predetermined fixed potential $V_{SS}$, and the third conductive plate 18, for example, is held at the fixed potential $V_{SS}$. If there is a potential difference between the potential of the second conductive plate and the third conductive plate 18 and the voltage for the information applied to the first conductive plate 9A, more specifically, the charges for the information are stored in the insulating films 6 and 6A at the intervening portions inbetween, namely, written in the storage capacitor element $C_1$ of the memory cell.

In case the information is to be held in the memory cell, the MISFET Q may be turned off in the state where the information is written in the storage capacitor element $C_1$ of the memory cell.

In case the information of the memory cell is to be read out, on the other hand, it is sufficient to conduct the operations reversed from the above writing operations.

According to the eighteenth embodiment, effects similar to those of the foregoing seventeenth embodiment can be obtained in the DRAM which uses as the memory cell the series circuit of the storage capacitor element and the MISFET by the moat technique. By forming the third conductive plate over the first conductive plate through the insulating film, moreover, the charges, which are stored in the first conductive plate and in the second conductive plate, and the charges by the first and third conductive plate can be stored in the storage capacitor element. As a result, the quantity of the charges stored per unit area occupied by the storage capacitor element can be augmented to about two times as large as that of the foregoing seventeenth embodiment so that higher integration of the DRAM can be achieved.

By forming the third conductive plate at the fixed potential over the first conductive plate, on the other hand, the word lines, to which a varying control voltage is applied, can prevent the influences to be exerted upon the first conductive plate, to stabilize the quantity of the charges of the positive holes stored in the storage capacitor element. As a result, the writing and reading operations of the DRAM can be stabilized to ensure high reliability of the DRAM.

Next, the specific fabrication method of the eighteenth embodiment of the present invention will be described in the following.

FIGS. 63A to 65A are top plan view showing the essential portions of the DRAM memory cell at the respective fabrication steps for explaining the fabrication method of the present embodiment, and FIGS. 63B to 65B are sectional views taken along the cut lines of (A) of the corresponding figures.

First of all, the moats 4 are formed in the memory cell array portion of the semiconductor substrate 1, and the $p^+$-type semiconductor region 5B for providing the second conductive plate is formed in the vicinity of the surface of the semiconductor substrate 1 and in the moats 4 in the exposed surface of the semiconductor substrate 1. Moreover, the insulating film 6 of $SiO_2$ is formed all over the surface, and a polycrystalline silicon film 9B having a predetermined pattern is formed, as shown in FIGS. 63A and 63B, so as to form the first conductive plate over the insulating film 6.

Figure 63A:
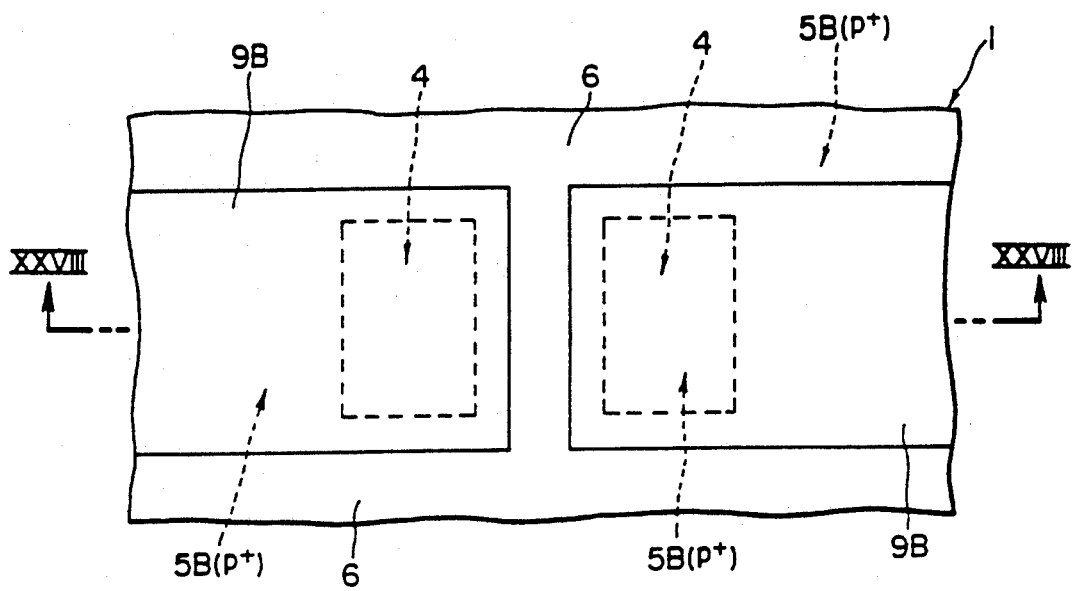
FIGS. 63A, 64A and 65A are top plan views showing the essential portions of the DRAM memory cell at the respective fabrication steps for explaining the fabrication method of the eighteenth embodiment of the present invention.
Figure 63B:
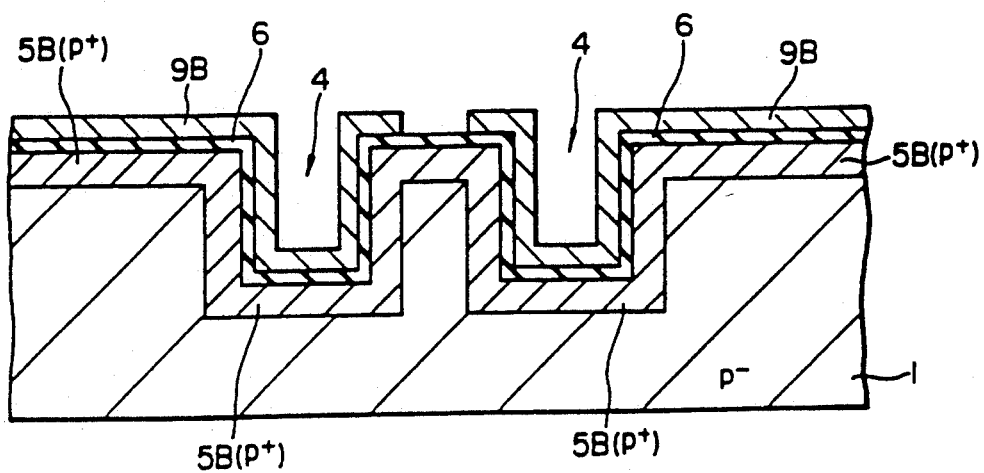
FIGS. 63B, 64B and 65B are sectional views taken along the cut lines of (A) of the corresponding figures.
Figure 64A:
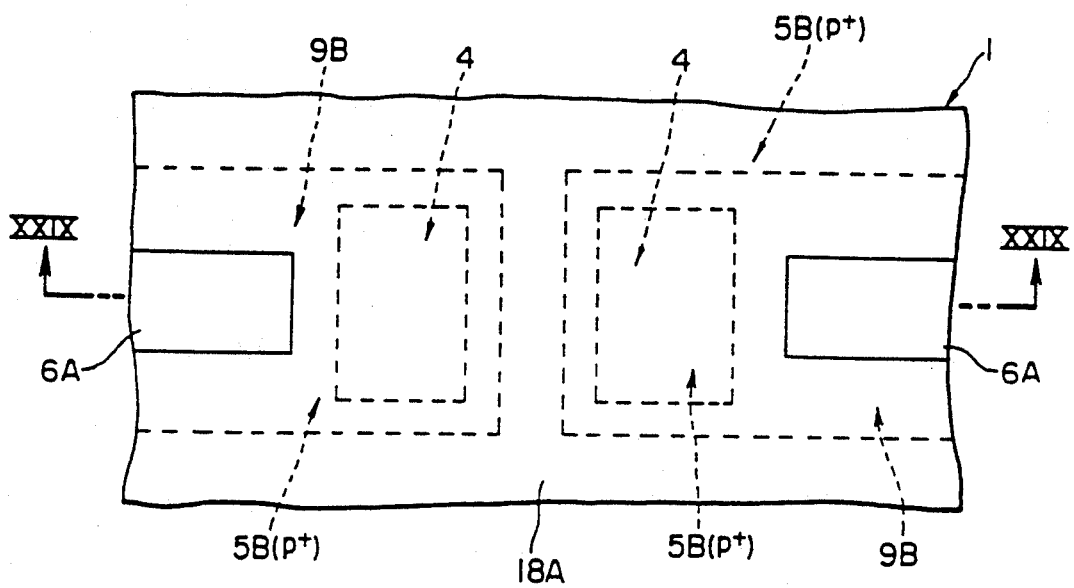
Figure 64B:
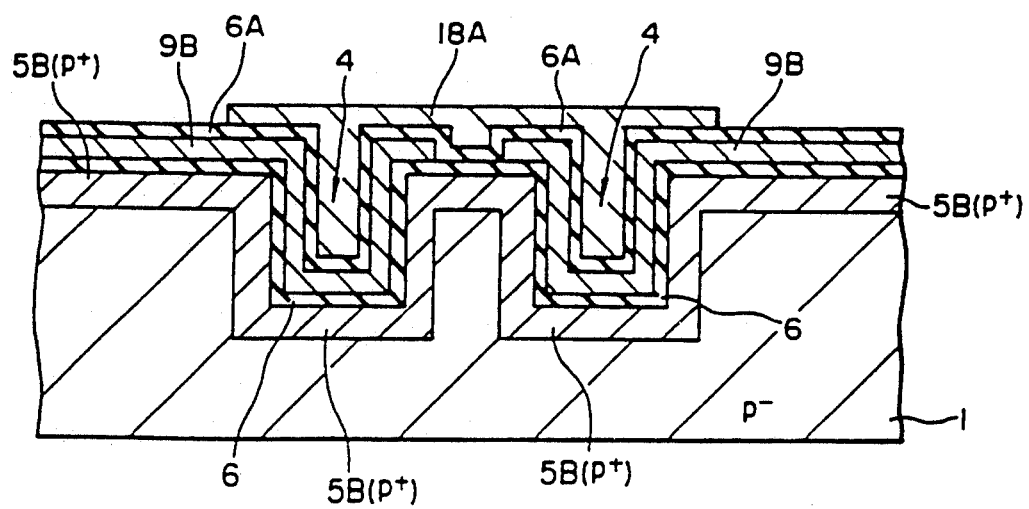

After the step shown in FIGS. 63A and 63B, the insulating film 6A, which is preferably made of a layered film comprised of silicon nitride sandwiched between two layers of $SiO_2$, for example, is formed by a CVD method all over the surface. As shown in FIGS. 64A and 64B, moreover, a polycrystalline silicon film 18A having a predetermined pattern is formed so as to form the third conductive plate.

After the step shown in FIGS. 64A and 64B, thermal oxidation is conducted by using the nitride film of the insulating film 6A exposed to form the insulating film 10B all over the surface in a manner to cover the polycrystalline silicon film 18A, and the insulating film 6A at a portion where the first conductive plate 9A and one semiconductor region of the MISFET are to be connected is selectively removed to form the connection hole 7A. After that, the $p^-$-type semiconductor plate 20 is formed over the insulating film 10B at a portion to be formed with the storage capacitor element, and the unnecessary insulating films 10B, 6A and 6 and the unnecessary polycrystalline silicon films 18A and 9B are selectively simultaneously removed with the semiconductor plate 20 to form the first conductive plate 9A and the third conductive plate 18, as shown in FIGS. 65A and 65B.

Figure 65A:
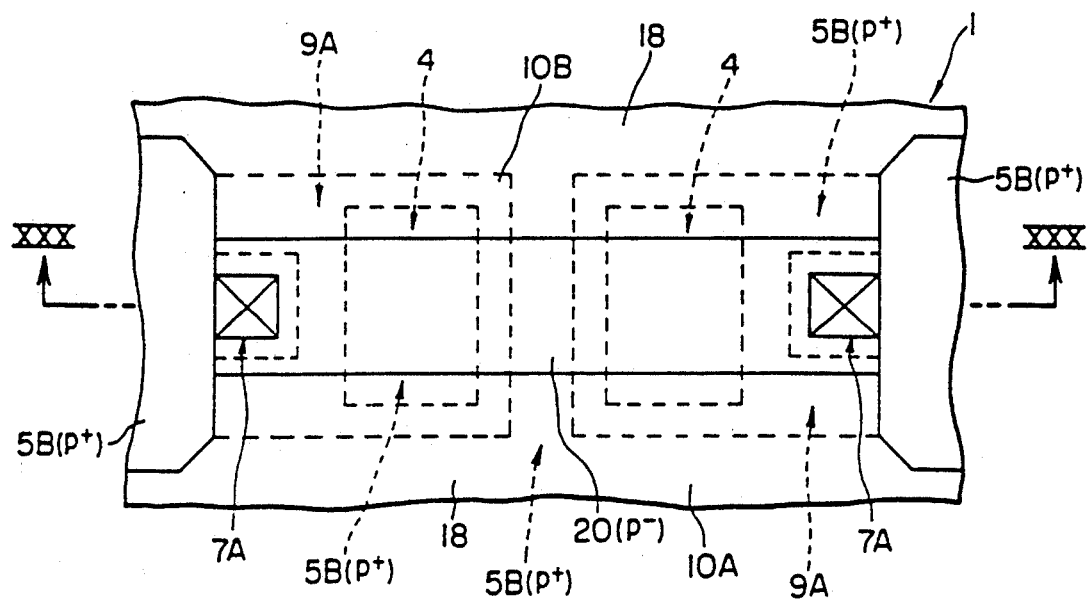
Figure 65B:
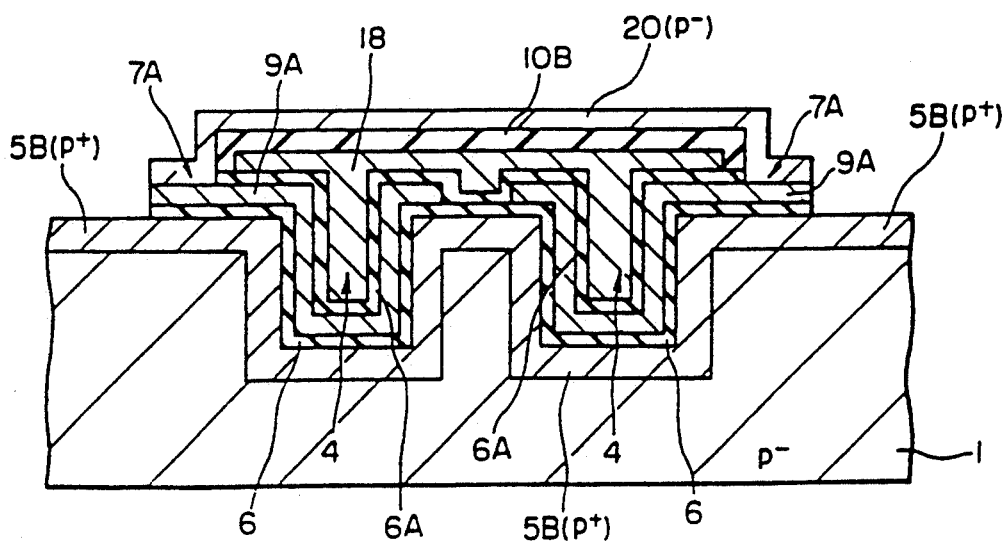

After the step shown in FIGS. 65A and 65B, the DRAM of the present embodiment shown in FIGS. 62A and 62B is completed by executing the steps subsequent to the step shown in FIGS. 59A and 59B.

After that, protecting films are formed like the foregoing embodiment.

Figure 66:
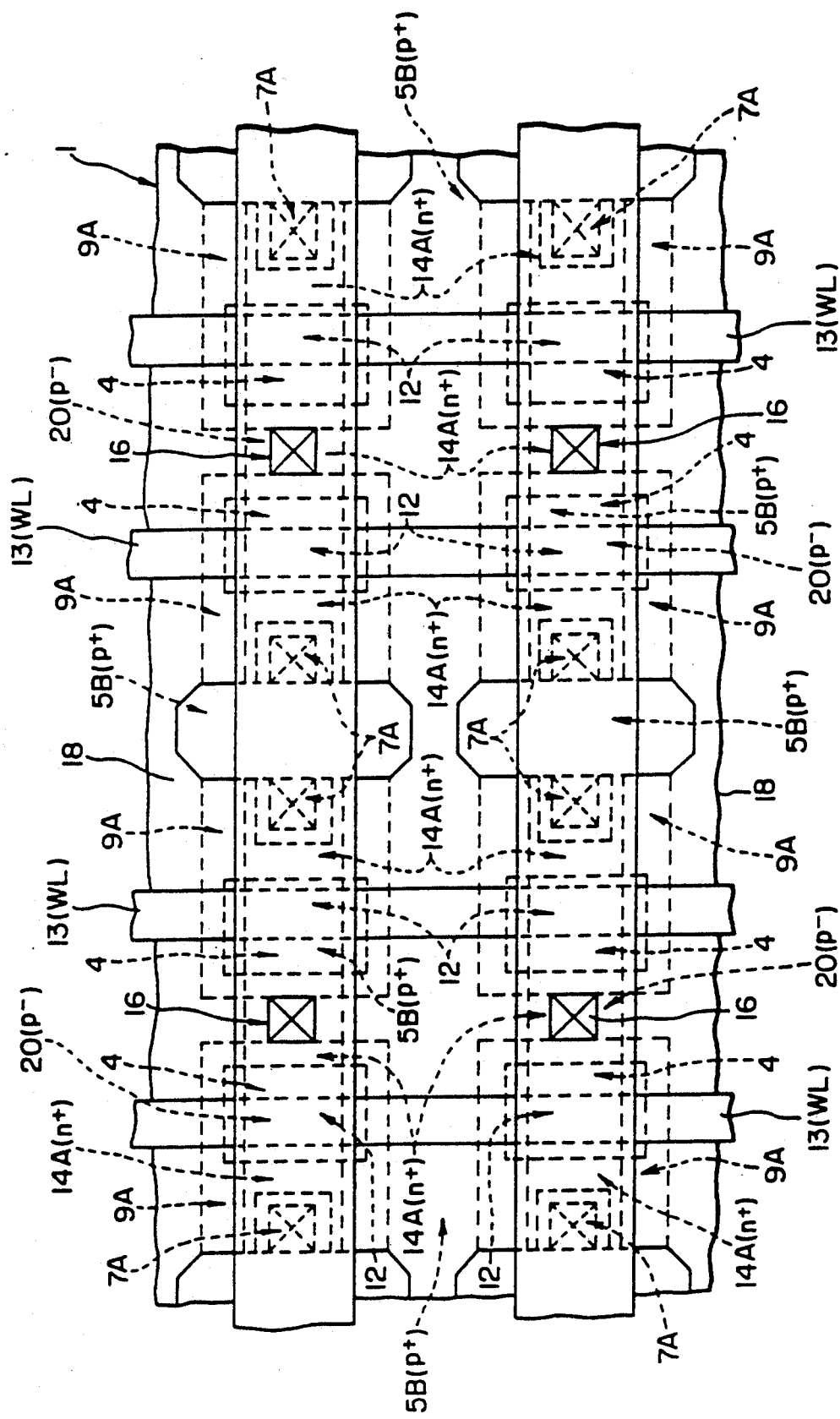
FIG. 66 is a top plan view showing the essential portion of the schematic memory cell array for explaining the eighteenth embodiment of the present invention.

By using memory cells thus formed, a specific memory cell array is constructed, as shown in FIG. 66.

FIG. 66 is a top plan view showing an essential portion of the schematic memory cell array for explaining the eighteenth embodiment of the present invention. This memory cell array is constructed by repeatedly arraying the two memory cells shown in FIGS. 62A and 62B. Incidentally, for purposes of drawing simplification, FIG. 66 does not show any insulating film to be formed between the individual conductive layers.

The structure of a nineteenth embodiment will now be described in connection with the memory cell of the DRAM, but the fabrication method of the same is not described because it is substantially similar to that of the foregoing seventeenth embodiment. The nineteenth embodiment is one in which the area required for the connection between the first conductive plate and the semiconductor regions of the MISFET is reduced in comparison with the seventeenth embodiment to further increase the integration and to facilitate alignment of the mask for their connection.

Figure 67A:
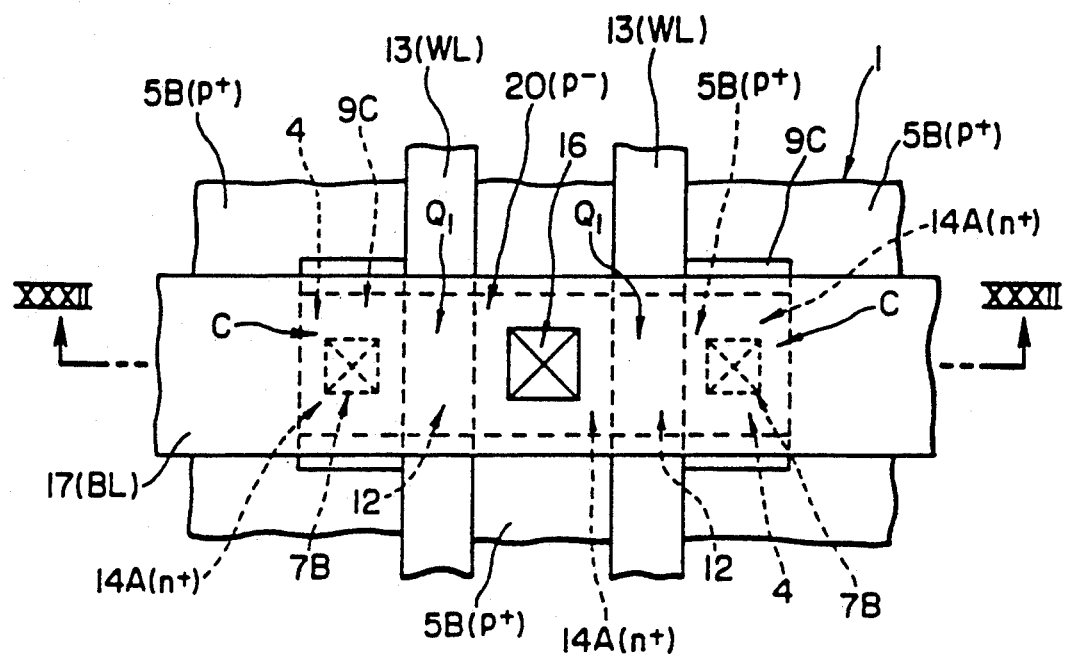
FIG. 67A is a top plan view showing the essential portion of the DRAM memory cell for explaining the structure of the nineteenth embodiment of the present invention.
Figure 67B:
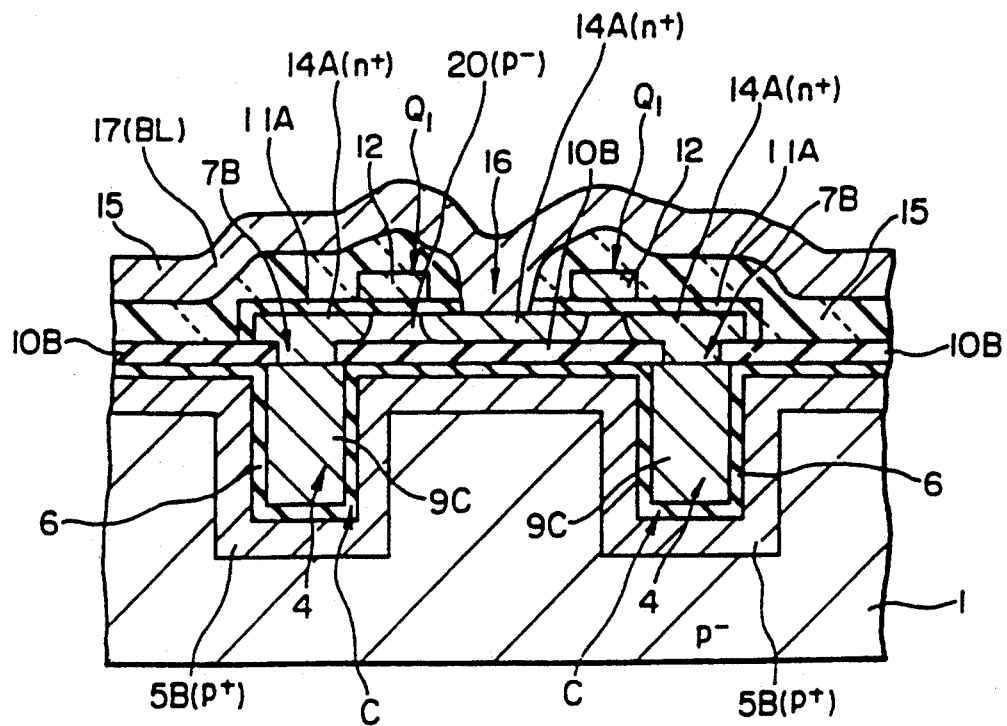
FIG. 67B is a sectional view taken along line XXXII—XXXII of FIG. 67A.

FIG. 67A is a top plan view showing an essential portion of the DRAM memory cell for explaining the specific structure of the nineteenth embodiment, and FIG. 67B is a sectional view taken along line XXXII—XXXII of FIG. 67A. Incidentally, for purposes of drawing simplification, FIG. 67A does not show any insulating film to be formed between the individual conductive layers.

Indicated at reference characters 9C in FIGS. 67A and 67B is a first conductive plate which is so formed over the insulating film 6 as to fill up the moats 4. That first conductive plate 9C has its upper surface generally flattened. Indicated at characters 7B is a connection hole which is formed by selectively removing the insulating film 10B overlying the first conductive plate 9C to electrically connect the first conductive plate 9C and the MISFET.

According to the nineteenth embodiment, effects similar to those of the foregoing seventeenth embodiment are available in the DRAM using as the memory cell the series circuit of the storage capacitor element and the MISFET by the moat technique. Moreover, the area required for connecting the storage capacitor element and the MISFET can be reduced by electrically connecting them with the semiconductor regions overlying the first conductive plate buried in the moats. As a result, the DRAM can be highly integrated.

Since the storage capacitor element and the MISFET are electrically connected with the semiconductor regions over the first conductive plate buried in the moats, moreover, it is possible to facilitate the mask alignment for their connection.

The following effects can be obtained in the DRAM using as the memory cell the series circuit of the storage capacitor element and the MISFET using the moat techniques discussed above.

(1) The storage capacitor element can be composed of the insulating film, which is formed in the predetermined main surface portion of the semiconductor substrate and in the moats in the surface portion of the semiconductor substrate; the first conductive plate which has its one end formed over the insulating film and its other end connected electrically with one semiconductor region of the MISFET; and the semiconductor region which is formed in the vicinity of the predetermined surface of the semiconductor substrate and in the moats in the vicinity of the surface of the semiconductor substrate for providing the second conductive plate. As a result, the charges for the information can be stored at both the ends of the insulating film at the intervening portion between the first and second conductive plates, and a depletion region formed to extend from the moat portions into the semiconductor substrate can be suppressed by the second conductive plae. This makes it possible to prevent coupling of the respective depletion regions between the adjoining storage capacitor elements and to prevent the leakage phenomena of the same.

(2) Since the leakage phenomena can be prevented, the leakage current between the individual storage capacitor elements can be reduced. As a result, the time period of the storage capacitor element for holding the charges for the information can be improved to reduce the frequency of the rewriting operations. This makes it possible to improve the operating time of the DRAM.

(3) The charges in the accumulation layer to be formed in the accumulation region or in the narrow depletion region can be used as the charges for the information, which are to be stored in the storage capacitor element. As a result, the electrons, which are stored in the wide depletion layer or in the inversion layer region, need not be used for the information so that influences by the α-rays or unnecessary minority carriers generated by the injection from peripheral circuitry can be prevented.

(4) The storage capacitor element can have its occupying area reduced because it is unnecessary to consider the influences of the unnecessary minority carriers generated by the α-rays. This makes it possible to highly integrate the DRAM.

(5) By forming the third conductive plate through the insulating film over the first conductive plate constructing the storage capacitor element, it is possible to store both the charges to be stored in the first and second conductive plates and the charges by the first and third conductive plates. This makes it possible to augment the charge storage of the storage capacitor element per unit area.

(6) By using the semiconductor region to construct the storage capacitor element for providing the second conductive plate, the memory cell of the DRAM can be electrically isolated from another memory cell adjoining thereto in the row and/or column directions. As a result, the field insulating film prepared by selectively thermally oxidizing the semiconductor substrate can be dispensed with to ensure the high integration of the DRAM.

(7) By forming the third conductive plate of the fixed potential over the first conductive plate constructing the storage capacitor element, the word lines having a varying control voltage applied thereto can prevent influences from being exerted upon the first conductive plate to stabilize the quantity of the charges to be stored in the storage capacitor element.

(8) Thanks to the foregoing effect (7), the writing and reading operations of the DRAM can be stabilized to ensure high reliability of the DRAM.

(9) Since the semiconductor region of the first conduction type constructing the capacitor of the memory cell and the semiconductor region of the second conduction type connected with the MISFET of the memory cell are spaced from each other, the reverse breakdown voltage of the junction is not degraded.

(10) By arranging the MISFET over the storage capacitor element, no additional area of the substrate for the MISFET is required so that the DRAM can be highly integrated.

(11) By arranging the aforementioned MISFET over the storage capacitor element, the semiconductor region of the first conduction type constructing the capacitor of the memory cell and the semiconductor region of the second conduction type constructing the MISFET of the memory cell can be spaced from each other through the insulating film so that the reverse breakdown voltage of the junction is not degraded.

(12) By forming the MISFET on the semiconductor plate, the unnecessary parasitic capacitance, which is caused by the pn junction between the semiconductor region of the first conduction type of the MISFET and the semiconductor plate of the second conduction type can be made lower than the case in which the MISFET is formed on the semiconductor substrate. This makes it possible to reduce the unnecessary parasitic capacitance, which is to be added to the bit lines connected with the semiconductor region, so that the information writing and reading operations of the DRAM can be speeded up.

(13) Since the diffusion depth of the semiconductor region of the MISFET can be regulated in terms of the thickness of the semiconductor plate by forming the MISFET on the semiconductor plate, an effective channel length for the MISFET can be ensured without the necessity of diffusing an impurity in the region to be formed with the channel.

(14) By filling up the moats with the first conductive plate of the storage capacitor element to electrically connect said first conductive plate with the semiconductor region of the MISFET, the area required for connecting the first conductive plate and the MISFET can be reduced to ensure the high integration of the DRAM.

(15) Thanks to the foregoing effects (1) to (6), (10), (11) and (14), the area occupied by the memory cell can be remarkably reduced to provide a multiplied effect that the high integration of the DRAM can be further increased.

Although the present invention conceived by me has been specifically described hereinbefore in connection with the embodiments thereof, it should not be limited to the foregoing embodiments but can naturally be modified in various manners without departing from the gist thereof.

For example, although the DRAM is constructed in the individual embodiments by making use of the p-type semiconductor substrate, a p-type well region may be formed in an n-type semiconductor substrate to construct the memory cell of the DRAM therein. Although the p-type semiconductor regions are used as the second conductive plate for storing the charges for the information in the foregoing individual embodiments, on the other hand, an n-type semiconductor substrate may be used so that the n-type semiconductor region may provide the second conductive plate for storing the charges for the information. In the p-type semiconductor substrate, moreover, there may be formed an n-type well region in which the memory cell of the DRAM is formed.

Although the descriptions of the foregoing three embodiments have been made in connection with the DRAM adopting the open bit line type, on the other hand, the folded bit line type may be adopted. Further, although the description has been directed to using the present invention in a DRAM, it is possible to utilize the illustrated arrangement of the MISFET and capacitor in other ICs wherein such a series connection is utilized.

We claim:

1. A semiconductor memory comprising:
   a plurality of memory cells, each of which memory cells includes an insulated-gate field-effect transistor and a capacitor, wherein a source and a drain of said insulated-gate field-effect transistor are formed within a first predetermined semiconductor region of a main surface of a substrate, and wherein said capacitor comprises:
   a first electrode region formed at a surface of a groove at a second predetermined semiconductor region of said main surface of the substrate;
   a second electrode region formed within said groove as a data storage portion of said capacitor, said second electrode region being connected to said source or drain of said insulated-gate field-effect transistor; and
   a first insulating film formed within said groove between said first electrode and said second electrode;
   wherein said first electrode region is electrically separated from said first predetermined semiconductor region so that a potential of the first electrode region can be controlled independently from potentials of said source and drain of said insulated-gate field-effect transistor.

2. A semiconductor memory according to claim 1, wherein said first electrode regions of capacitors of said plurality of memory cells are coupled to each other.

3. A semiconductor memory according to claim 2, wherein said first electrode regions of capacitors of said plurality of memory cells are coupled to each other at the bottom of said substrate.

4. A semiconductor memory according to claim 3, wherein said first electrode region is coupled to a predetermined potential.

5. A semiconductor memory according to claim 1, wherein said first insulating film comprises a single layer of $SiO_2$.

6. A semiconductor memory according to claim 1, wherein said first insulating film comprises a single layer of $Si_3N_4$.

7. A semiconductor memory according to claim 1, wherein said first insulating film comprises composite layer of $SiO_2$ and $Si_3N_4$.

8. A semiconductor memory according to claim 1, wherein said first electrode region is coupled to a ground potential.

9. A semiconductor memory according to claim 1, wherein said second electrode region comprises polycrystalline silicon.

* * * * *

UNITED STATES PATENT AND TRADEMARK OFFICE
CERTIFICATE OF CORRECTION

PATENT NO. : 5,237,528
DATED : August 17, 1993
INVENTOR(S) : H. SUNAMI et al.

It is certified that error appears in the above-indentified patent and that said Letters Patent is hereby corrected as shown below:

On the title page, item [60]

"Division of Ser. No. 452,683, Dec. 19, 1989, abandoned" should be changed to -- Division of Ser. No. 452,683, Dec. 19, 1989, Patent No. 5,214,496 --.

Signed and Sealed this

Nineteenth Day of September, 1995

Attest:

BRUCE LEHMAN

*Attesting Officer*          *Commissioner of Patents and Trademarks*